United States Patent
Lu et al.

(10) Patent No.: US 11,460,490 B2
(45) Date of Patent: Oct. 4, 2022

(54) PHOTOVOLTAIC SYSTEM MONITORING AND ANALYSIS

(71) Applicant: SunPower Corporation, San Jose, CA (US)

(72) Inventors: Yiping Lu, Cedar Park, TX (US); Daniel Daniil, San Francisco, CA (US); Luca Del Bianco, San Jose, CA (US); Juan Heber, San Jose, CA (US); Patrick Franz, San Mateo, CA (US); Miltiadis Vratimos, Berkeley, CA (US); Christos Voutsaras, Oakland, CA (US); Jonathan Tucker Thompson, Corte Madera, CA (US); Richard E. Mellor, El Cerrito, CA (US)

(73) Assignee: SUNPOWER CORPORATION, San Jose, CA (US)

( * ) Notice: Subject to any disclaimer, the term of this patent is extended or adjusted under 35 U.S.C. 154(b) by 38 days.

(21) Appl. No.: 16/994,195

(22) Filed: Aug. 14, 2020

(65) Prior Publication Data
US 2021/0088565 A1 Mar. 25, 2021

Related U.S. Application Data

(60) Provisional application No. 62/986,423, filed on Mar. 6, 2020, provisional application No. 62/903,408, filed on Sep. 20, 2019.

(51) Int. Cl.
*G01R 22/06* (2006.01)
*G08C 17/02* (2006.01)
(Continued)

(52) U.S. Cl.
CPC .......... *G01R 22/063* (2013.01); *G08C 17/02* (2013.01); *H04L 67/10* (2013.01); *H04Q 9/00* (2013.01); *H04Q 2209/10* (2013.01)

(58) Field of Classification Search
CPC .. H04Q 9/00; H04Q 2209/00; H04Q 2209/10; H04Q 2209/40; H04Q 2209/60; H04Q 2209/70; H04Q 2209/80; H04Q 2209/84; H04Q 2209/886; G01R 22/063; G08C 17/02; H04L 67/10; G01D 4/00; G01D 4/002; G01D 4/004; G01D 2204/35; G01F 1/263; H02S 50/00
See application file for complete search history.

(56) References Cited

U.S. PATENT DOCUMENTS 8,103,465 B2 * 1/2012 Brzezowski ........... G06Q 50/06
702/62
9,020,769 B2 * 4/2015 Rada ....................... G01D 4/00
702/60

(Continued)

*Primary Examiner* — Franklin D Balseca
(74) *Attorney, Agent, or Firm* — Xsensus LLP

(57) ABSTRACT

A method for monitoring a photovoltaic (PV) system includes receiving PV system information for a predetermined timeframe; displaying a power flow based on the received PV system information corresponding to the predetermined timeframe; displaying energy storage system information based on the received PV system information corresponding to the predetermined timeframe; and displaying an energy mix analysis based on the received PV system information corresponding to the predetermined timeframe.

19 Claims, 92 Drawing Sheets

(51) Int. Cl.
*H04L 67/10* (2022.01)
*H04Q 9/00* (2006.01)

(56) References Cited

U.S. PATENT DOCUMENTS

| | | | |
|---|---|---|---|
| 9,218,108 B1* | 12/2015 | Parthasarathy | G06F 1/263 |
| 9,614,374 B2* | 4/2017 | Patel | H02J 9/062 |
| 2021/0083505 A1* | 3/2021 | Beaston | H02J 9/06 |
| 2021/0135489 A1* | 5/2021 | Stites-Clayton | H02J 9/062 |

* cited by examiner

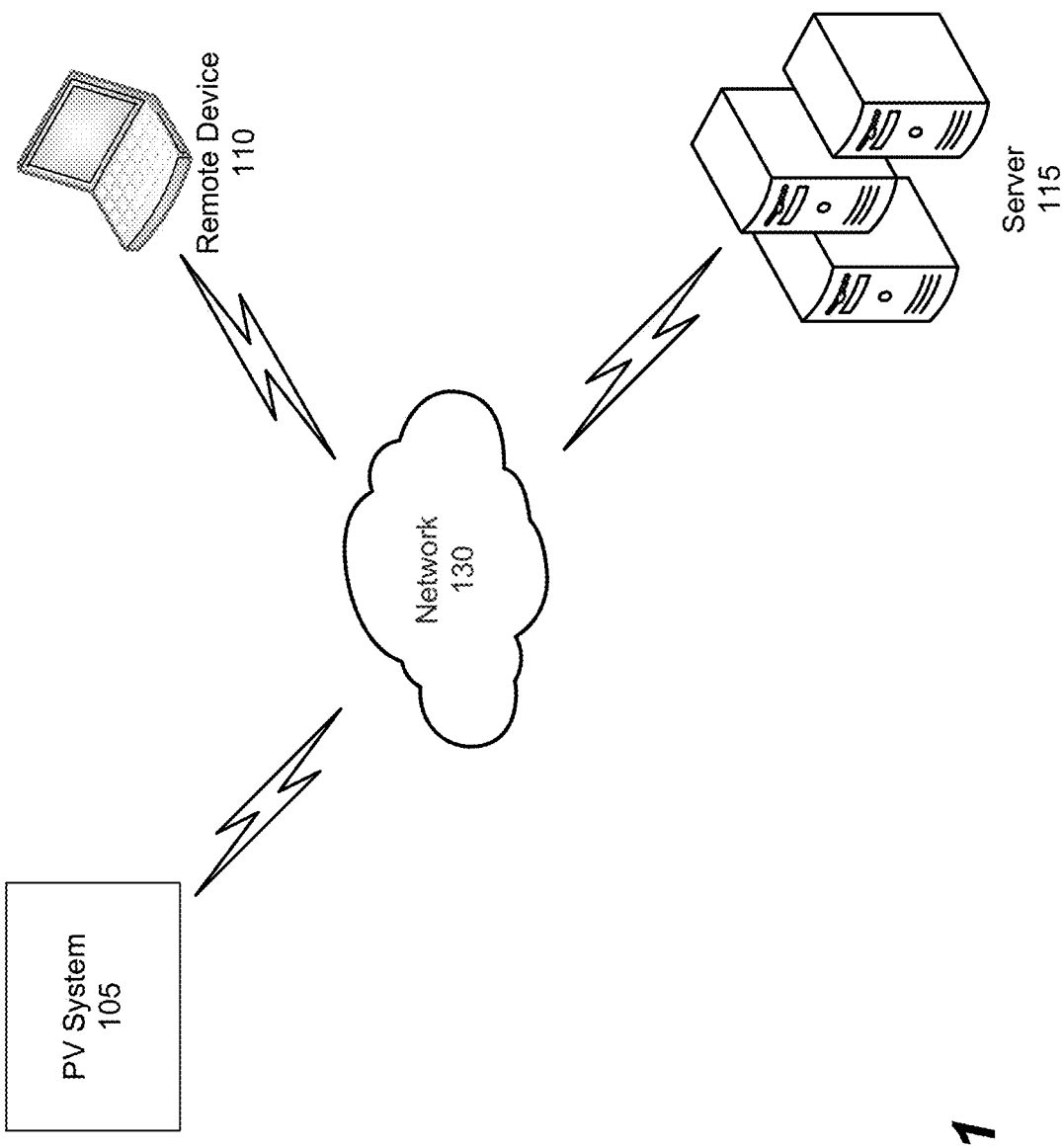

110

110

110

110

110

110

110

110

110

4305

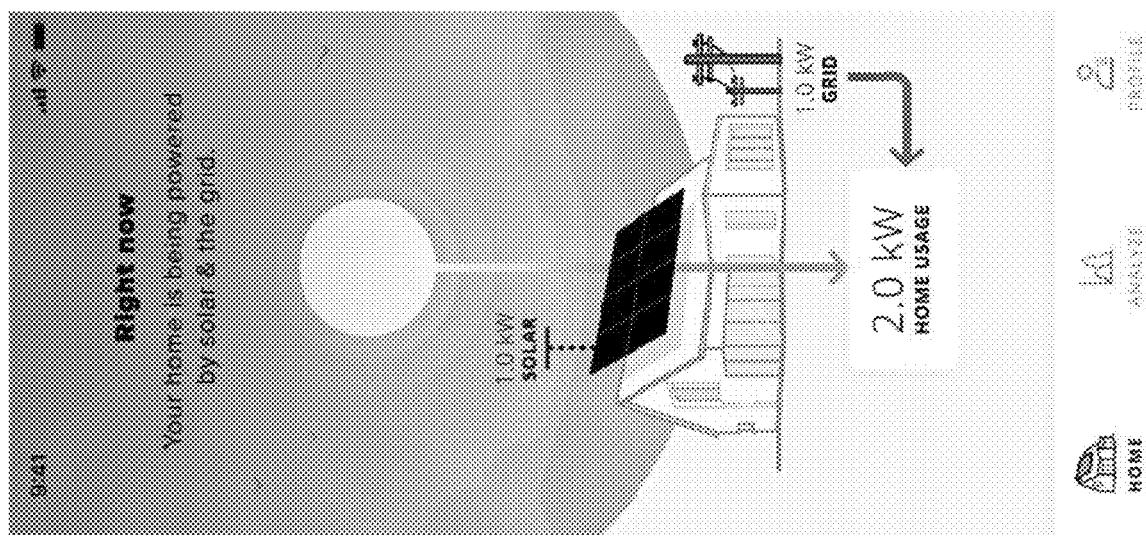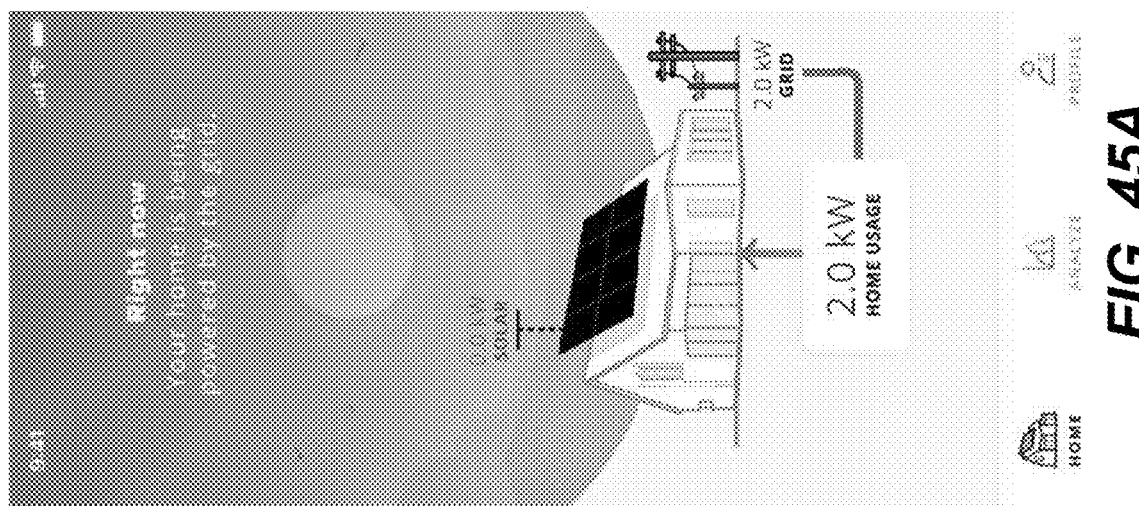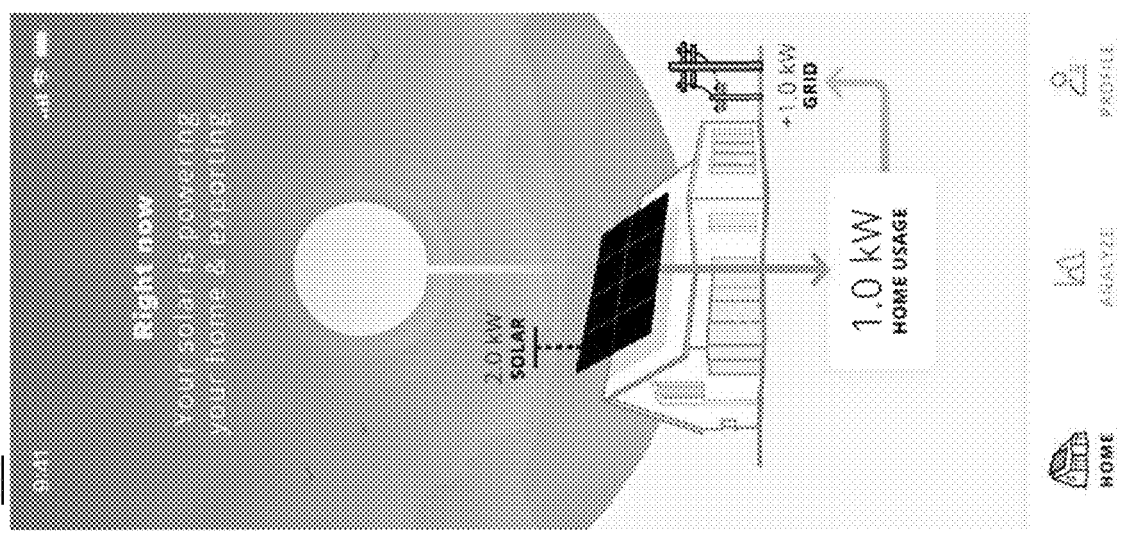
FIG. 45A

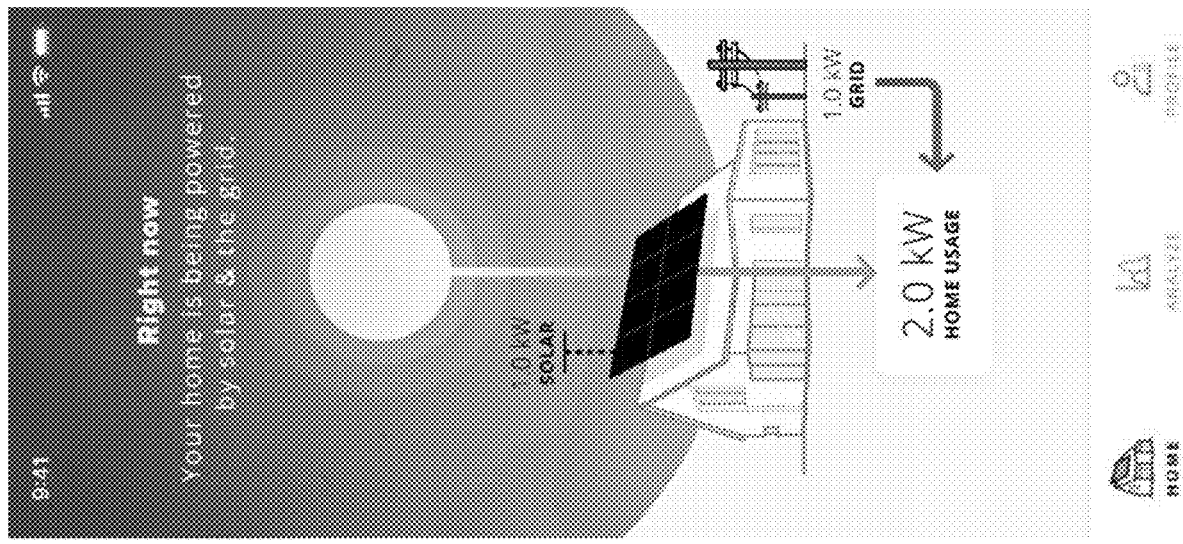
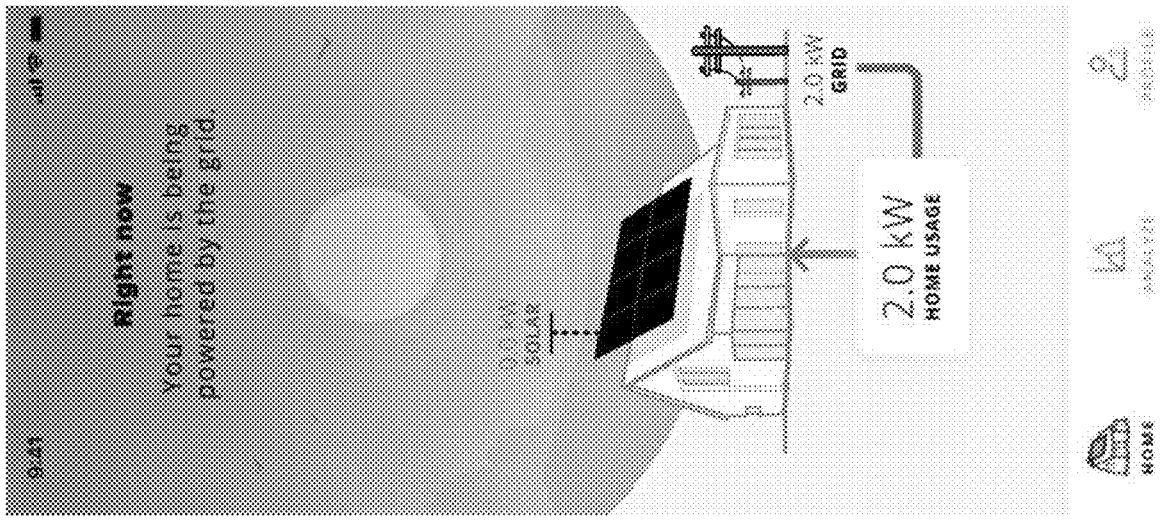
FIG. 45B

110

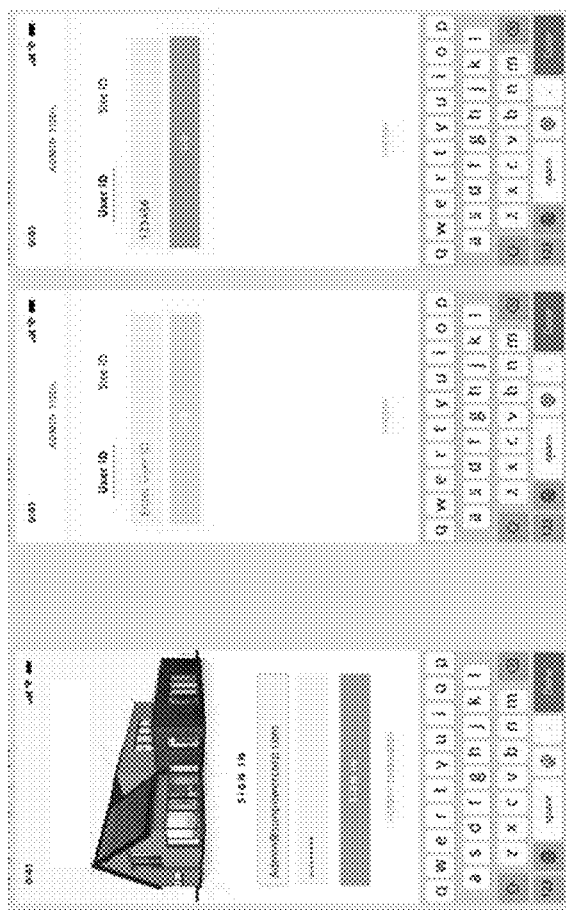
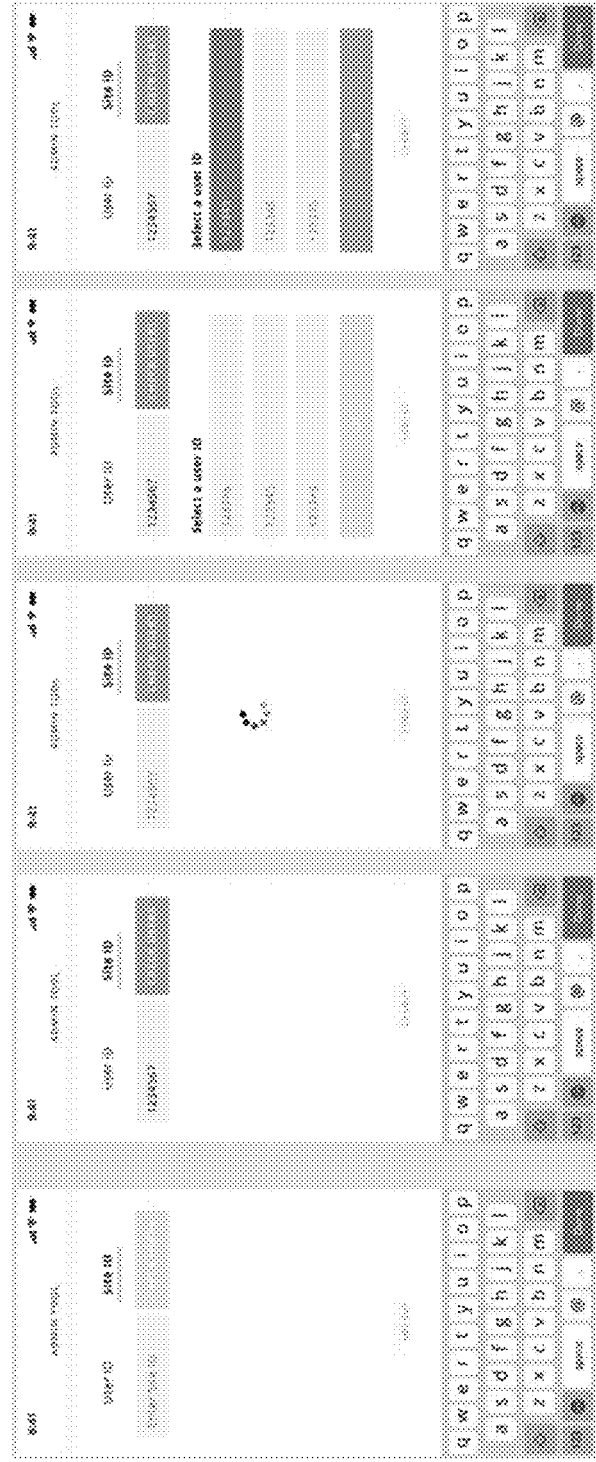
FIG. 51
110

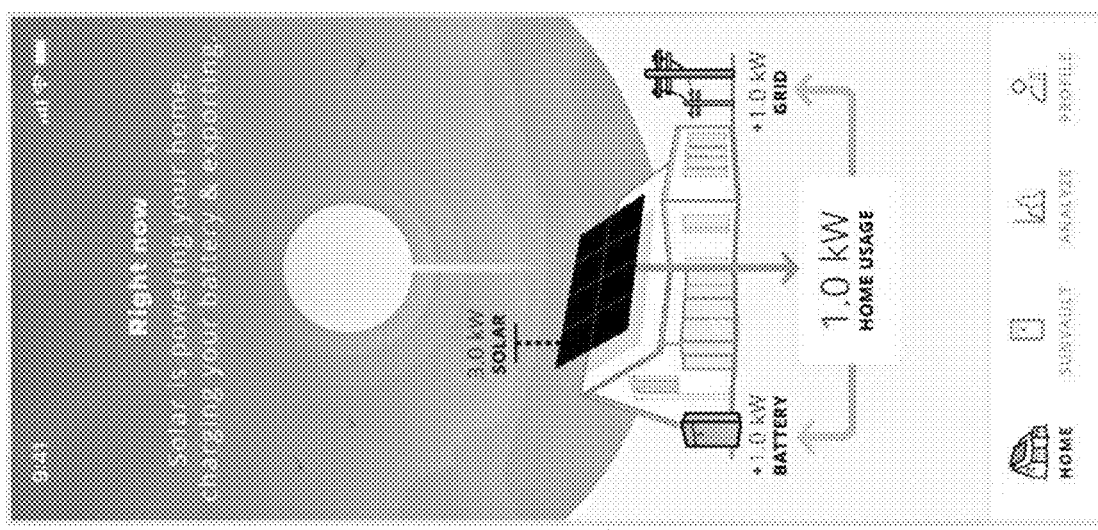
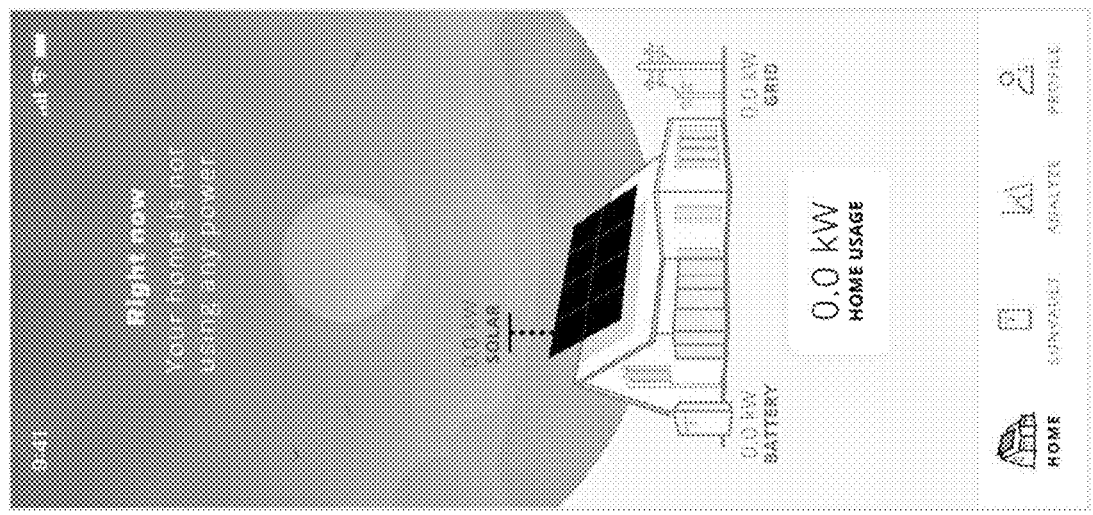
FIG. 54D

110

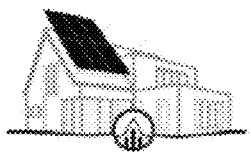
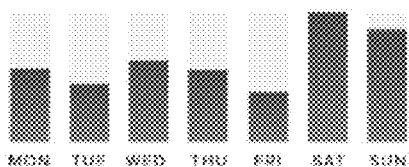
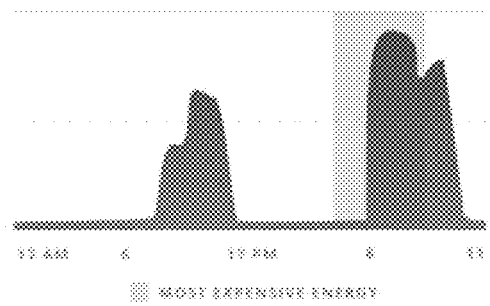
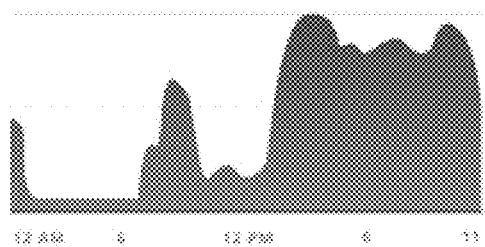
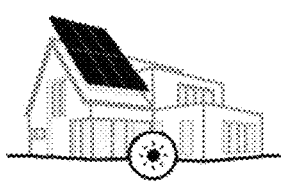
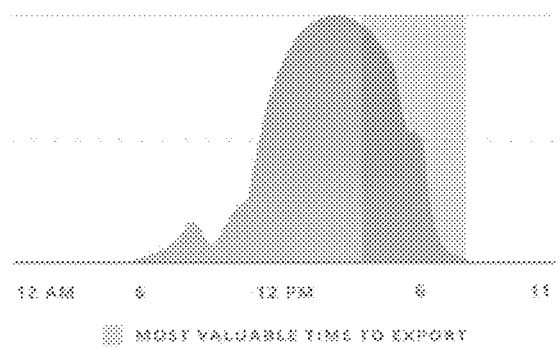
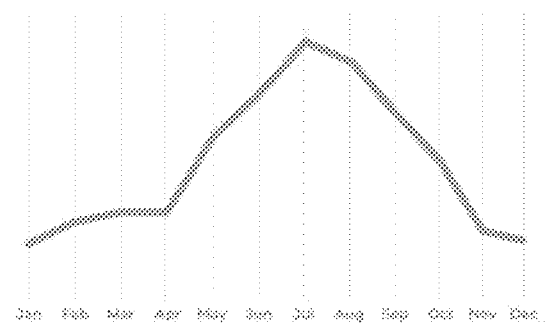
FIG. 59B

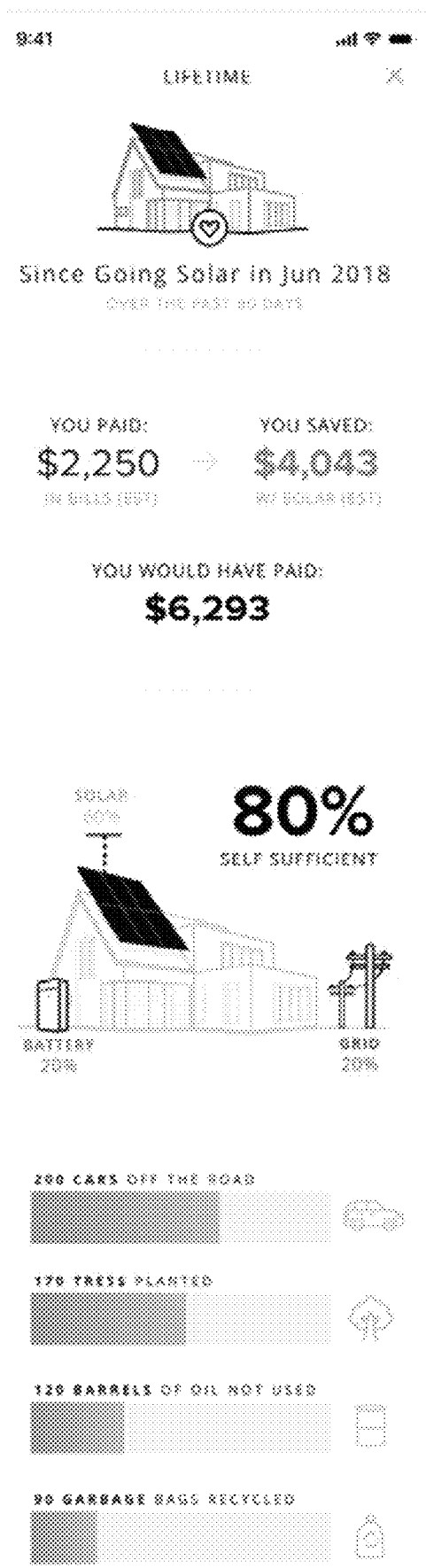
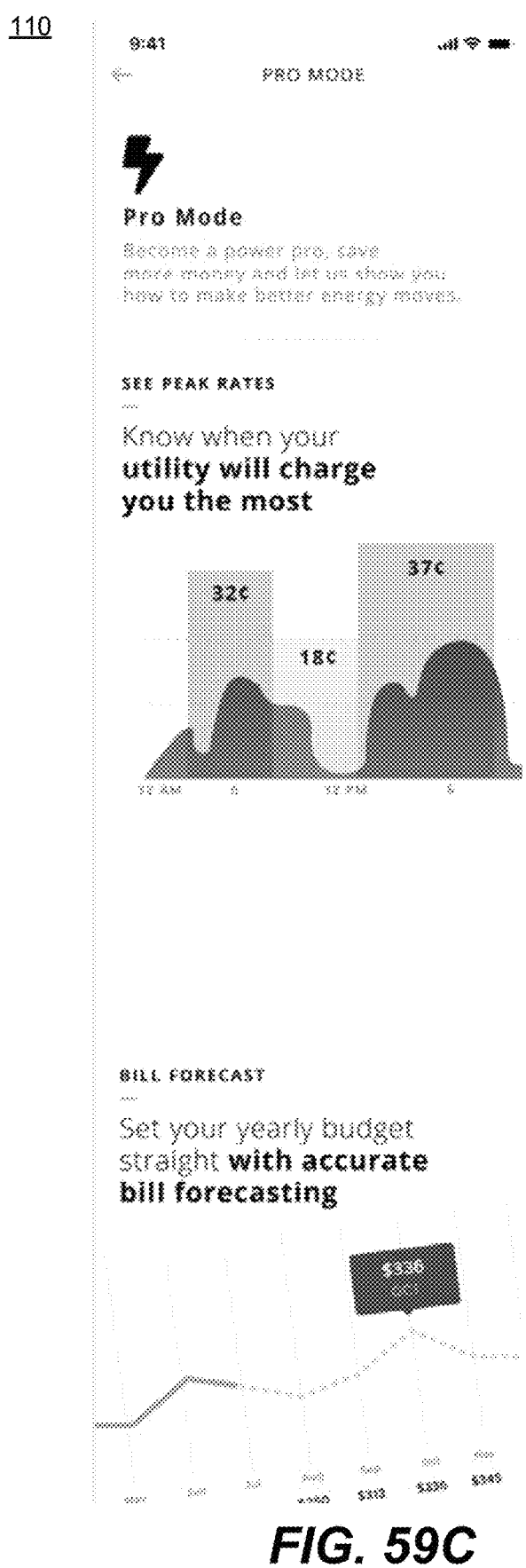
FIG. 59C

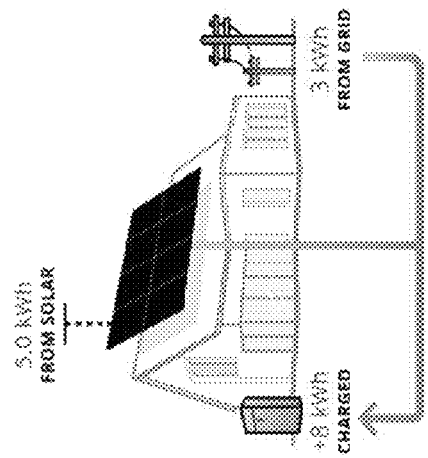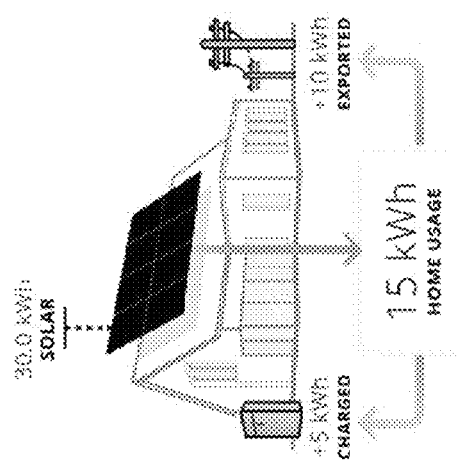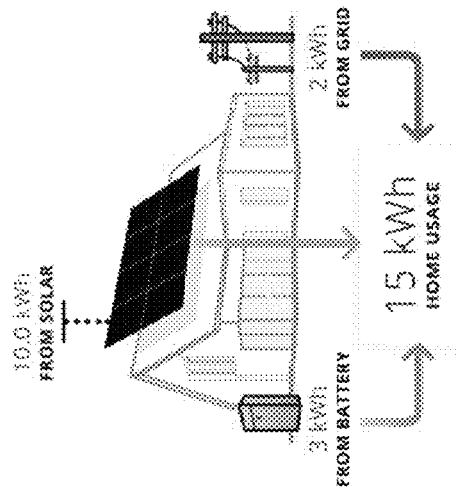
FIG. 61B

FIG. 63A

PHOTOVOLTAIC SYSTEM MONITORING AND ANALYSIS

CROSS-REFERENCE TO RELATED APPLICATION

This application claims the benefit of U.S. Provisional Application No. 62/903,408, filed Sep. 20, 2019, and U.S. Provisional Application No. 62/986,423, filed Mar. 6, 2020, which are incorporated herein by reference in their entirety. Related U.S. patent application Ser. No. 14/810,423, filed Jul. 27, 2015 is herein incorporated by reference in its entirety.

BACKGROUND

Solar installations, like photovoltaic (PV) systems installed on rooftops, carports, and the like, promise reduced energy costs and storage options for backup power. However, whoever manages the PV system needs to be able to monitor the activity of the solar installation easily and accurately.

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

SUMMARY

According to aspects of the disclosed subject matter, a method for monitoring a photovoltaic (PV) system includes receiving PV system information for a predetermined timeframe; displaying a power flow based on the received PV system information corresponding to the predetermined timeframe; displaying energy storage system information based on the received PV system information corresponding to the predetermined timeframe; and displaying an energy mix analysis based on the received PV system information corresponding to the predetermined timeframe.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIG. 1 illustrates an exemplary system for monitoring a solar installation according to one or more aspects of the disclosed subject matter;

FIGS. 45A-E illustrate exemplary PV system state pages with no storage system implemented in the software application displayed on the remote device according to one or more aspects of the disclosed subject matter;

FIG. 51 illustrates a series of exemplary admin troubleshooting pages implemented in the software application displayed on the remote device according to one or more aspects of the disclosed subject matter;

FIGS. 54A-E illustrate a series of exemplary PV system state pages implemented in the software application displayed on the remote device according to one or more aspects of the disclosed subject matter;

FIGS. 59A-59C illustrate a series of exemplary analysis pages accessed via an analysis tab on a menu bar implemented in the software application displayed on the remote device according to one or more aspects of the disclosed subject matter;

FIGS. 61A-61B illustrate a series of exemplary totals pages implemented in the software application displayed on the remote device according to one or more aspects of the disclosed subject matter;

FIGS. 63A-63B illustrate a series of exemplary cost savings mode pages for the battery implemented in the software application displayed on the remote device according to one or more aspects of the disclosed subject matter;

DETAILED DESCRIPTION

Figure 2A:
FIG. 2A illustrates an exemplary home screen implemented in the software application displayed on the remote device according to one or more aspects of the disclosed subject matter.

The description set forth below in connection with the appended drawings is intended as a description of various embodiments of the disclosed subject matter and is not necessarily intended to represent the only embodiment(s). In certain instances, the description includes specific details for the purpose of providing an understanding of the disclosed subject matter. However, it will be apparent to those skilled in the art that embodiments may be practiced without these specific details. In some instances, well-known structures and components may be shown in block diagram form in order to avoid obscuring the concepts of the disclosed subject matter.

Reference throughout the specification to "one embodiment" or "an embodiment" means that a particular feature, structure, characteristic, operation, or function described in connection with an embodiment is included in at least one embodiment of the disclosed subject matter. Thus, any appearance of the phrases "in one embodiment" or "in an embodiment" in the specification is not necessarily referring to the same embodiment. Further, the particular features, structures, characteristics, operations, or functions may be combined in any suitable manner in one or more embodiments. Further, it is intended that embodiments of the disclosed subject matter can and do cover modifications and variations of the described embodiments.

It must be noted that, as used in the specification and the appended claims, the singular forms "a," "an," and "the" include plural referents unless the context clearly dictates otherwise. That is, unless clearly specified otherwise, as used herein the words "a" and "an" and the like carry the meaning of "one or more." Additionally, it is to be understood that terms such as "left," "right," "top," "bottom," "front," "rear," "side," "height," "length," "width," "upper," "lower," "interior," "exterior," "inner," "outer," and the like that may be used herein, merely describe points of reference and do not necessarily limit embodiments of the disclosed subject matter to any particular orientation or configuration. Furthermore, terms such as "first," "second," "third," etc., merely identify one of a number of portions, components, points of reference, operations and/or functions as described herein, and likewise do not necessarily limit embodiments of the disclosed subject matter to any particular configuration or orientation.

Referring now to the drawings, wherein like reference numerals designate identical or corresponding parts throughout the several views:

For the average PV system manager (e.g., homeowner, building owner, building manager, maintenance employee, etc.), understanding what their solar and storage investments are doing is not easy. For example, they may not be familiar with kilowatts (kw), kilowatt hours (kwh), or how their products impact or correlate with their bill. Additionally, the PV system manager has various needs that can be addressed including whether the system is working, what the system is currently doing, what has the system done so far today, this week, this month, this year, etc., where the energy that was used came from, where the energy that was produced and/or stored went, how the PV system correlates to the electricity bill, how the PV system is trending, and the like. Accordingly, an intuitive user experience that empowers PV system managers to gain clarity into what their system is doing and confidence that they understand as further described herein is desired.

FIG. 1 illustrates an exemplary system 100 for monitoring a solar installation (herein referred to as the system 100) according to one or more aspects of the disclosed subject matter. The solar installation can be a photovoltaic (PV) system installed in various implementations including a PV system installed on a roof (residential or commercial), on a carport, on the ground, and the like. More specifically, the system 100 can include an energy generation and storage system (e.g. PV system and battery) corresponding to PV system 105, a remote device 110, a server 115, and a network 120. In one embodiment, the PV system 105 can be an energy generation system. Additionally, the system 100 can also include a storage system (e.g., battery) coupled to the energy generation system. Accordingly, it should be appreciated that PV system 105 can refer to the energy generation system and storage system together.

The PV system 105 can correspond to one or more solar panels combined with an inverter and other electrical and mechanical hardware that use energy from the sun to generate electricity, for example. The PV system 105 can also include a hub (e.g. local energy control system with electrical architecture of loads, meters, breakers, etc.) for managing the energy generation (e.g. PV) system and an associated storage system (e.g., a battery) to store surplus electricity. The hub can receive information from the PV system 105 (e.g., PV panels, battery, etc.), sends it to a backend system for processing, and the processed information is transmitted to a software application for display on the remote device 110, for example. The hub for managing the PV system can be configured to manage PV production, home consumption, the flow of electricity to and from the grid, to and from the storage system, and the like as further described herein and in U.S. Provisional Application No. 62/986,423, filed Mar. 6, 2020, the disclosure of which is incorporated herein in its entirety by reference thereto (see, e.g., FIGS. 8A and 8B of Attachment 1 in U.S. Provisional Application No. 62/986,423).

The hub can also include a photovoltaic supervisory or monitoring system (e.g., "PVS") that monitors, for example, the status and/or performance of photovoltaic system 105. In some implementations, the photovoltaic supervisory or monitoring system can further control or modify operation of the PV system and/or provide communication functions relating to PV operation. In some embodiments, photovoltaic supervisory system may include the same features of and operate in the same manner as the photovoltaic supervisory system described in U.S. patent application Ser. No. 14/810,423, filed Jul. 27, 2015, the disclosure of which is incorporated herein in its entirety by reference thereto.

The remote device 110 can represent one or more remote devices communicably coupled to the PV system 105 and the server 115 via the network 130. The remote device 110 can be a computer, laptop, smartphone, cellular phone, tablet, PDA, and the like. The remote device 110 can be operated by a user to monitor and interact with the system 100 as further described herein. For example, a homeowner can use remote device 110 to monitor and interact with various aspects of the PV system 105 as further described herein. Similarly, a PV system manager, salesperson, a dealer, a client, a current and/or future customer, and the like can use a remote device 110 to monitor and interact with a PV system. In one embodiment, the remote device 110 interacts with the PV system 105 via a software application (e.g., a mobile application) as further described herein.

The server 115 can represent one or more servers communicably coupled to the PV system 105 and the remote device 110 via the network 130. The server 105 can be configured to perform various processing for the system 100 as further described herein. Additionally, the server 105 can represent a dedicated bank of servers, cloud-based processing, and/or a serverless computing system corresponding to a virtualized set of hardware resources.

The network 120 can be a public network, such as the Internet, or a private network, such as an LAN or WAN network, or any combination thereof and can also include PSTN or ISDN sub-networks. The network 130 can also be wired, such as an Ethernet network, or can be wireless such as a cellular network including EDGE, 3G, 4G, and 5G wireless cellular systems. The wireless network can also be Wi-Fi, Bluetooth, or any other wireless form of communication that is known.

Generally, the system 100 can provide an intuitive user interface and experience with a home screen including a power flow, a battery screen with status and controls, an analysis screen with day, week, month, year, and lifetime summaries, and the like. Additionally, the system 100 can be configured to provide a correlation with a utility bill and true-up cycle, solar panel monitoring, and the like. The system 100 can include a software application run on the remote device 110. The software application can be a web and mobile based application providing various views of homeowner data, key functionality, and information regarding the PV system 105. In other words, the software application can receive various information from one or more of the PV system 105 and the server 115 to display information regarding the PV system 105, including how the PV system 105 is interacting with the user's home, the grid, and any storage options included in the PV system 105. For example, the user interface and user experience can include features such as a power cycle, weather data, social sharing, and various elements of storage data, thereby providing modern and effective tools for a user (e.g., homeowner) to monitor and interact with their PV system 105.

More specifically, the remote device 110, via the software application, can be configured to display energy storage data, energy storage settings, PV production data, residential and/or commercial consumption data, social sharing, weather overlay, and communication tools. Accordingly, the software can assist in monitoring and interacting with the PV system 105. For the software application to display the data, there can be intermediate processing steps between the PV system 105 and displaying the information on remote device 110. For example, the data can be processed remotely (e.g., via server 115) by a third party that stores the consumption and storage data of the PV system 105. Accordingly, the servers 115 can be configured to process the stored data from the PV system 105 can transmit it to the software application in a format that can be displayed by the software application via the remote device 110. The communication of the data can be performed by cloud-based retrieval. Alternatively, or additionally, the communication of the data can be performed using peer-to-peer communication that can adapt telephony technology to a monitoring gateway. The peer-to-peer communication can be in real time and minimize or erase latency. In other words, the peer-to-peer communication can provide real-time updates between system components with more scalable and improved performance. For example, using peer-to-peer communication, data from the PV system 105 can be sent directly to the user via the software application. Accordingly, the information displayed to the user could be dynamically updated in real-time (e.g., every second). In one embodiment, the PV system 105 can still interact with a third party for storage of PV system 105 data, but when a real-time scenario presents itself the components and applications can switch over to real-time mode and connect directly to each other.

For example, with the introduction of P2P capabilities there will be scenarios where the applications requesting real-time data need additional historical data to provide context and meaning to the real-time values being retrieved. For this reason the photovoltaic supervisory or monitoring system (PVS) can store the 5 minute reporting data (or higher resolution if so-produced by the PVS, such as for meters) for a configurable amount of time and as this data ages it will be rolled up into hourly, daily and monthly totals. These rolled-up values can be query-able by P2P clients along with instantaneous/real-time data values. Roll-ups can occur on a continual basis and may overlap with more granular time series data. Each bucket of time series data granularity can have its own data aging and retention policy. For example, hourly data can be rolled up/calculated at the top of each hour so that hourly roll-ups can be available as of the most recent whole hour that has elapsed. The 5-minute data may be configured to be cached for 60 days before it's discarded. In this scenario a user can have 60 days of 5 minute data (17,280 data points), hourly data (1,440 data points), daily (60 data points) and monthly (2 data points) all providing overlapping data of the same interval but at different granularities. The differences can come into play in retention policies, compute overhead for rending, and data transfer, for example. Given the amount of storage available on a photovoltaic supervisory or monitoring system (e.g. PVS6) all data, at all granularities, could be persisted for the 10-year warrantied life of the unit. The rolled-up data can be stored in local time series-optimized databases via the rrdtool database, for example. The primary source of data can initially be via scraping the protobuf data that is currently sent to EDP, for example. However, other means of logging data can be provided so that metrics such as disk space, CPU load, memory utilization, I/O rates, etc. can be stored if desired. In the above example, these could come from the gRPC interface. Accordingly, the system 100 provides the ability to easily configure the time series behavior via configuration files so that the data retention can be altered without the need for firmware updates.

FIG. 2A illustrates an exemplary home screen 200 implemented in the software application displayed on the remote device 110 according to one or more aspects of the disclosed subject matter. For example, the home screen 200 can include the user's name and indicate that the PV system 105 is online.

Figure 2B:
FIG. 2B illustrates an exemplary home screen implemented in the software application displayed on the remote device according to one or more aspects of the disclosed subject matter.

FIG. 2B illustrates an exemplary home screen 205 implemented in the software application displayed on the remote device 110 according to one or more aspects of the disclosed subject matter. The home screen 205 can include a current status of the PV system 105. For example, the home screen 205 can indicate a PV system status that indicates that the PV system 105 is powering the user's building (e.g., a homeowner's home) and also exporting excess solar energy. Additionally, the home screen 205 can display the current weather including a sky color and the sun (optionally depending on the weather condition). For example, in an exemplary implementation of the home screen 205 as illustrated in FIG. 2B, the current weather corresponds to a blue sky and a sunny day, which is indicated by the blue sky and the sun being out in the home screen 205. Other weather examples are further described herein.

Additionally, in one aspect, FIG. 2A can be a first home screen (e.g., home screen 200) when a user opens the software application, and the home screen 200 can transition to a second home screen (e.g., home screen 205) automatically after a predetermined amount of time, for example. In other words, the home screen 200 can animate to the home screen 205 to display the current weather.

Additionally, it should be appreciated that although various descriptions herein refer to PV systems installed for a residential home, the examples are merely exemplary, and the concepts can be applied to other energy systems installed in various areas and/or buildings (e.g., commercial building).

Figure 3:
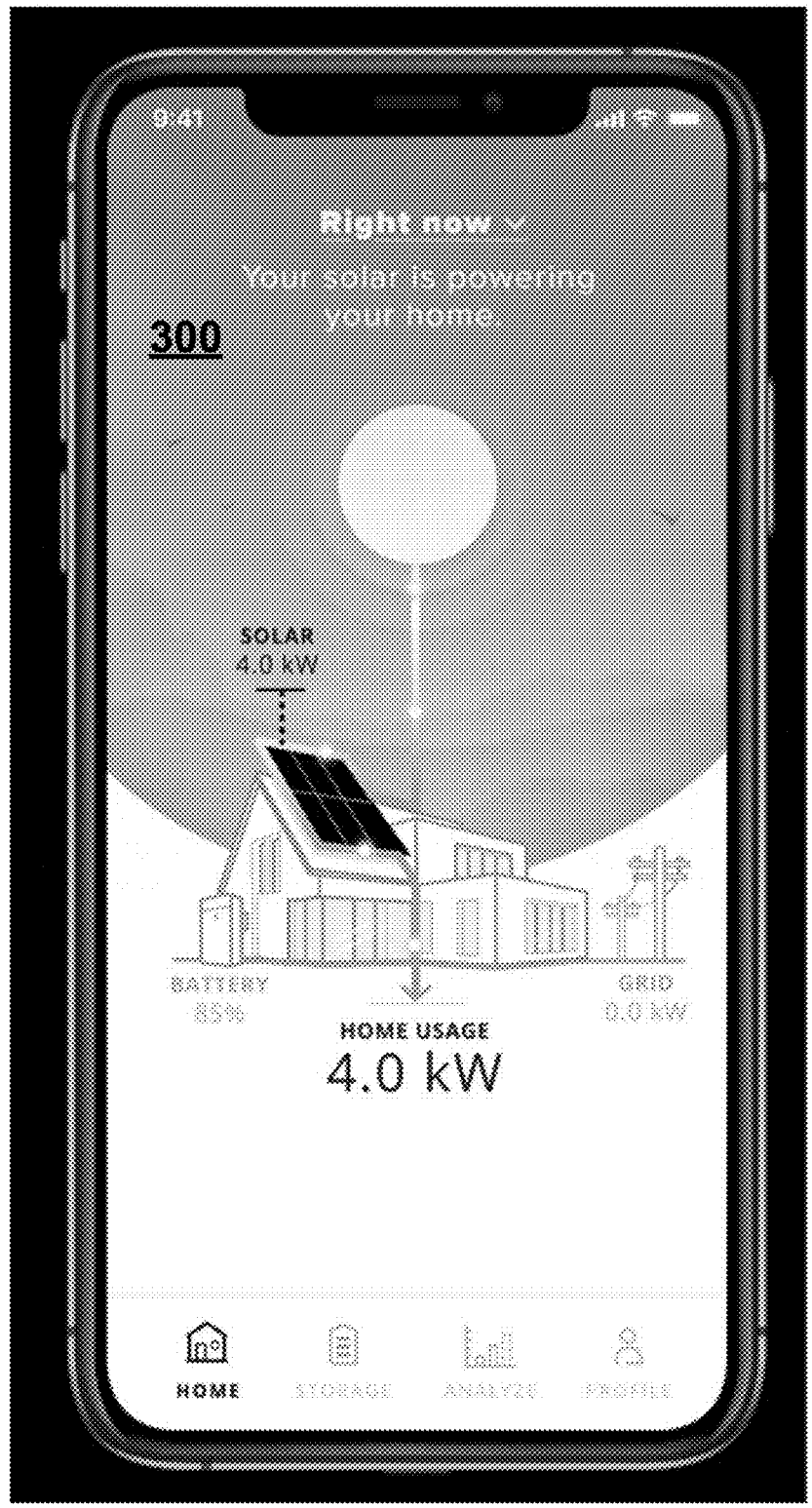
FIG. 3 illustrates an exemplary power flow page implemented in the software application displayed on the remote device according to one or more aspects of the disclosed subject matter.

FIG. 3 illustrates an exemplary power flow page 300 implemented in the software application displayed on the remote device 110 according to one or more aspects of the disclosed subject matter. It should be appreciated that power flow and energy flow can be used interchangeably referring to the power/energy flowing through the PV system. The power flow page 300 can display a PV system status (e.g., a status of the PV system 105). It should be appreciated that a PV system status can also be referred to as a state of the PV system. Examples of various PV system statuses and a corresponding power flow are described further herein in FIGS. 3-13 and 15. Generally, the power flow page 300 can provide information to the user including where energy the user is using is coming from (e.g., solar, battery, grid, etc.) and where energy the user is producing is going (e.g., to the building, battery, grid, etc.). In one aspect, the power flow page 300 can show the energy in kilo-watt units. Additionally, the power flow page 300 (as well as other examples of PV system states described in FIGS. 4-13 and 15) can include an animation of "electrons" flowing along lines indicating the power flow. For example, the exemplary power flow illustrated in FIG. 3 includes the energy flowing from the sun to the solar panels to home usage. The power flow page 300 can also indicate a battery's state of charge. Regarding the PV system state more specifically, the PV system state as illustrated in FIG. 3 corresponds to solar panel to home use without any export (e.g., to the grid).

Figure 4:
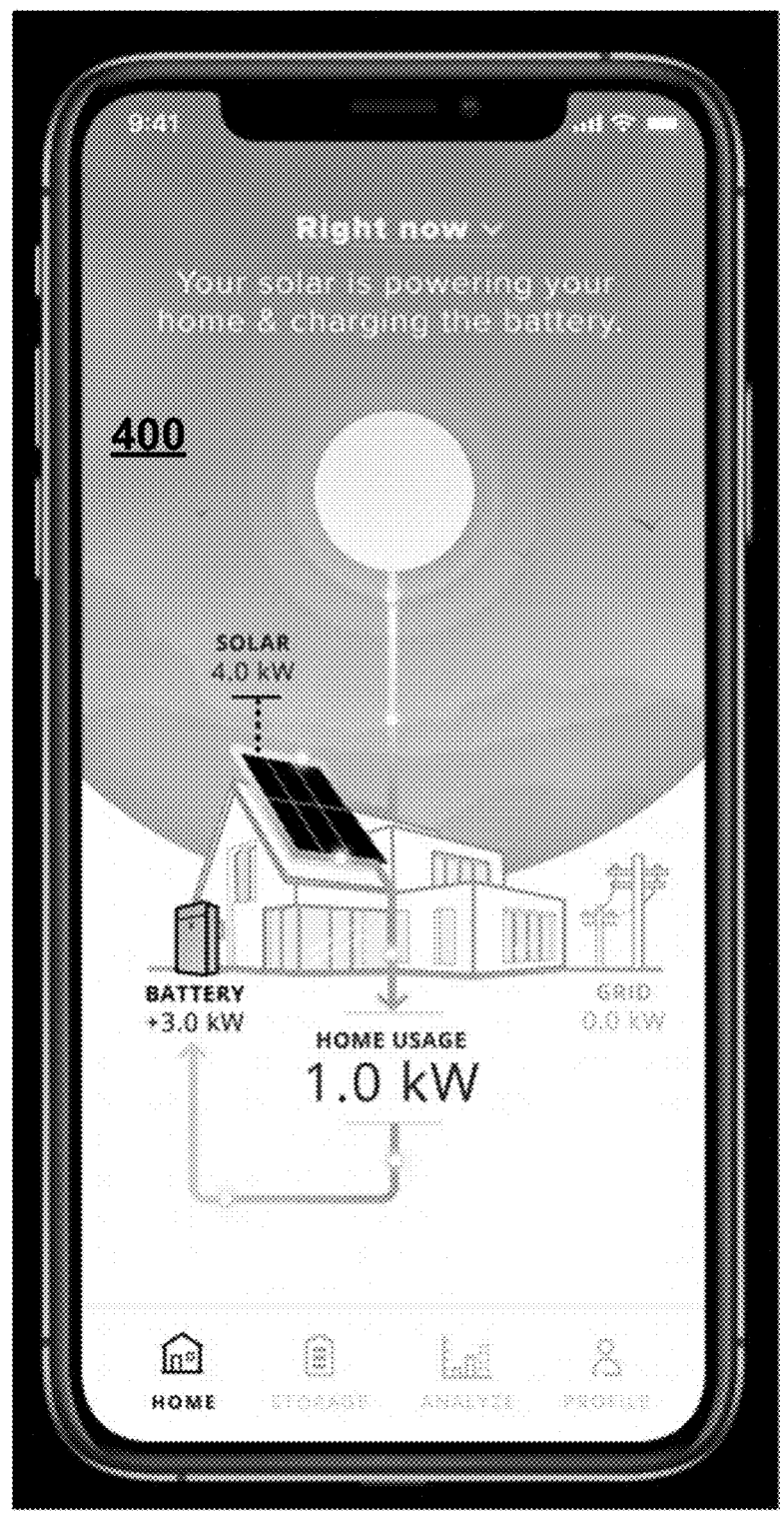
FIG. 4 illustrates an exemplary PV system state page implemented in the software application displayed on the remote device according to one or more aspects of the disclosed subject matter.

FIG. 4 illustrates an exemplary PV system state page 400 implemented in the software application displayed on the remote device 110 according to one or more aspects of the disclosed subject matter. For example, the PV system state page 400 can indicate a power flow for solar to home usage and also charging the battery. In other words, if the solar panel system is producing more energy than the home is using (e.g., 4 kW produced compared to 1 kW used), the extra energy (e.g., 3 kW) can charge the battery.

Figure 5:
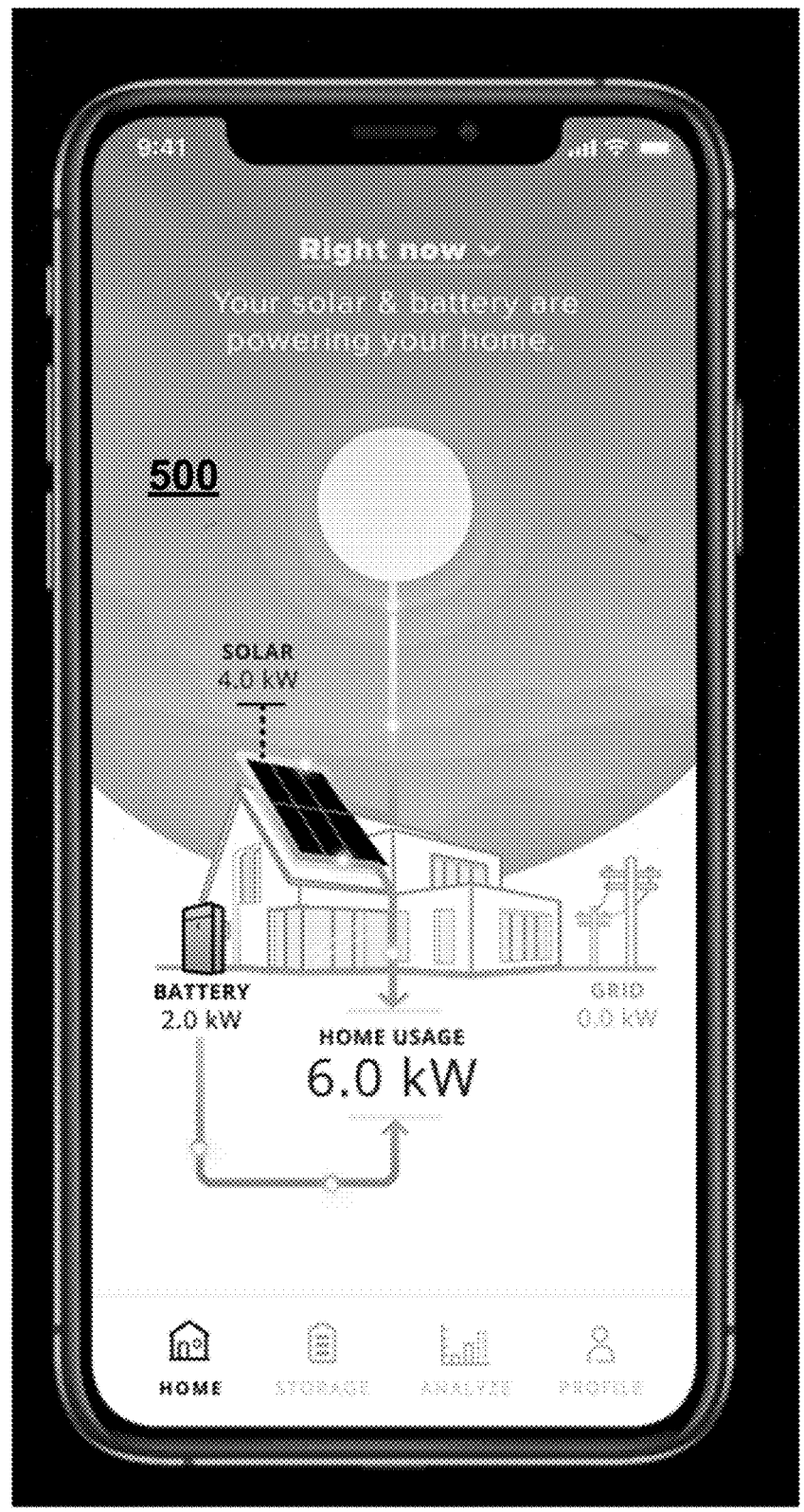
FIG. 5 illustrates an exemplary PV system state page implemented in the software application displayed on the remote device according to one or more aspects of the disclosed subject matter.

FIG. 5 illustrates an exemplary PV system state page 500 implemented in the software application displayed on the remote device 110 according to one or more aspects of the disclosed subject matter. For example, the PV system state page 500 can indicate a power flow for solar and battery powering the user's home. In other words, if the home is using more energy than the solar panel system is providing (e.g., 6 kW compared to 4 kW), the battery, when it is sufficiently charged, can contribute the remaining energy to the home (e.g., 2 kW).

Figure 6:
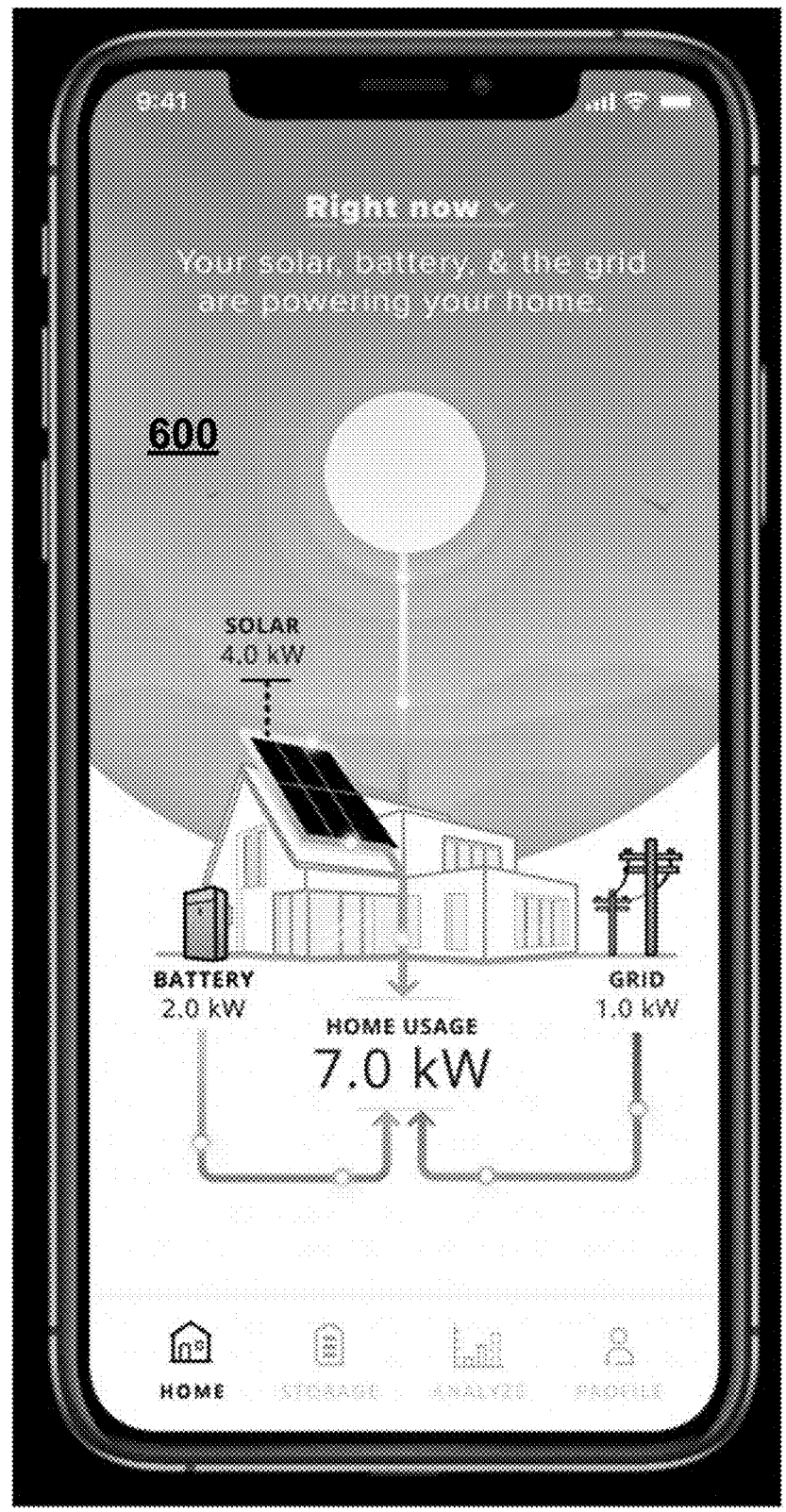
FIG. 6 illustrates an exemplary PV system state page implemented in the software application displayed on the remote device according to one or more aspects of the disclosed subject matter.

FIG. 6 illustrates an exemplary PV system state page 600 implemented in the software application displayed on the remote device 110 according to one or more aspects of the disclosed subject matter. For example, the PV system state page 600 can indicate a power flow for solar, battery, and grid powering the user's home. In other words, if the home is using more energy than the solar panel system and the battery are providing (e.g., 4 kW and 2 kW compared to 7 kW), the grid can contribute the remaining energy to the home (e.g., 1 kW).

Figure 7:
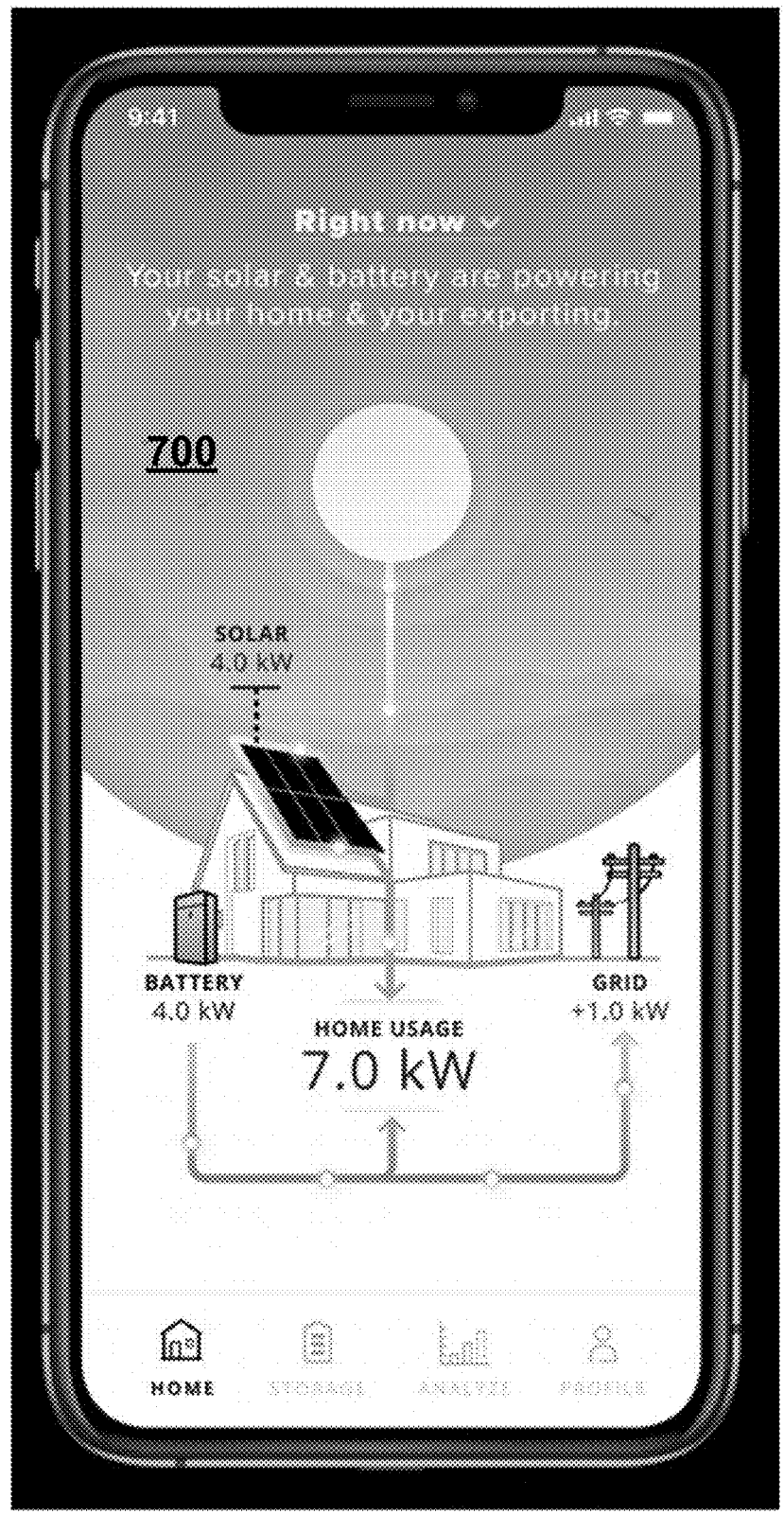
FIG. 7 illustrates an exemplary PV system state page implemented in the software application displayed on the remote device according to one or more aspects of the disclosed subject matter.

FIG. 7 illustrates an exemplary PV system state page 700 implemented in the software application displayed on the remote device 110 according to one or more aspects of the disclosed subject matter. For example, the PV system state page 700 can indicate a power flow for solar and battery powering the home and the battery also exporting to the grid. In other words, if the solar and battery are able to provide more energy than the home usage (e.g., 4 kW and 4 kW compared to 7 kW), the remaining energy can be exported to the grid (e.g., 1 kW).

Figure 8:
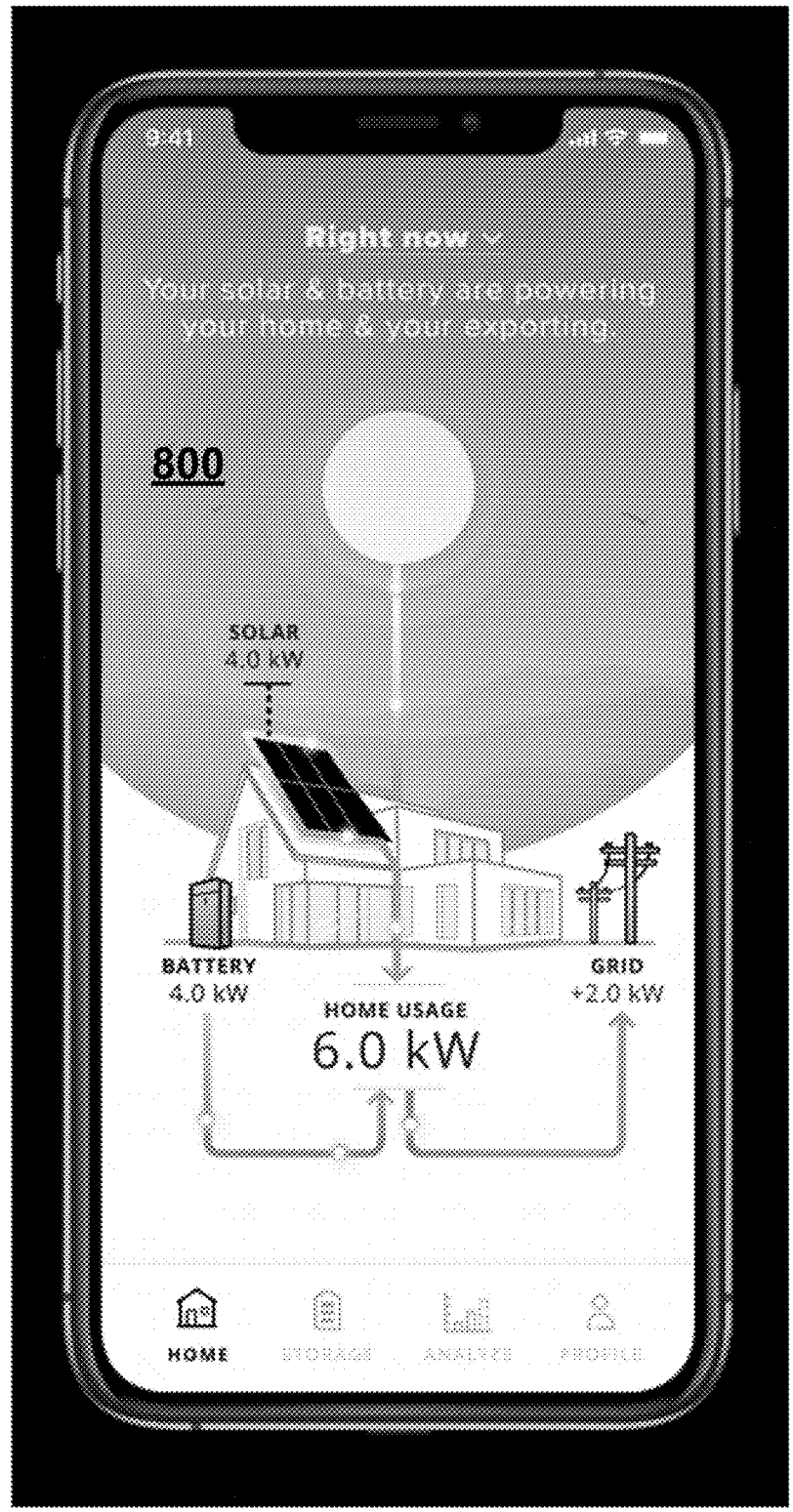
FIG. 8 illustrates an exemplary PV system state page implemented in the software application displayed on the remote device according to one or more aspects of the disclosed subject matter.

FIG. 8 illustrates an exemplary PV system state page 800 implemented in the software application displayed on the remote device 110 according to one or more aspects of the disclosed subject matter. For example, the PV system state page 800 can indicate a power flow for solar and battery powering the home and both the solar and the battery also exporting to the grid. In other words, if the solar and the battery are able to provide more energy than the home usage (e.g., 4 kW and 4 kW compared to 6 kW), the remaining from the solar (e.g., 1 kW) and the remaining from the battery (e.g., 1 kW) can be exported to the grid.

Figure 9:
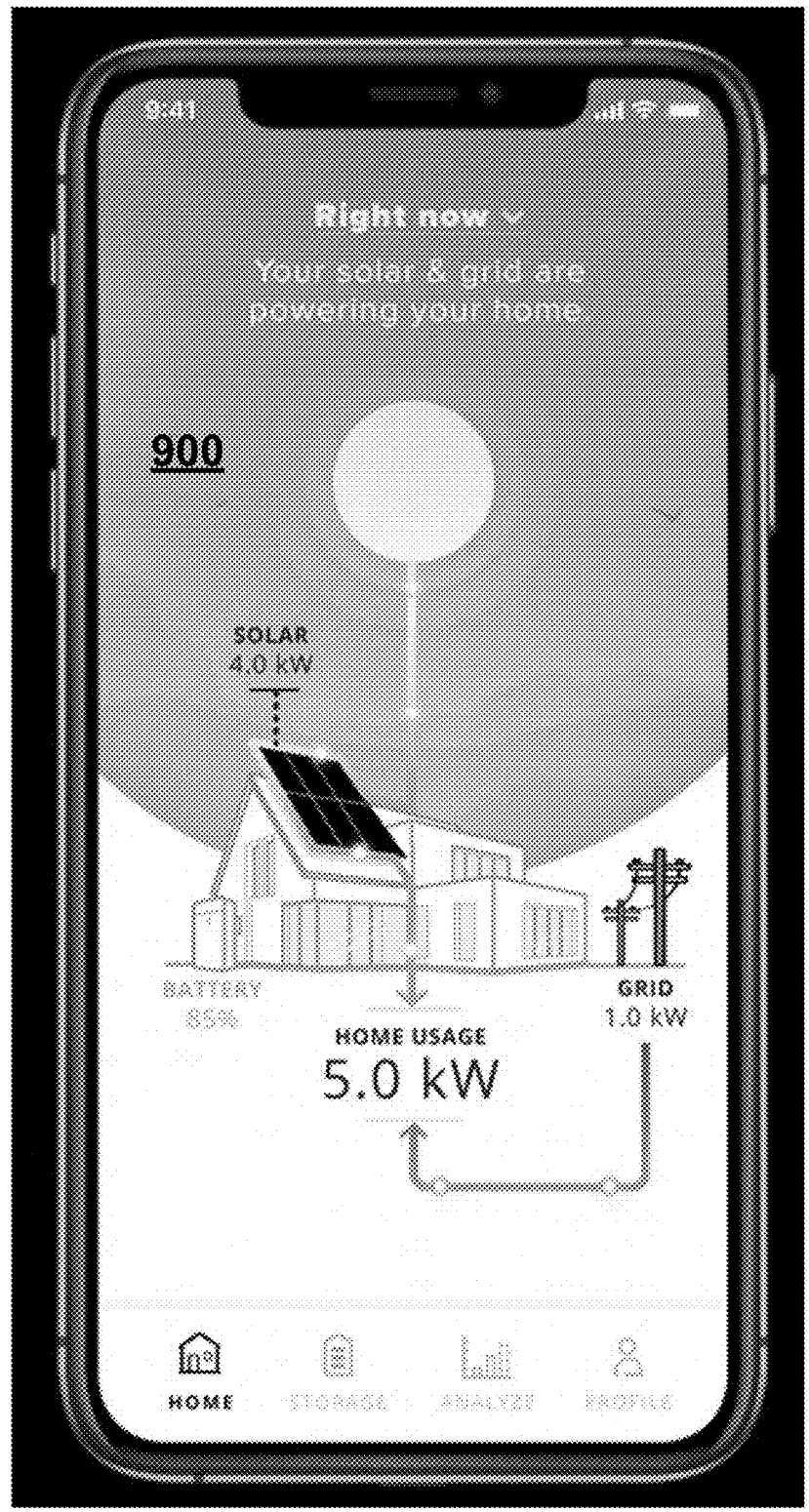
FIG. 9 illustrates an exemplary PV system state page implemented in the software application displayed on the remote device according to one or more aspects of the disclosed subject matter.

FIG. 9 illustrates an exemplary PV system state page 900 implemented in the software application displayed on the remote device 110 according to one or more aspects of the disclosed subject matter. For example, the PV system state page 900 can indicate a power flow for solar and grid to home usage. In other words, if the home is using more energy than the solar panel system is able to provide (e.g., 5 kW compared to 4 kW), the grid can contribute the remaining energy to the home (e.g., 1 kW).

Figure 10:
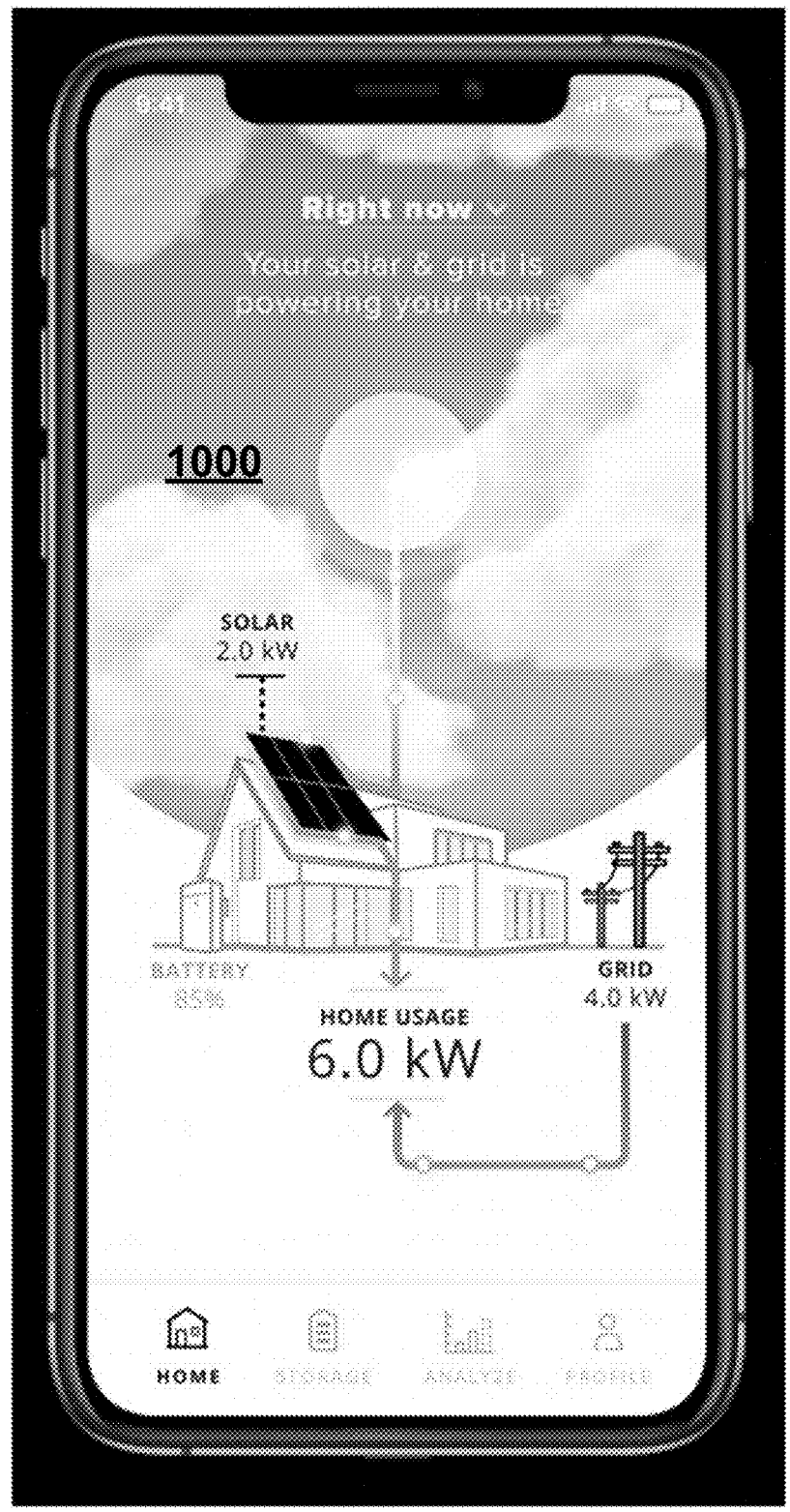
FIG. 10 illustrates an exemplary PV system state page implemented in the software application displayed on the remote device according to one or more aspects of the disclosed subject matter.

FIG. 10 illustrates an exemplary PV system state page 1000 implemented in the software application displayed on the remote device 110 according to one or more aspects of the disclosed subject matter. For example, the PV system state page 1000 can indicate that the weather is partly cloudy. Further, the PV system state page 1000 can indicate a power flow for solar and grid powering the home that corresponds to the partly cloudy weather. For example, because the clouds are affecting the solar panel system's energy production, the PV system 105 can rely on the grid to make up the difference. Additionally, the battery, when sufficiently charged and/or based on various user settings, can also be relied on to contribute energy to the home usage.

Figure 11:
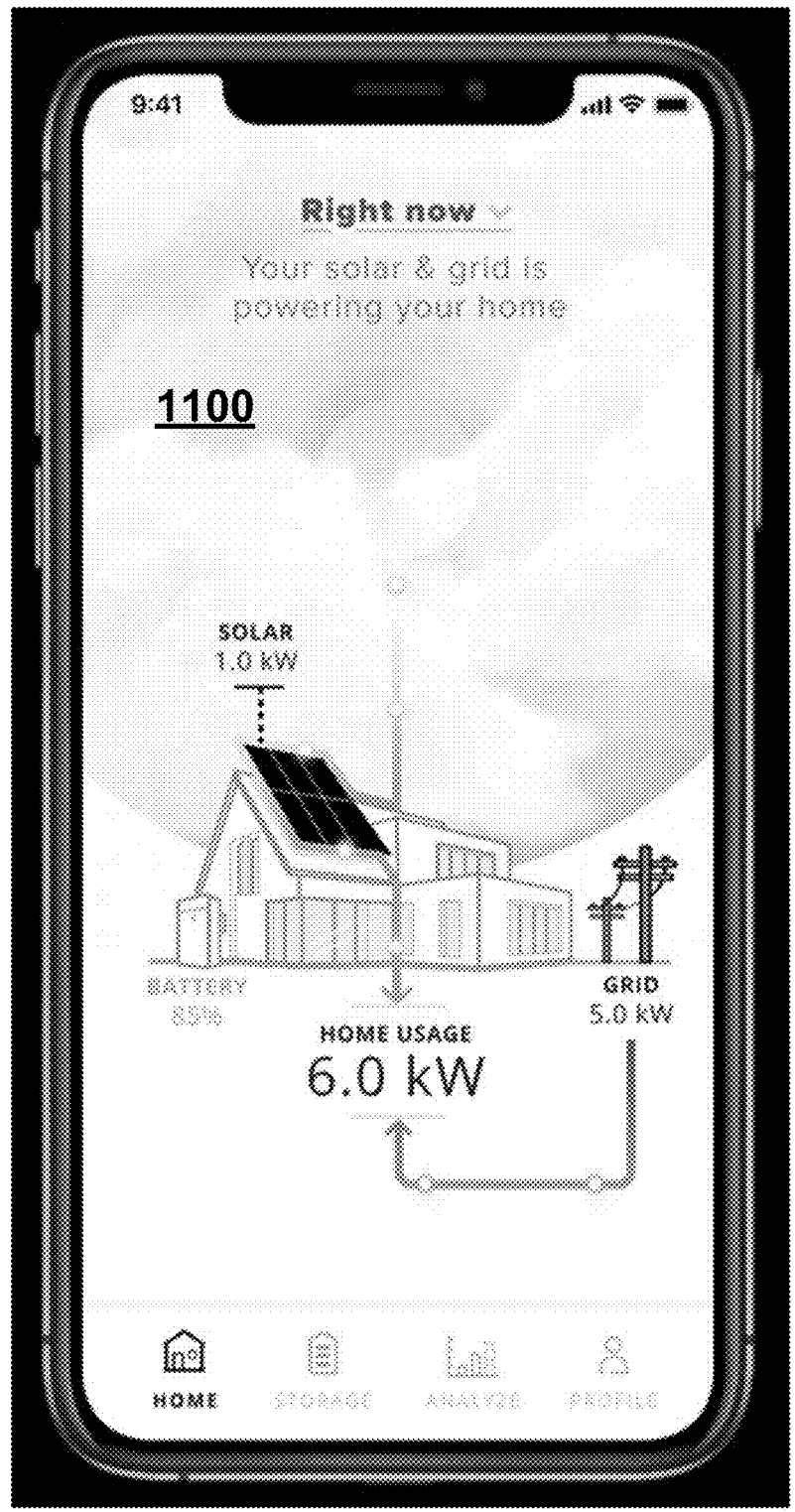
FIG. 11 illustrates an exemplary PV system state page implemented in the software application displayed on the remote device according to one or more aspects of the disclosed subject matter.

FIG. 11 illustrates an exemplary PV system state page 1100 implemented in the software application displayed on the remote device 110 according to one or more aspects of the disclosed subject matter. For example, the PV system state page 1100 can indicate that the weather is very cloudy and/or foggy. Further, the PV system state page 1100 can indicate a power flow for solar and grid powering the home that corresponds to the very cloudy and/or foggy weather. For example, because the clouds are affecting the solar panel system's energy production, the PV system 105 can rely on the grid to make up the difference. Additionally, the battery, when sufficiently charged and/or based on various user settings, can also be relied on to contribute energy to the home usage.

Figure 12:
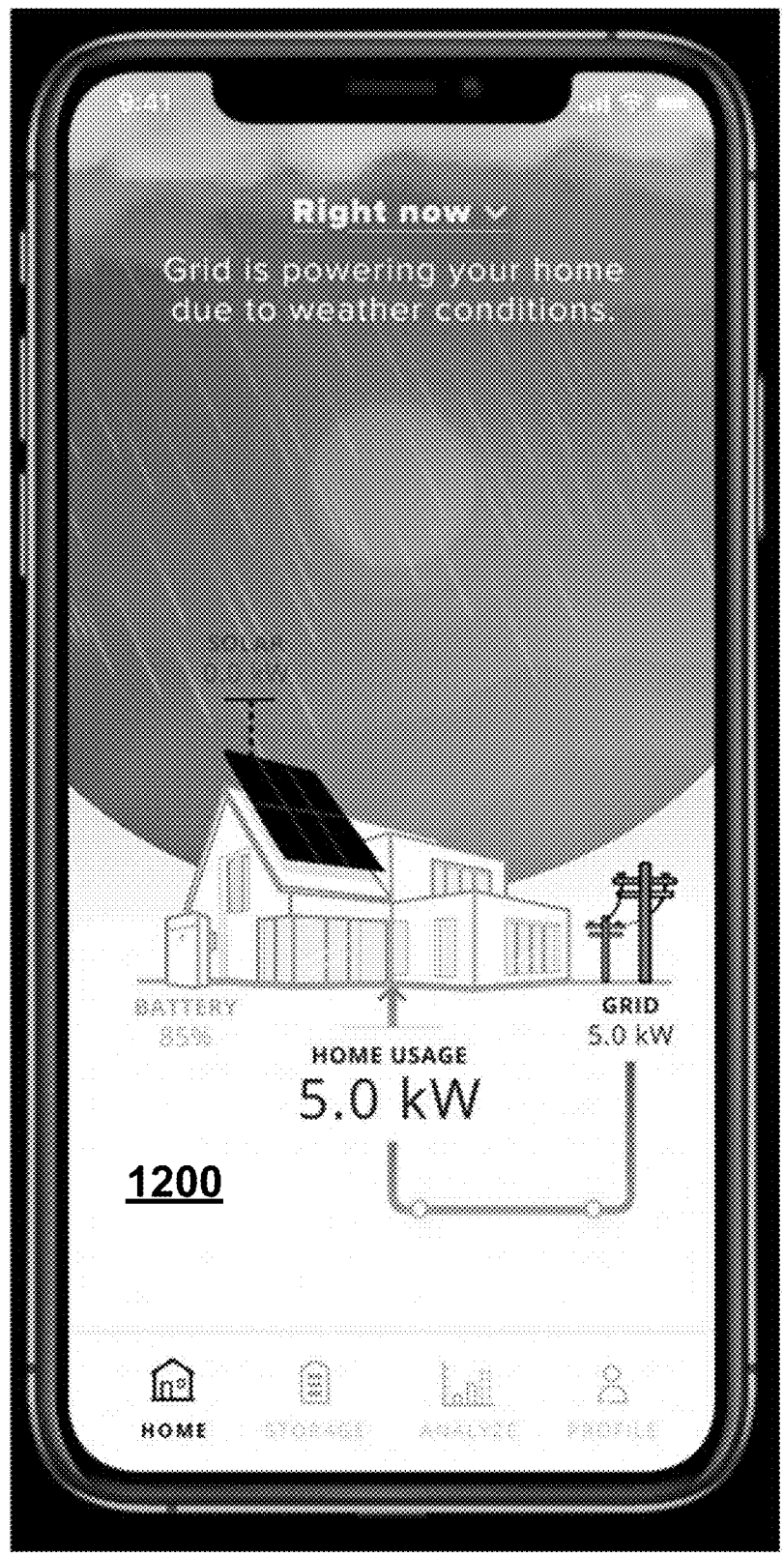
FIG. 12 illustrates an exemplary PV system state page implemented in the software application displayed on the remote device according to one or more aspects of the disclosed subject matter.

FIG. 12 illustrates an exemplary PV system state page 1200 implemented in the software application displayed on the remote device 110 according to one or more aspects of the disclosed subject matter. For example, the PV system state page 1200 can indicate that it is raining. Further, the PV system state page 1200 can indicate a power flow for the grid powering the home that corresponds to the rainy weather. For example, because the rain is affecting the solar panel system's energy production, the PV system 105 can rely on the grid to power the home. Additionally, the battery, when sufficiently charged and/or based on various user settings, can also be relied on to contribute energy to the home usage.

Figure 13:
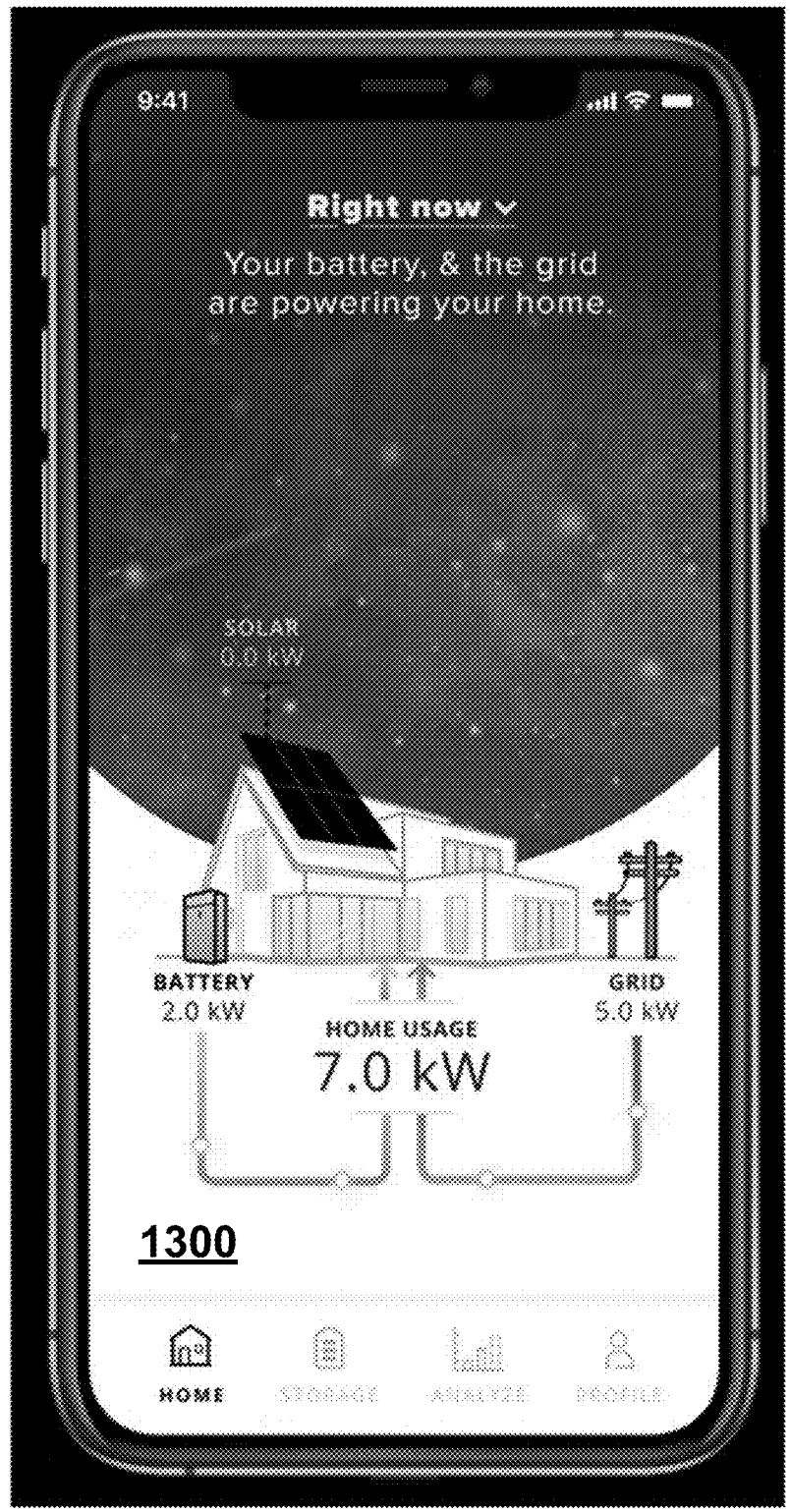
FIG. 13 illustrates an exemplary PV system state page implemented in the software application displayed on the remote device according to one or more aspects of the disclosed subject matter.

FIG. 13 illustrates an exemplary PV system state page 1300 implemented in the software application displayed on the remote device 110 according to one or more aspects of the disclosed subject matter. For example, the PV system state page 1300 can indicate that it is nighttime (e.g., after sunset and before sunrise). For example, the display of the sky can correspond to a night sky and the house can be displayed so that it appears that the lights inside the house are turned on. Because it is nighttime, the solar panel is not producing energy, so the PV system 105 can rely on a combination of the battery and the grid to provide energy to the home.

Figure 14:
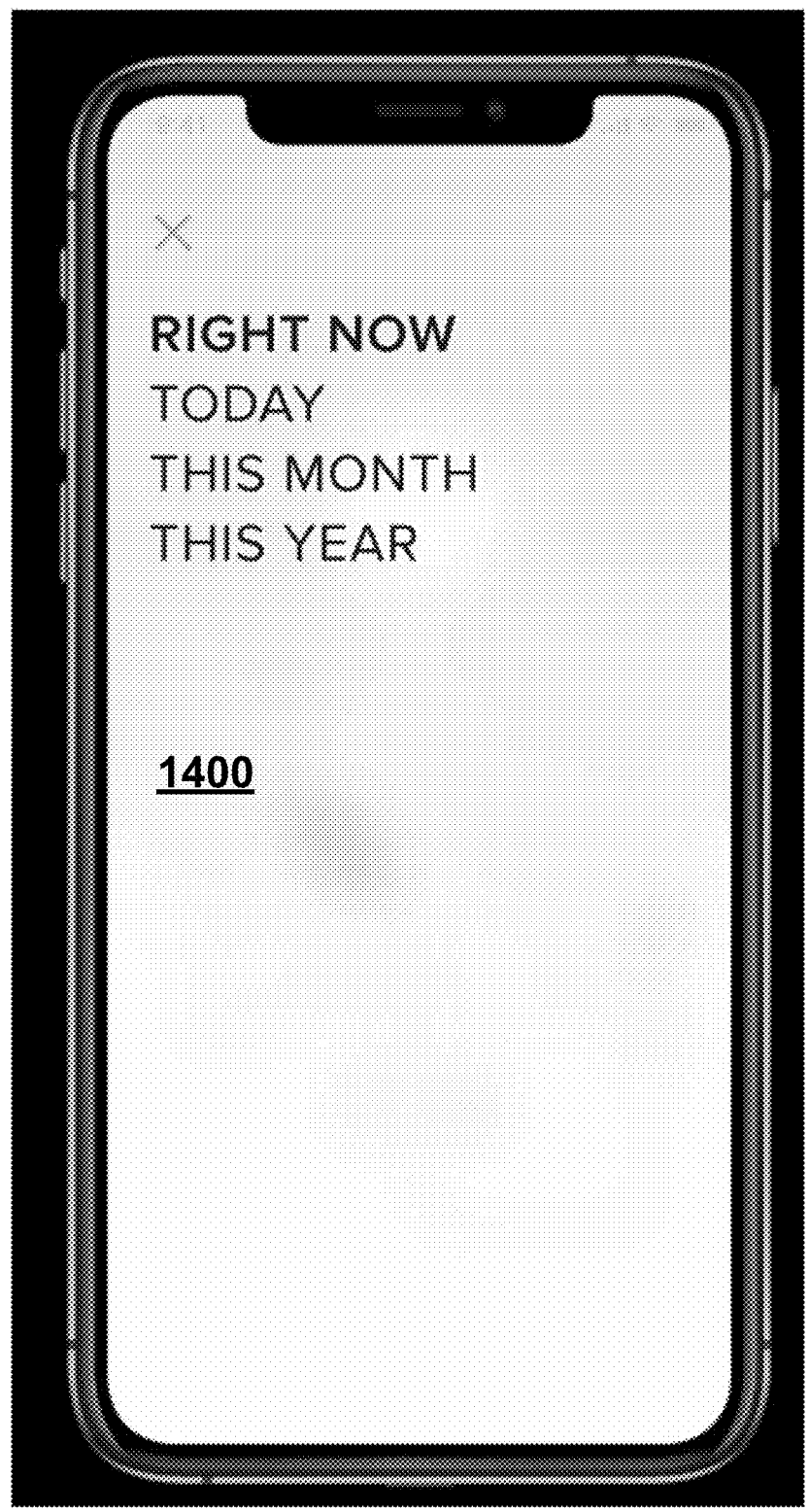
FIG. 14 illustrates an exemplary settings page implemented in the software application displayed on the remote device according to one or more aspects of the disclosed subject matter.

FIG. 14 illustrates an exemplary settings page 1400 implemented in the software application displayed on the remote device 110 according to one or more aspects of the disclosed subject matter. For example, the settings page 1400 can be used to change a time period displayed. In other words, the user can choose different time periods for the power flow displayed. For example, "RIGHT NOW" can correspond to a recent time period (e.g., within the past 5 minutes), "TODAY" can correspond to since 12:00 AM (i.e., midnight) of that date, "THIS MONTH" can correspond to since the $1^{st}$ of the month, and "THIS YEAR" can correspond to year to date.

Figure 15:
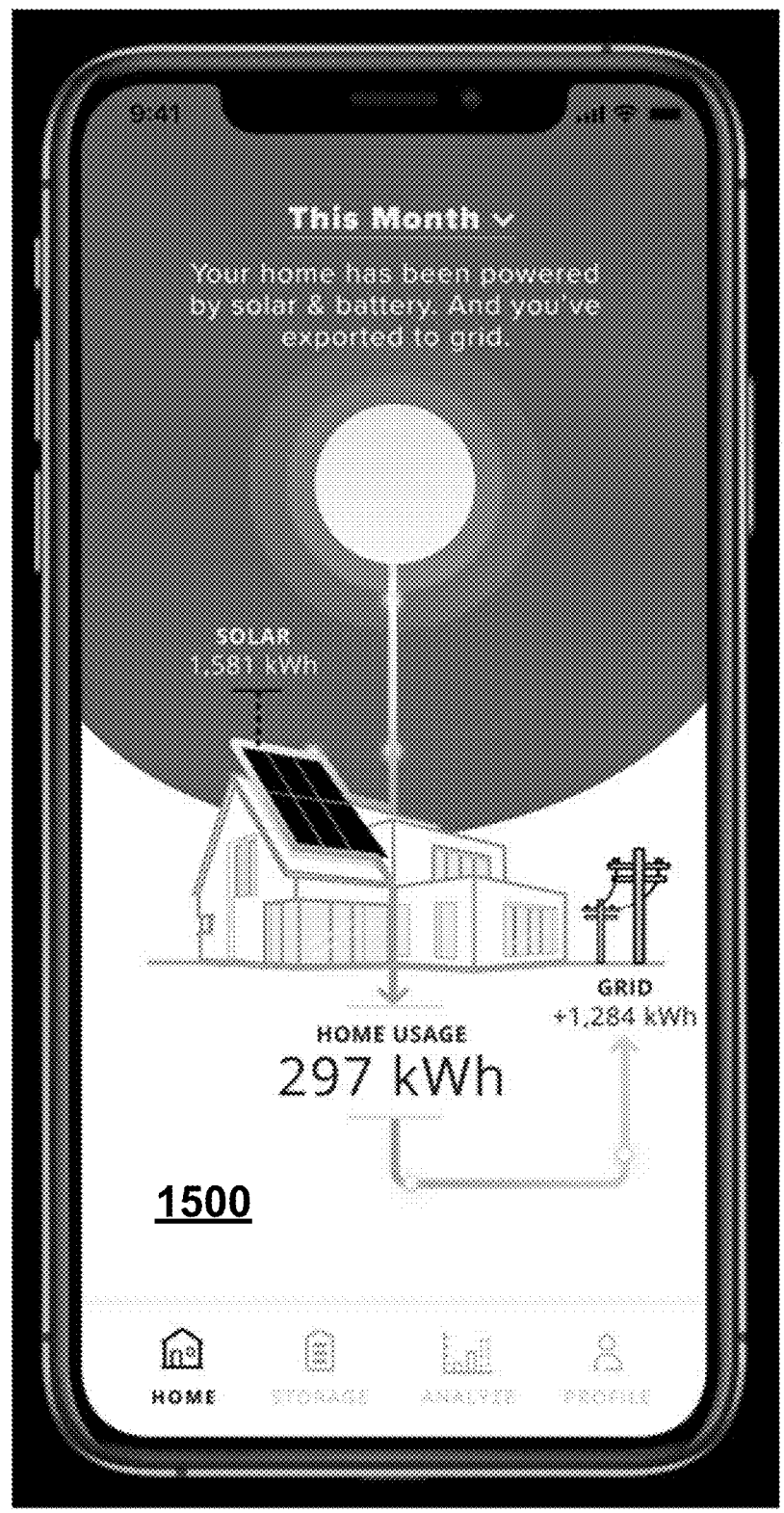
FIG. 15 illustrates an exemplary PV system state page implemented in the software application displayed on the remote device according to one or more aspects of the disclosed subject matter.

FIG. 15 illustrates an exemplary PV system state page 1500 implemented in the software application displayed on the remote device 110 according to one or more aspects of the disclosed subject matter. For example, the PV system state page 1500 can indicate a power flow of the PV system 105 for the month (e.g., since the $1^{st}$ of the month). For example, the weather can be normalized (e.g., displayed as the color gray), all PV system states (e.g., FIGS. 3-13) can be possible, units change from kW to kWh, and the data displayed can be calculated on a net consumption basis. Additionally, a similar page can be displayed for "TODAY" and "THIS YEAR" where the data is displayed according to the corresponding time frame.

It should be appreciated that each of the pages described in FIGS. 3-15 can correspond to a home page (e.g., under a home page tab on a navigation bar), such that the information displayed on the home page changes based on the PV system state and/or the weather.

Figure 16:
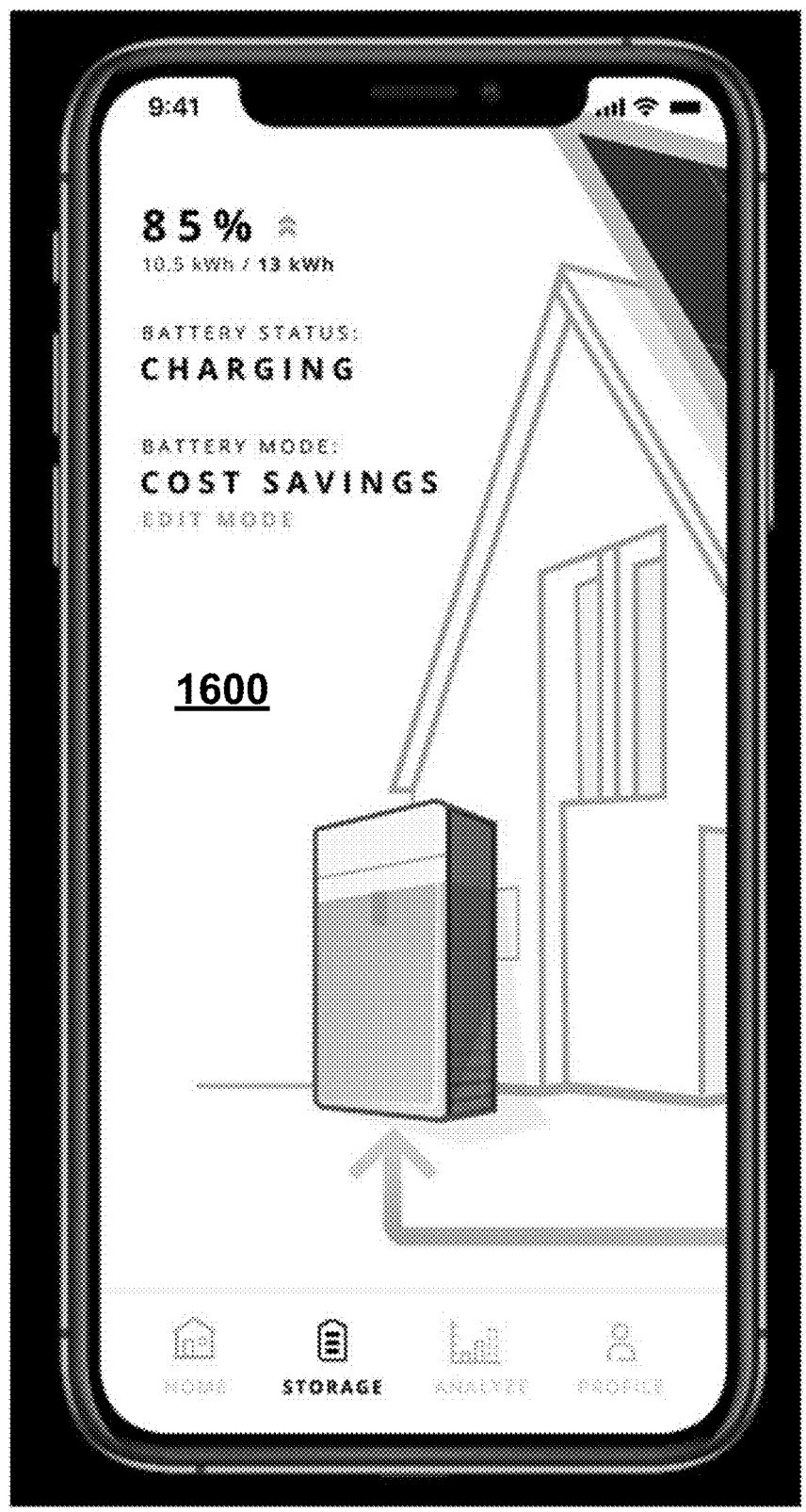
FIG. 16 illustrates an exemplary storage state page implemented in the software application displayed on the remote device according to one or more aspects of the disclosed subject matter.

FIG. 16 illustrates an exemplary storage state page 1600 implemented in the software application displayed on the remote device 110 according to one or more aspects of the disclosed subject matter. Generally, the storage state page can be navigated to by selecting a storage tab on a navigation bar. The storage state page can be a zoomed in view of the home page focusing on the energy storage system (e.g., the battery). The storage state page can indicate a state of charge, a battery status, and a battery mode. For example, the exemplary battery state illustrated in the storage state page 1600 of FIG. 16 indicates that the battery is being charged from solar (i.e., the solar panel system), the battery status is charging, and the battery mode is a cost savings mode. A settings page to edit the battery mode (e.g., battery mode settings page 1900 in FIGS. 19A and 19B) can also be navigated to from the storage state page, for example.

Figure 17:
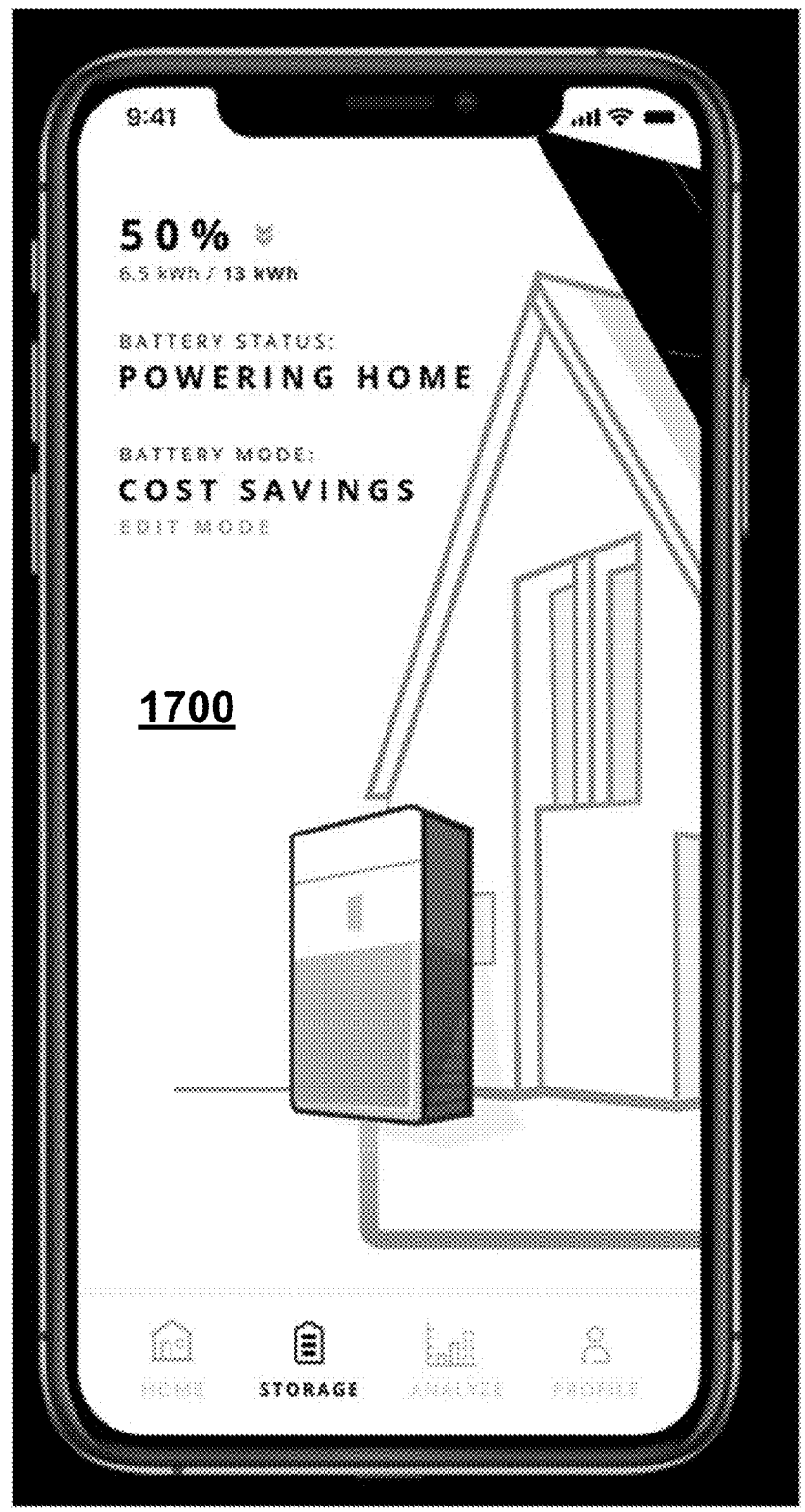
FIG. 17 illustrates an exemplary storage state page implemented in the software application displayed on the remote device according to one or more aspects of the disclosed subject matter.

FIG. 17 illustrates an exemplary storage state page 1700 implemented in the software application displayed on the remote device 110 according to one or more aspects of the disclosed subject matter. For example, the storage state page 1700 can indicate that battery is discharging to the home. Alternatively, or additionally, the storage state page can indicate that the battery is discharging to the grid.

Figure 18:
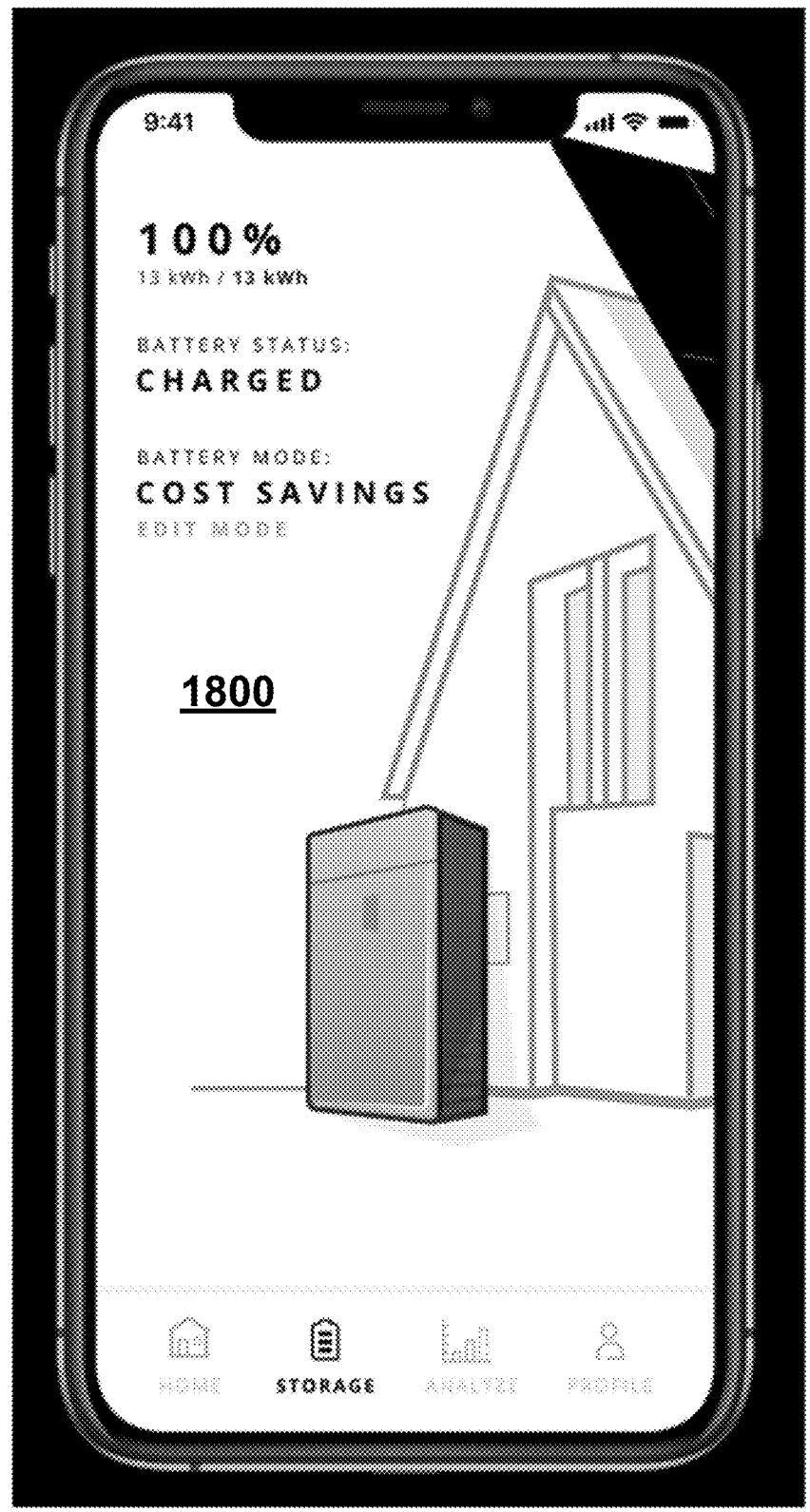
FIG. 18 illustrates an exemplary storage state page implemented in the software application displayed on the remote device according to one or more aspects of the disclosed subject matter.

FIG. 18 illustrates an exemplary storage state page 1800 implemented in the software application displayed on the remote device 110 according to one or more aspects of the disclosed subject matter. For example, the storage state page 1800 can indicate that the battery is fully charged and idle.

Figure 19A:
FIG. 19A illustrates an exemplary battery mode settings page implemented in the software application displayed on the remote device according to one or more aspects of the disclosed subject matter.

FIG. 19A illustrates an exemplary battery mode settings page 1900 implemented in the software application displayed on the remote device 110 according to one or more aspects of the disclosed subject matter. The battery mode settings page 1900 allows a user to change the battery mode. For example, the battery mode options can include an outage back-up mode (e.g., Outage Mode), a cost savings mode (e.g., Money Saver Mode), and a self-supply mode (e.g., Freedom Mode).

Figure 19B:
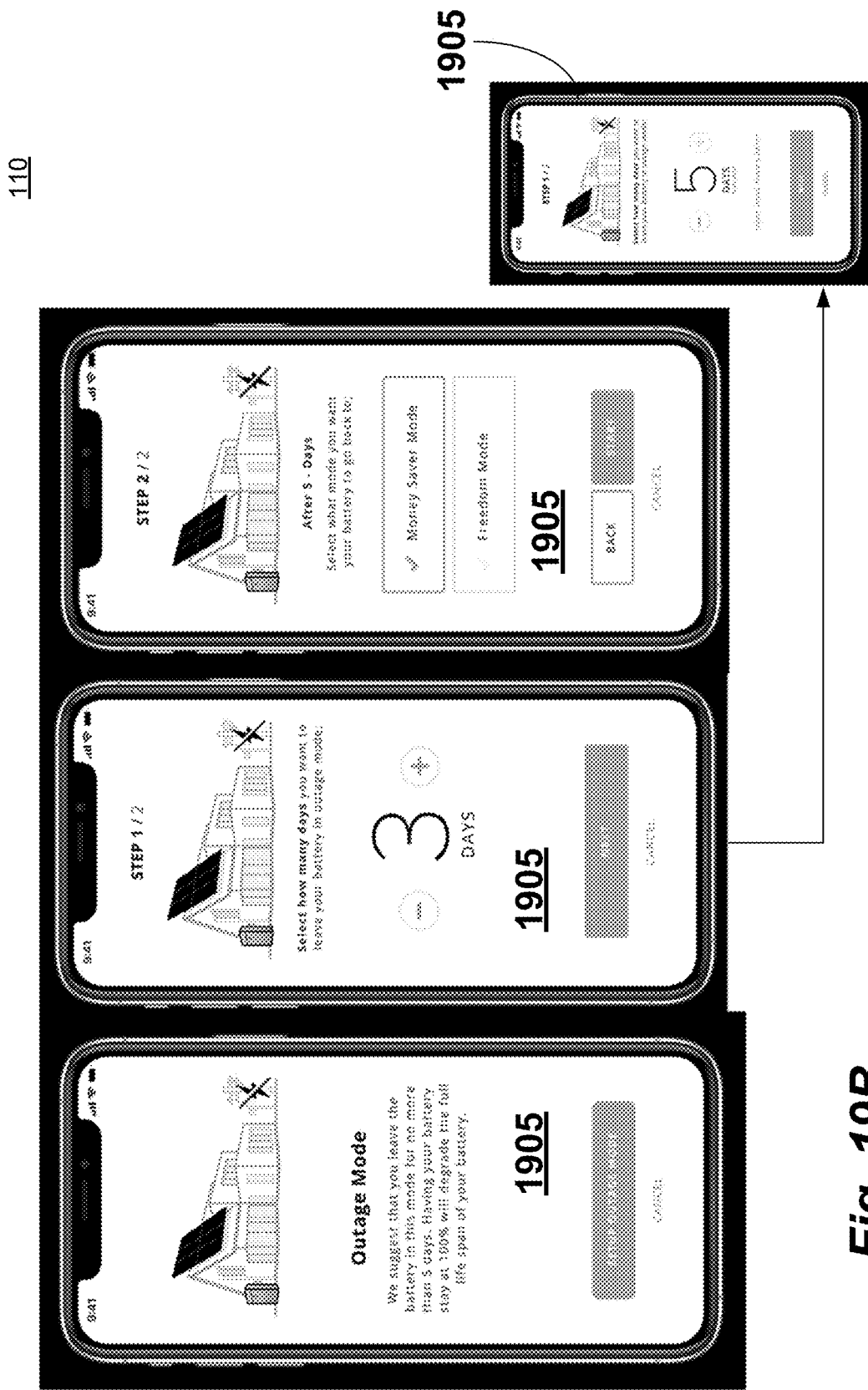
FIG. 19B illustrates an exemplary outage mode flow page implemented in the software application displayed on the remote device according to one or more aspects of the disclosed subject matter.

FIG. 19B illustrates an exemplary outage mode flow page 1905 implemented in the software application displayed on the remote device 110 according to one or more aspects of the disclosed subject matter. For example, the outage mode flow page 1905 can include setting up the outage mode, selecting how many days to leave the battery in outage mode, and selecting which mode (e.g., Money Saver Mode or Freedom Mode) that the battery should return to after the selected number of days. Additionally, the Money Saver Mode and the Freedom Mode can have a flow page.

Figure 20A:
FIGS. 20A and 20B illustrate an exemplary analysis page implemented in the software application displayed on the remote device according to one or more aspects of the disclosed subject matter.
Figure 20B:
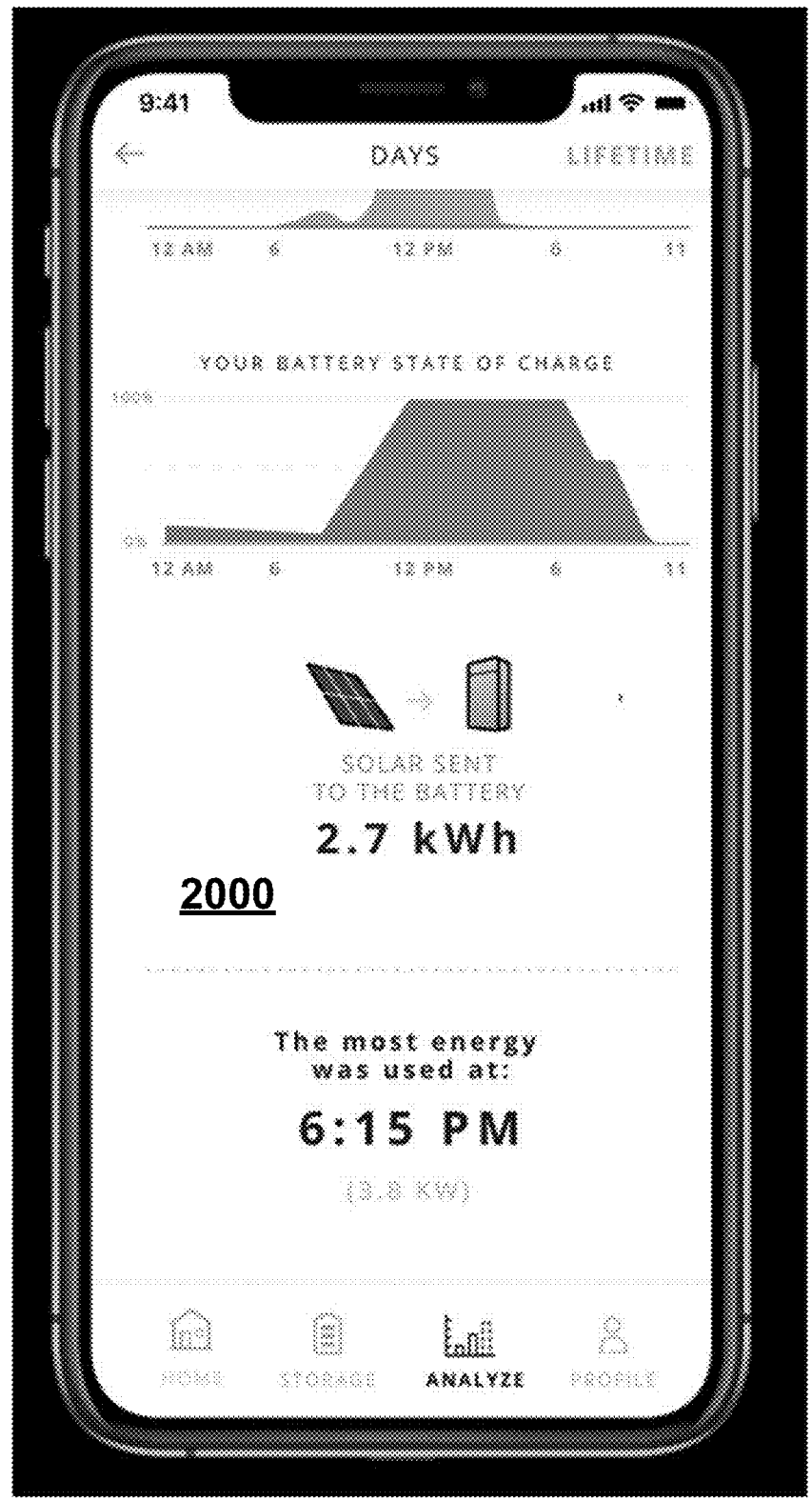

FIGS. 20A and 20B illustrate an exemplary analysis page 2000 implemented in the software application displayed on the remote device 110 according to one or more aspects of the disclosed subject matter. For example, the information illustrated on the analysis page 2000 in FIGS. 20A and 20B can be accessed by scrolling. Generally, the analysis page can be navigated to by selecting an analyze tab on a navigation bar. Additionally, the analysis page 2000 can display an energy mix summary (the analysis page 2000 illustrates a daily summary), a home usage graph, a solar export graph, a state of charge graph, how much solar charged the battery in kWh, peak of energy time (e.g., when the most energy was used), and the like. The exemplary analysis page 2000 illustrated in FIGS. 20A and 20B indicates an energy mix daily summary. Additionally, the analysis page (e.g., the analysis page 2000, 2200, and 2300) can include a button to navigate to a lifetime totals page (e.g., lifetime totals page 2100) as further described herein.

Figure 21A:
FIGS. 21A and 21B illustrate an exemplary lifetime totals page implemented in the software application displayed on the remote device according to one or more aspects of the disclosed subject matter.
Figure 21B:
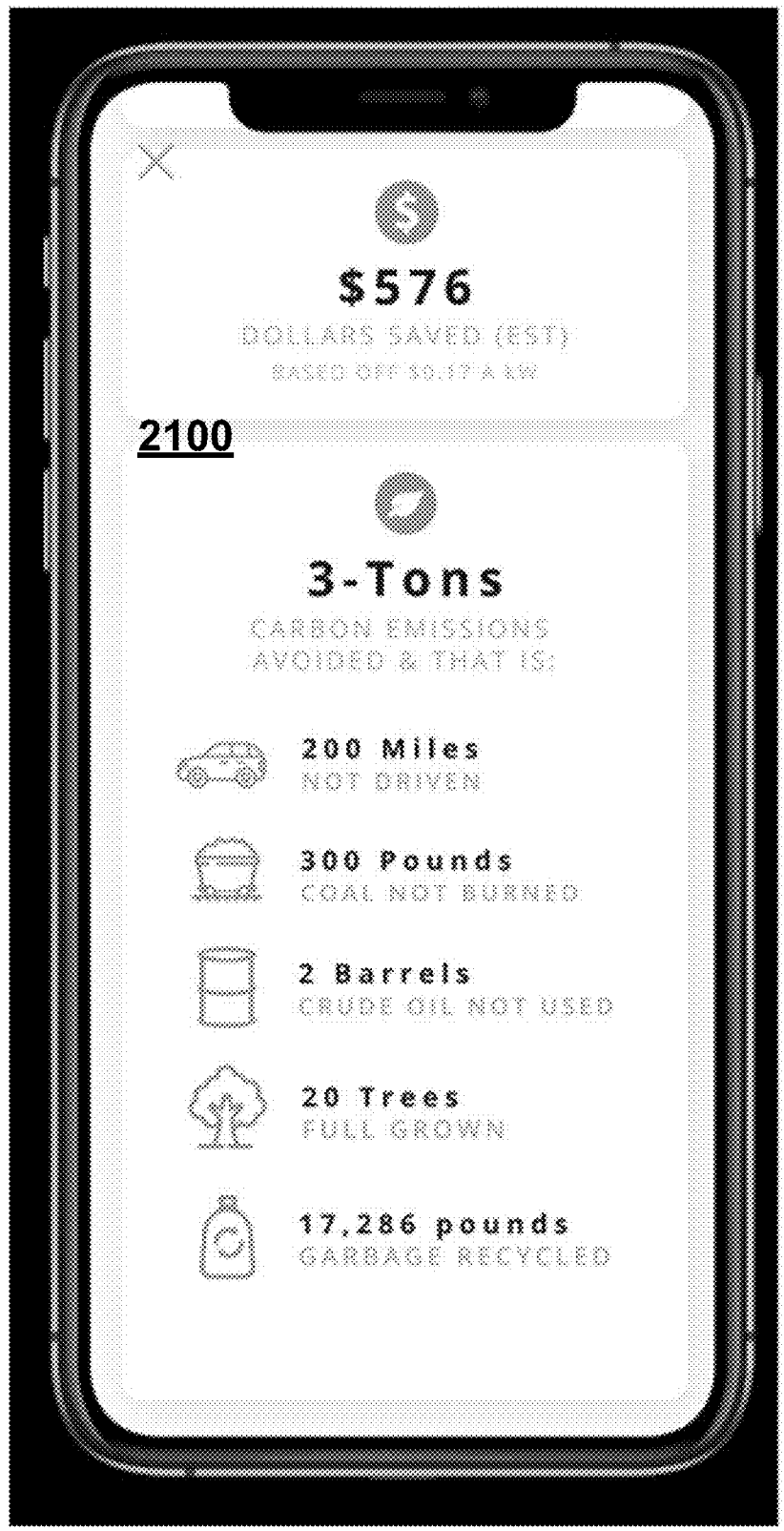

FIGS. 21A and 21B illustrate an exemplary lifetime totals page 2100 implemented in the software application displayed on the remote device 110 according to one or more aspects of the disclosed subject matter. For example, the information illustrated on the lifetime totals page 2100 in FIGS. 21A and 21B can be accessed by scrolling. The lifetime totals page 2100 can indicate total solar production (e.g., kWh), total solar energy sent to the grid (e.g., in kWh), approximate savings, and approximate carbon offset.

Figure 22:
FIG. 22 illustrates an exemplary analysis page implemented in the software application displayed on the remote device according to one or more aspects of the disclosed subject matter.

FIG. 22 illustrates an exemplary analysis page 2200 implemented in the software application displayed on the remote device 110 according to one or more aspects of the disclosed subject matter. For example, the analysis page 2200 can indicate an energy mix summary for the month. The analysis page 2200 can also indicate an energy mix icon for each day of the month and a month over month comparison.

Figure 23:
FIG. 23 illustrates an exemplary analysis page implemented in the software application displayed on the remote device according to one or more aspects of the disclosed subject matter.

FIG. 23 illustrates an exemplary analysis page 2300 implemented in the software application displayed on the remote device 110 according to one or more aspects of the disclosed subject matter. For example, the analysis page 2200 can indicate an energy mix summary for the year. The analysis page 2300 can also indicate an energy mix icon for each month of the year and a year over year comparison.

Figure 24A:
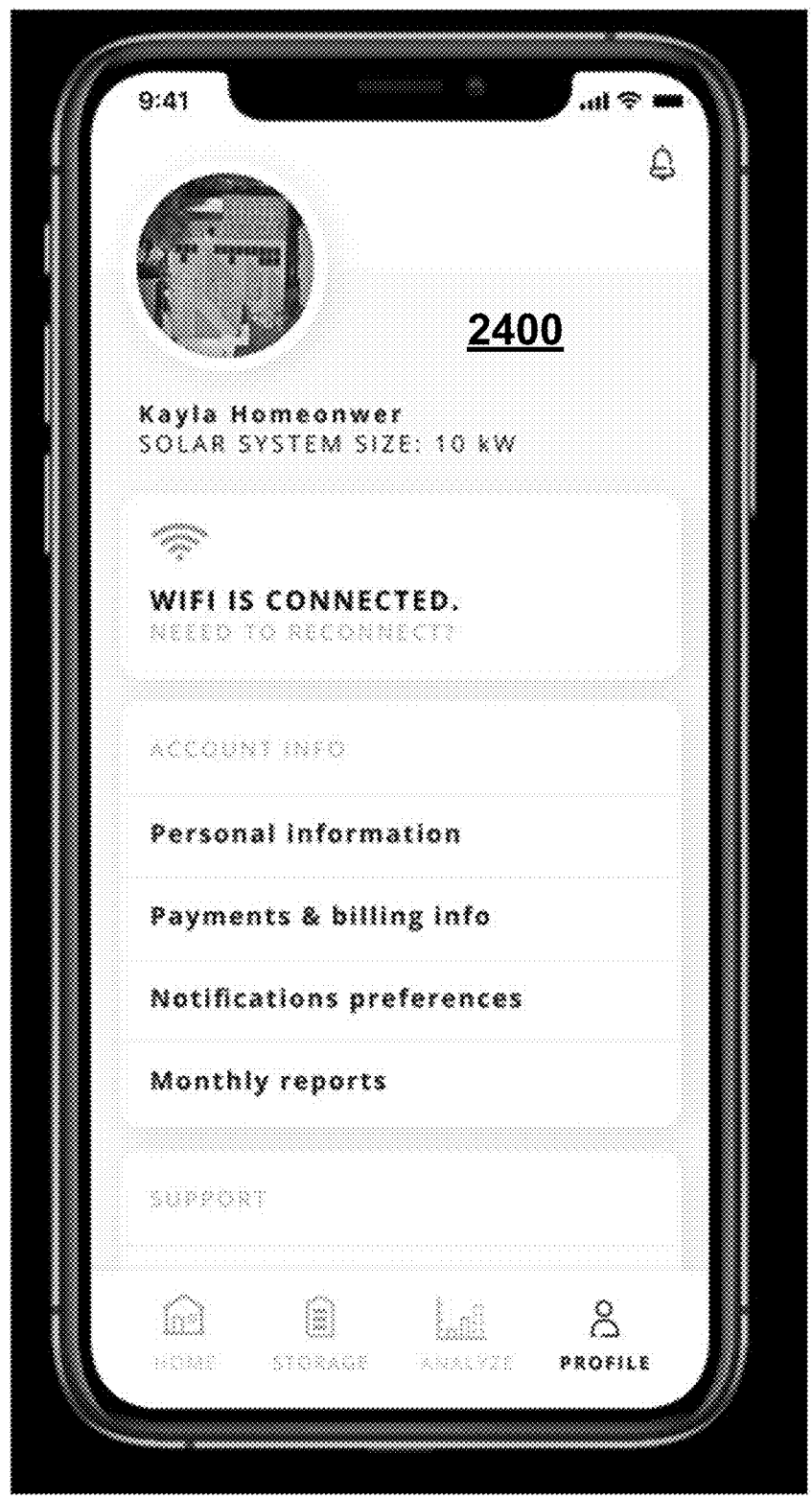
FIGS. 24A and 24B illustrate an exemplary profile and settings page implemented in the software application displayed on the remote device according to one or more aspects of the disclosed subject matter.
Figure 24B:
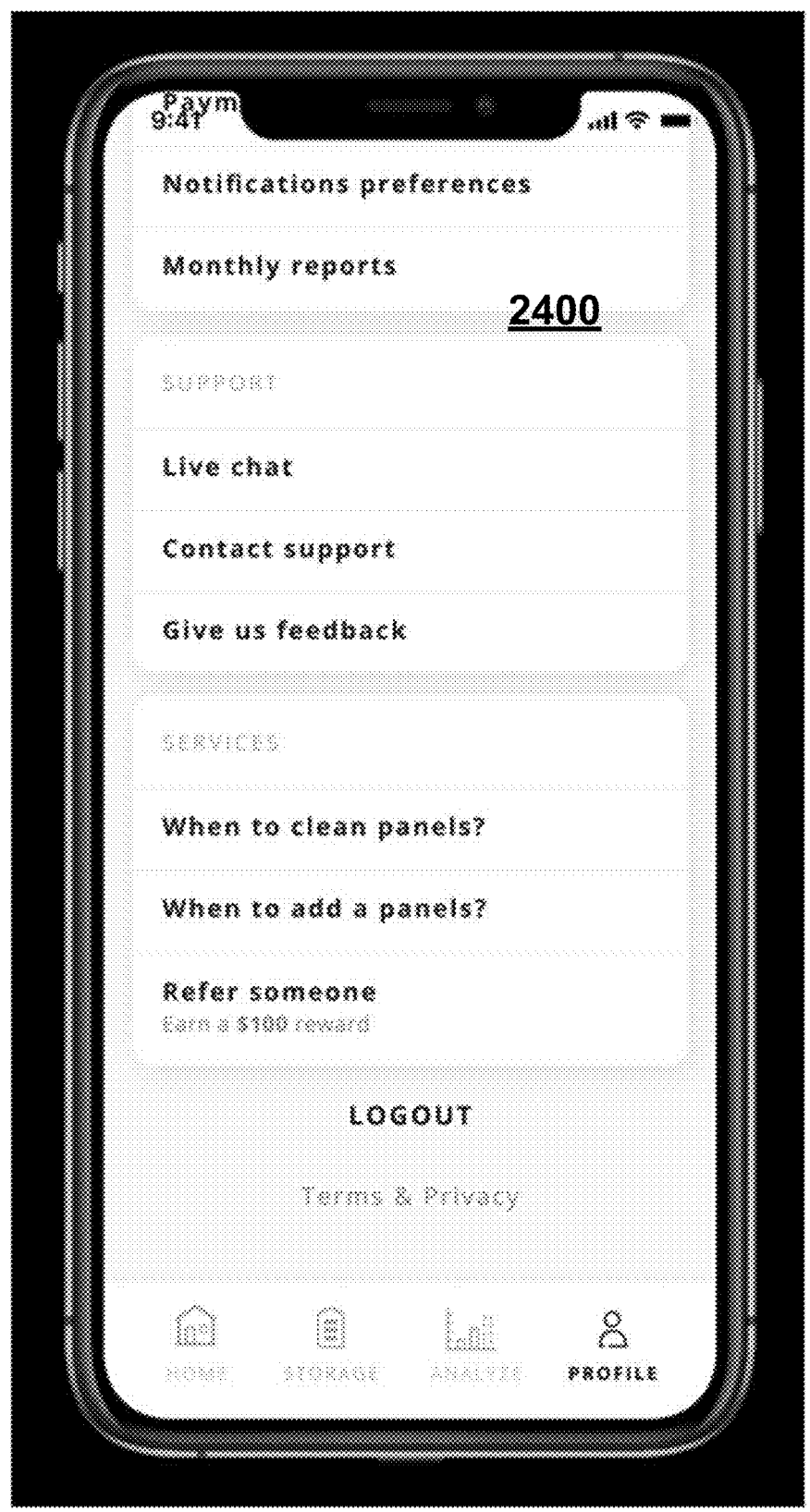

FIGS. 24A and 24B illustrate an exemplary profile and settings page 2400 implemented in the software application displayed on the remote device 110 according to one or more aspects of the disclosed subject matter. For example, the information illustrated on the profile and settings page 2400 in FIGS. 24A and 24B can be accessed by scrolling. The profile and settings page 2400 can indicate a satellite image of the user's building (e.g., the homeowner's home), a size of the solar panel system (e.g., 10 kW), Wi-Fi status and controls, account information, support features, services, a logout button, terms and privacy content, and the like.

Figure 25:
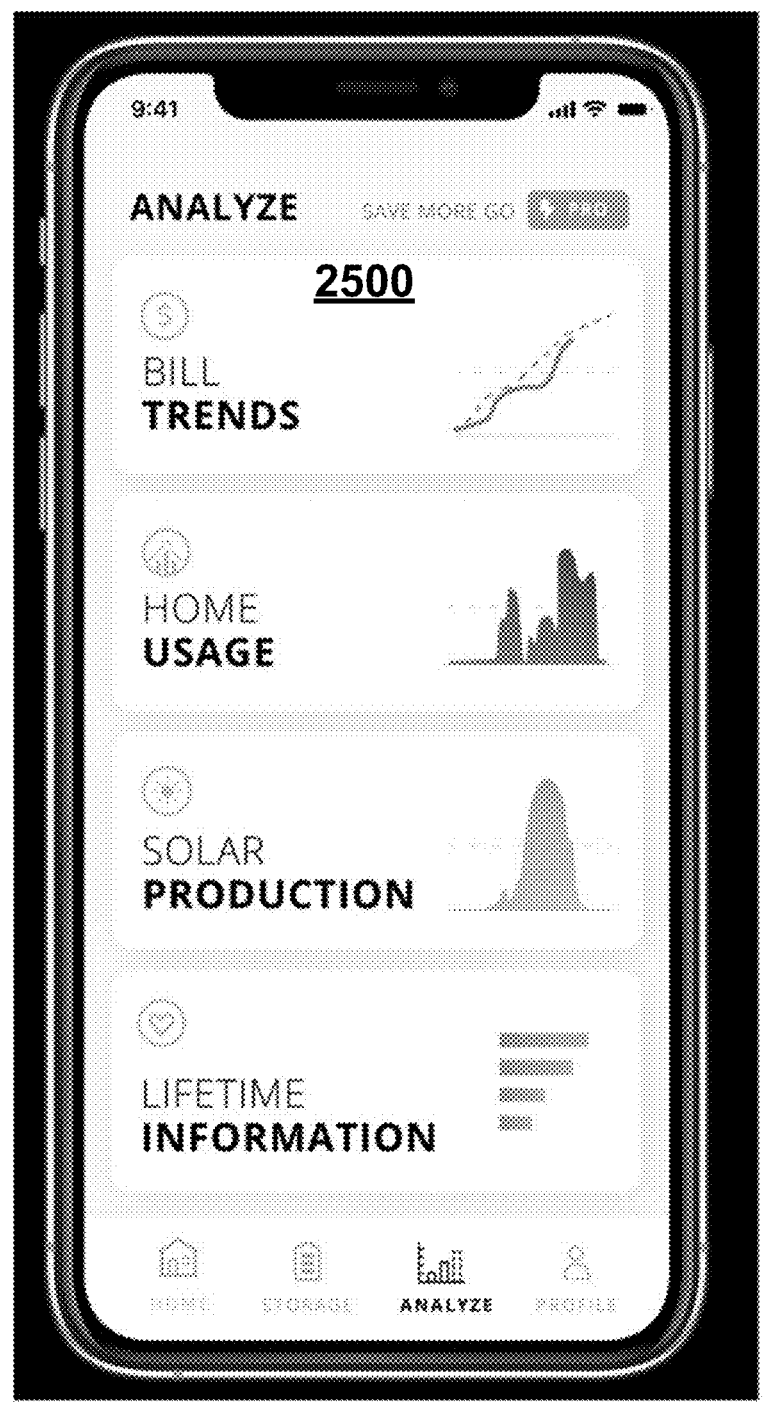
FIG. 25 illustrates an exemplary analysis page implemented in the software application displayed on the remote device according to one or more aspects of the disclosed subject matter.

FIG. 25 illustrates an exemplary analysis page 2500 implemented in the software application displayed on the remote device 110 according to one or more aspects of the disclosed subject matter. For example, the analysis page 2500 can allow a user to navigate to another analysis page for bill trends, home usage, solar production, or lifetime information.

Figure 26:
FIG. 26 illustrates an exemplary bill trends analysis page in the software application displayed on the remote device according to one or more aspects of the disclosed subject matter.

FIG. 26 illustrates an exemplary bill trends analysis page 2600 in the software application displayed on the remote device 110 according to one or more aspects of the disclosed subject matter. For example, the bill trends analysis page 2600 can include information about the energy the home used, the solar energy produced, days in a bill cycle, past bills over time, and the like.

Figure 27:
FIG. 27 illustrates an exemplary home usage analysis page implemented in the software application displayed on the remote device according to one or more aspects of the disclosed subject matter.

FIG. 27 illustrates an exemplary home usage analysis page 2700 implemented in the software application displayed on the remote device 110 according to one or more aspects of the disclosed subject matter. For example, the home usage analysis page 2700 can display home usage for different times periods including a full week, just Monday-Friday, just the weekend, and the like.

Figure 28:
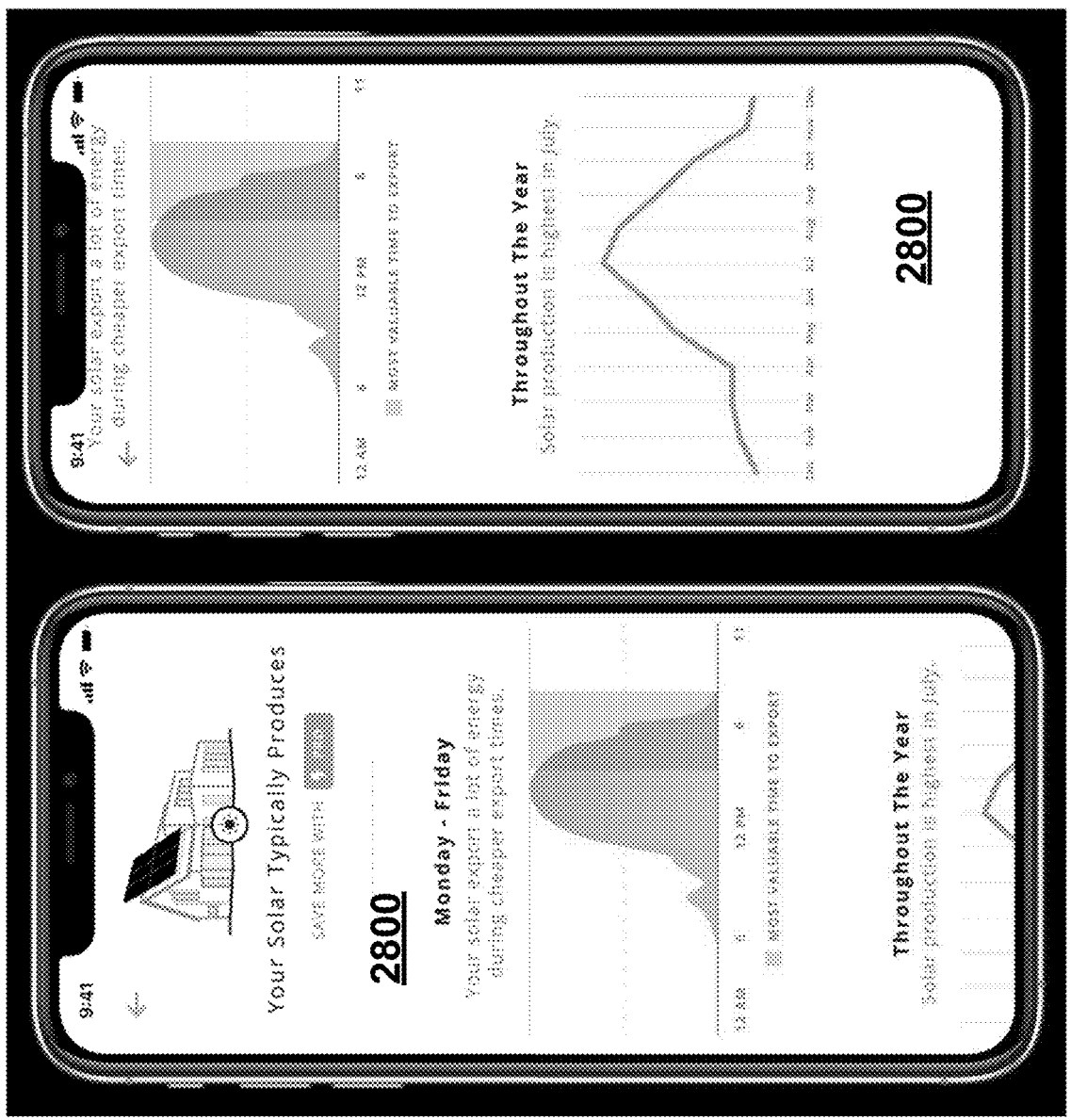
FIG. 28 illustrates an exemplary solar analysis page implemented in the software application displayed on the remote device according to one or more aspects of the disclosed subject matter.

FIG. 28 illustrates an exemplary solar analysis page 2800 implemented in the software application displayed on the remote device 110 according to one or more aspects of the disclosed subject matter. For example, the solar analysis page 2800 can display solar production for different time periods including Monday through Friday, throughout the year, and the like.

Figure 29:
FIG. 29 illustrates an exemplary lifetime analysis page implemented in the software application displayed on the remote device according to one or more aspects of the disclosed subject matter.

FIG. 29 illustrates an exemplary lifetime analysis page 2900 implemented in the software application displayed on the remote device 110 according to one or more aspects of the disclosed subject matter. For example, the lifetime analysis page 2900 can display bill savings, how self sufficient the energy system is, how the renewable energy is having a positive impact (e.g., number of cars off the road, number of trees planted, number of barrels of oil not used, etc.), and the like.

Figure 30:
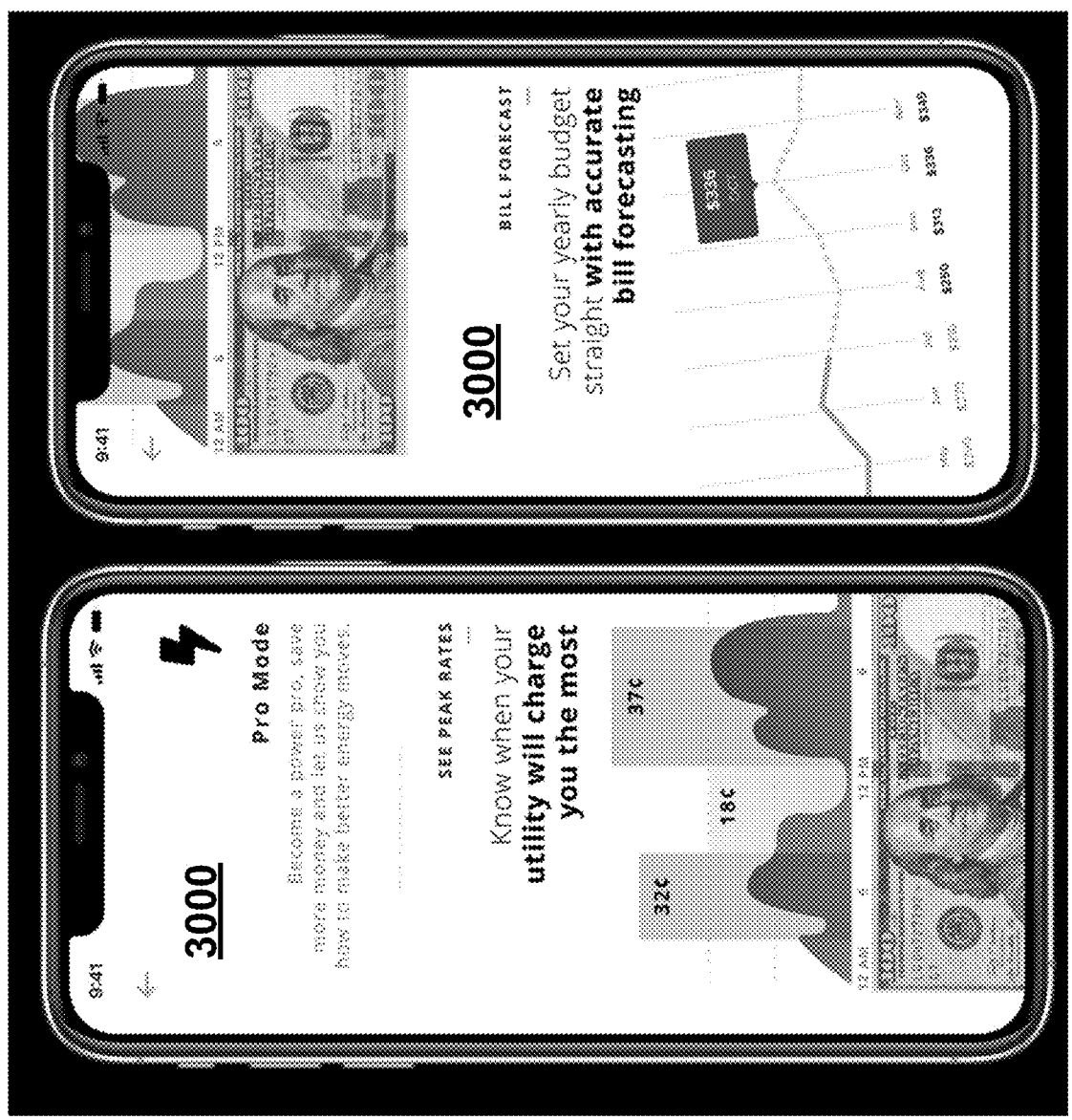
FIG. 30 illustrates an exemplary pro mode page implemented in the software application displayed on the remote device according to one or more aspects of the disclosed subject matter.

FIG. 30 illustrates an exemplary pro mode page 3000 implemented in the software application displayed on the remote device 110 according to one or more aspects of the disclosed subject matter. For example, the pro mode page 3000 can display marking for a pro mode of the software application.

Figure 31:
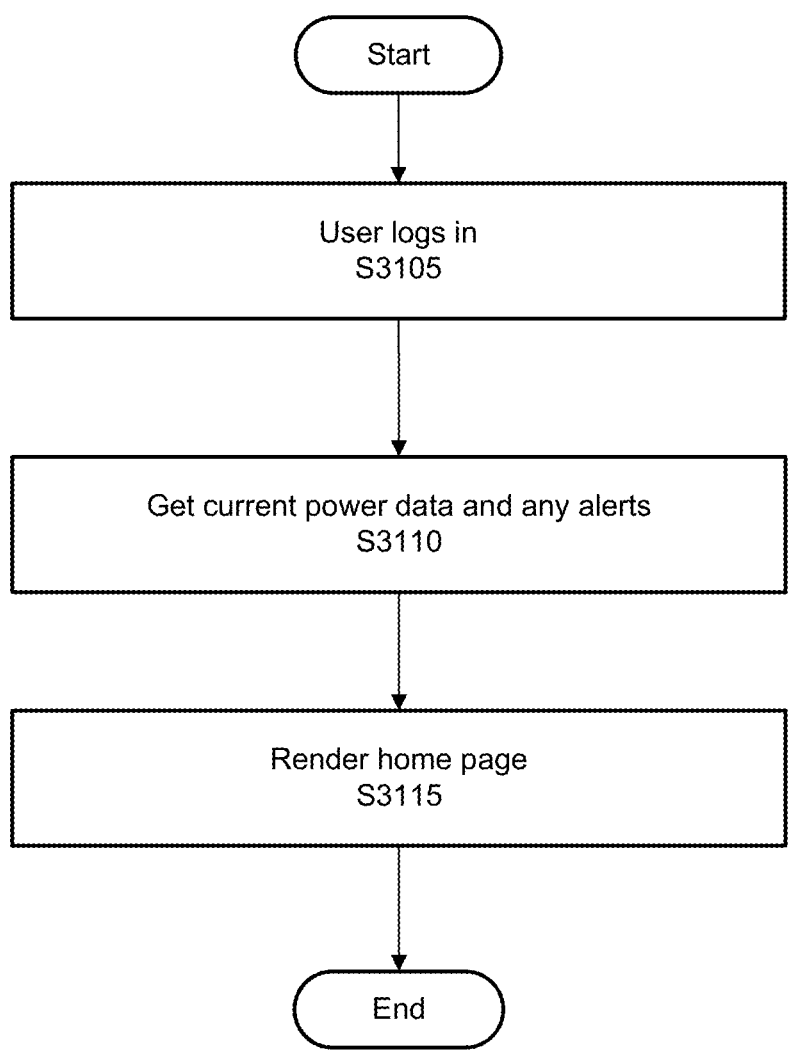
FIG. 31 is an algorithmic flow chart of method for rendering a home page according to one or more aspects of the disclosed subject matter.

FIG. 31 is an algorithmic flow chart of method for rendering a home page (e.g., the home screen 200, 300, 400, 500, 600, 700, 800, 900, 1000, 1100, 1200, 1300, 1400, and/or 1500) according to one or more aspects of the disclosed subject matter.

In S3105, the system 100 can receive user credentials and, if verified, a user can log in. For example, the credentials can be entered on a user interface displayed by the remote device 110 and verified via the server 115.

In S3110, current power data, any alerts, and the like can be retrieved for the user that logged in.

In S3115, the system 100 can render the homepage. After rendering the home page, the process can end.

Figure 32:
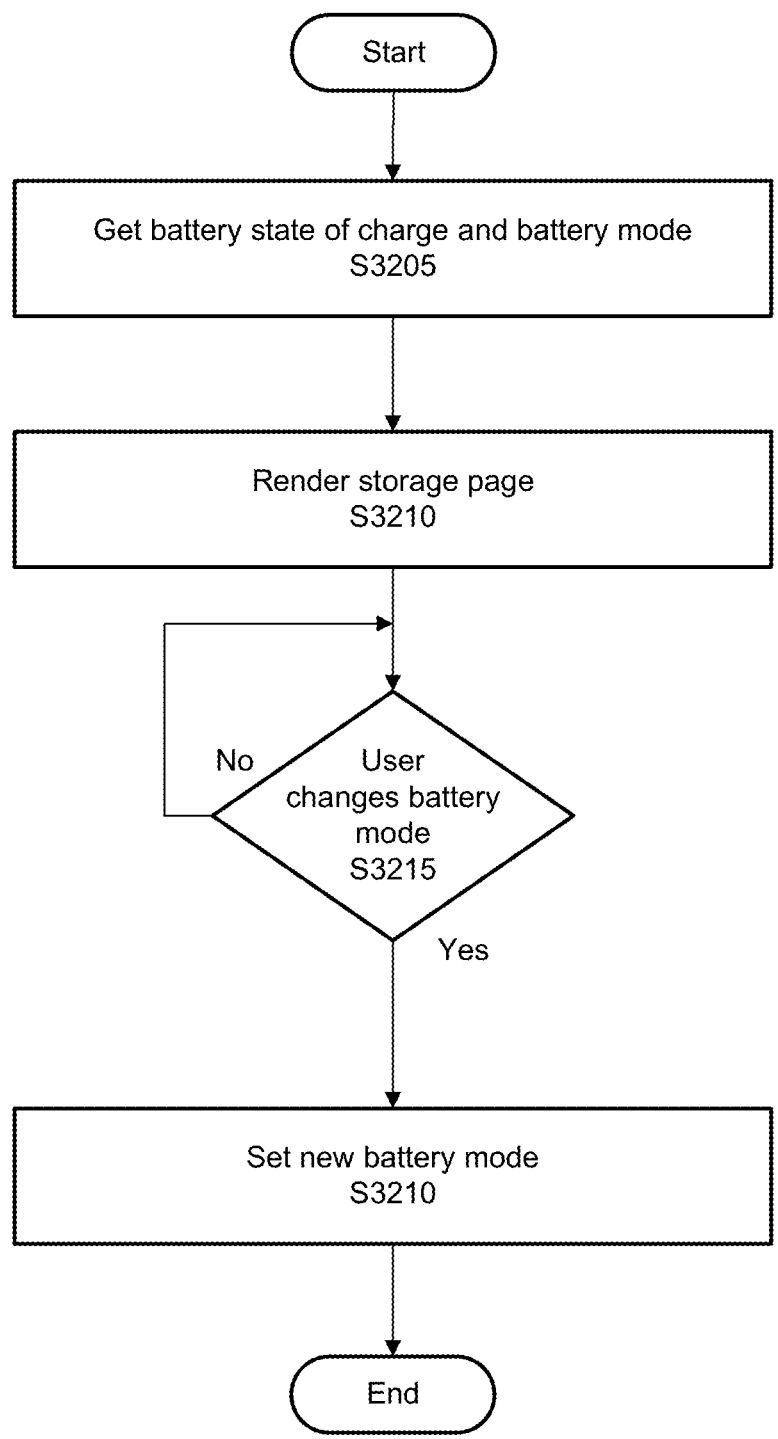
FIG. 32 is an algorithmic flow chart of a method for setting a battery mode according to one or more aspects of the disclosed subject matter.

FIG. 32 is an algorithmic flow chart of a method for setting a battery mode according to one or more aspects of the disclosed subject matter.

In S3205, a battery state of charge and battery mode can be requested/received.

In S3210, a storage page (e.g., storage page 1600, 1700, and/or 1800) can be rendered.

In S3215, it can be determined whether a user changes a battery mode (e.g., via battery mode settings page 1900). If it is determined that the user did not change the battery mode, the process can continue checking to see if the user changed the battery mode, for example. However, if it is determined that the user changed the battery mode, the process can continue to S3220.

In S3220, a new battery mode can be set based on the user's selection. After setting the new battery mode, the process can end.

Figure 33:
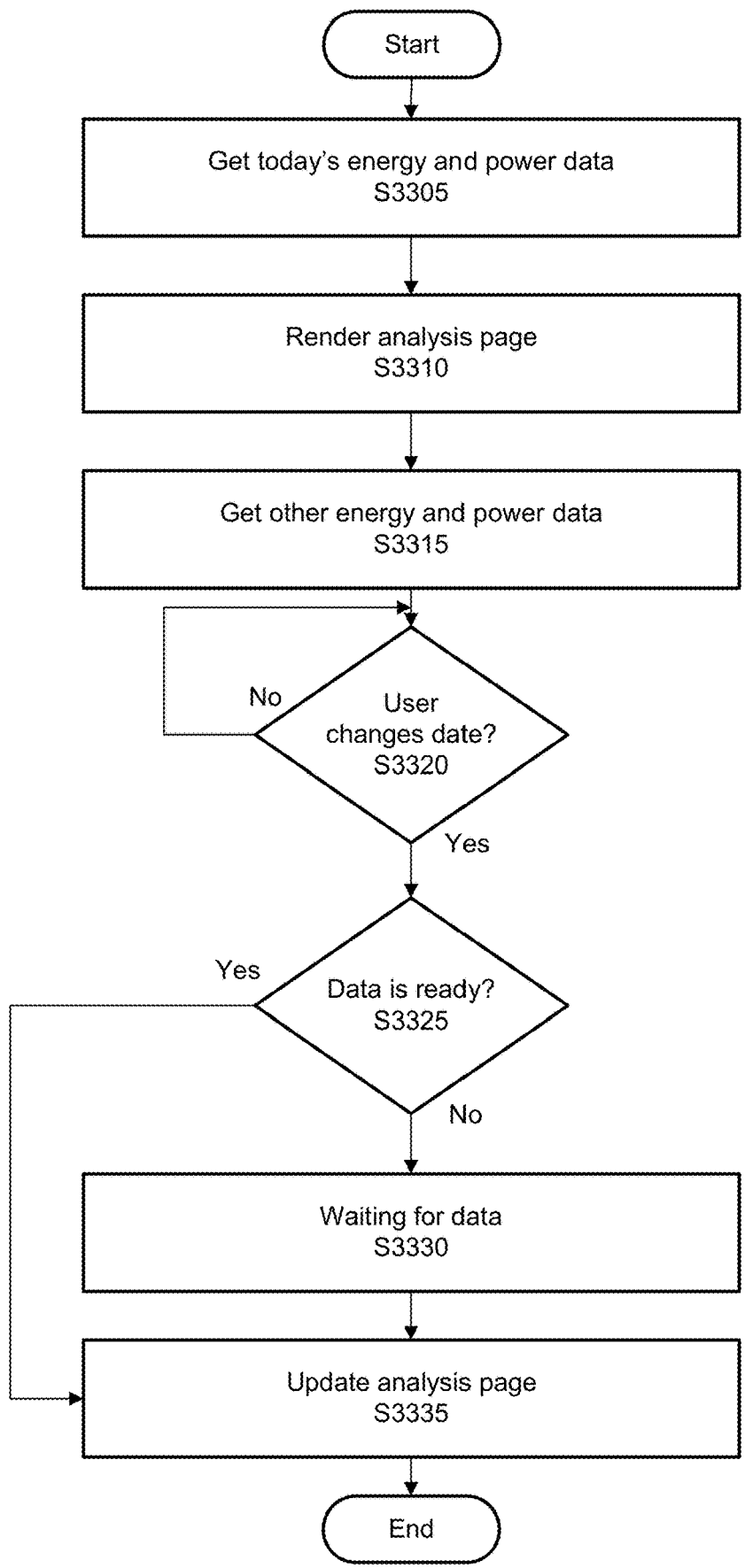
FIG. 33 is an algorithmic flow chart of method for rendering an analysis page according to one or more aspects of the disclosed subject matter.

FIG. 33 is an algorithmic flow chart of a method for rendering an analysis page (e.g., analysis page 2000, 2100, 2200, 2300, 2500, 2600, 2700, 2800, and/or 2900) according to one or more aspects of the disclosed subject matter.

In S3305, the day's current energy and power data can be received.

In S3310, an analysis page can be rendered based on the energy and power data acquired in S3305.

In S3315, other energy and power data can be acquired.

In S3320, it can be determined if a user changes the date. For example, the user can select a day, week, month, year, or lifetime view. Additionally, the user can select a custom date range. If it is determined that the user did not change the date, the process can continue checking whether or not the user changed the date. However, if it is determined that the user did change the date, it can be determined if data corresponding to the updated date select is ready in S3325.

In S3325, it can be determined if the data corresponding to the updated date select is ready. If the data is ready, the data can be updated in S3335. However, if the data is not ready, the system 100 can wait for the data in S3330, and after the data is received the analysis page can be updated in S3335. After updating the analysis page in S3335, the process can end.

Figure 34:
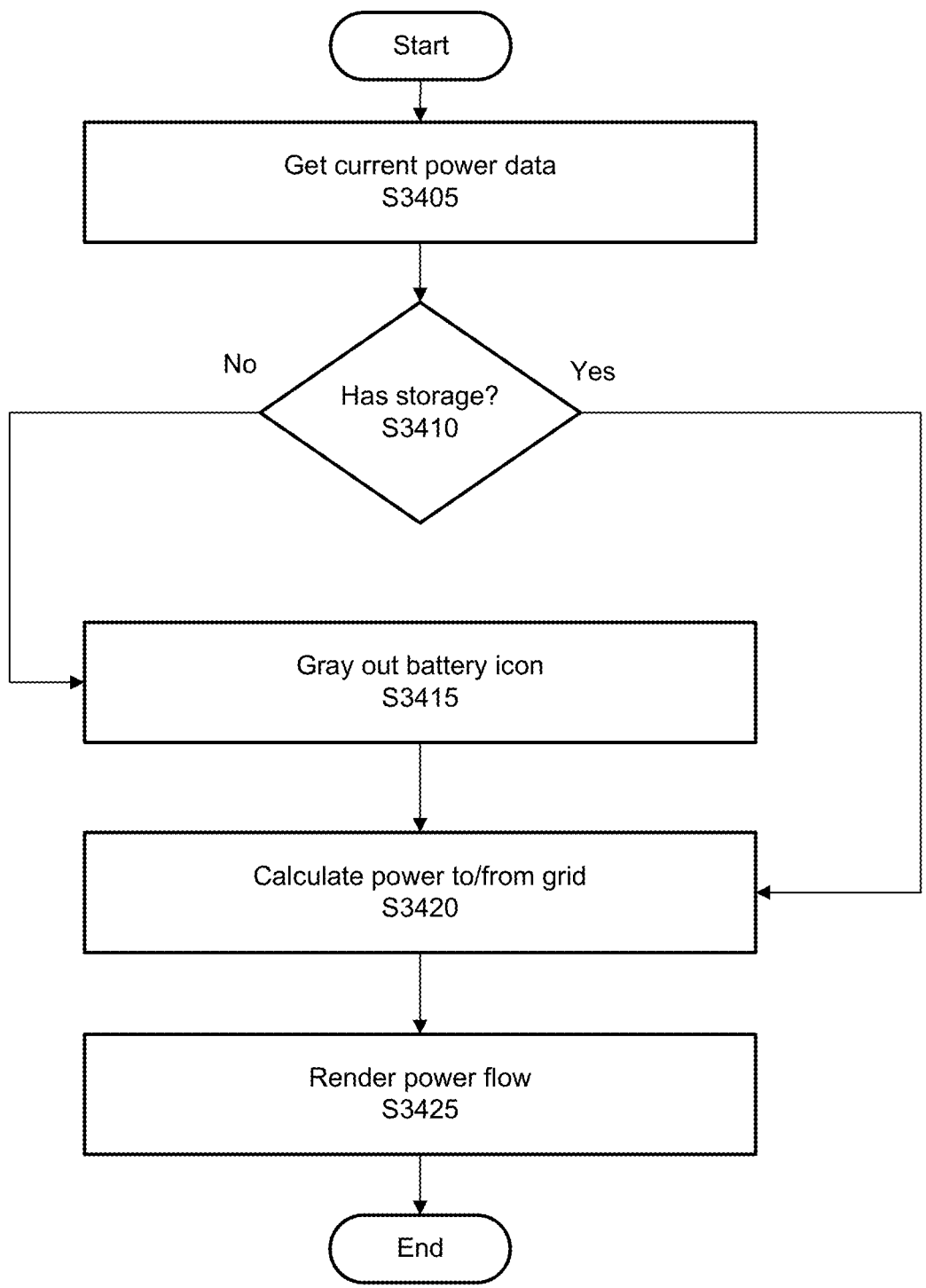
FIG. 34 is an algorithmic flow chart of method for rendering a power flow according to one or more aspects of the disclosed subject matter.

FIG. 34 is an algorithmic flow chart of method for rendering a power flow (e.g., power flow illustrated as part of home page 200, 300, 400, 500, 600, 700, 800, 900, 1000, 1100, 1200, 1300, 1400, and/or 1500) according to one or more aspects of the disclosed subject matter.

In S3405, current power data can be received and/or acquired.

In S3410, it can be determined if the battery has storage. If it is determined that the battery does not have storage, the batter icon can be grayed out in S3415. After the battery icon is grayed out in S3415, the process can continue to calculate power to/from the grid in S3420. However, it is determined that the batter does have storage in S3410, the power to/from the grid can be calculated in S3420.

In S3425, a power flow can be rendered based on the calculation of power to/from the grid in S3420 and battery storage information determined in S3410 (i.e., power flow to/from the battery), for example. After rendering the power flow, the process can end.

Figure 35:
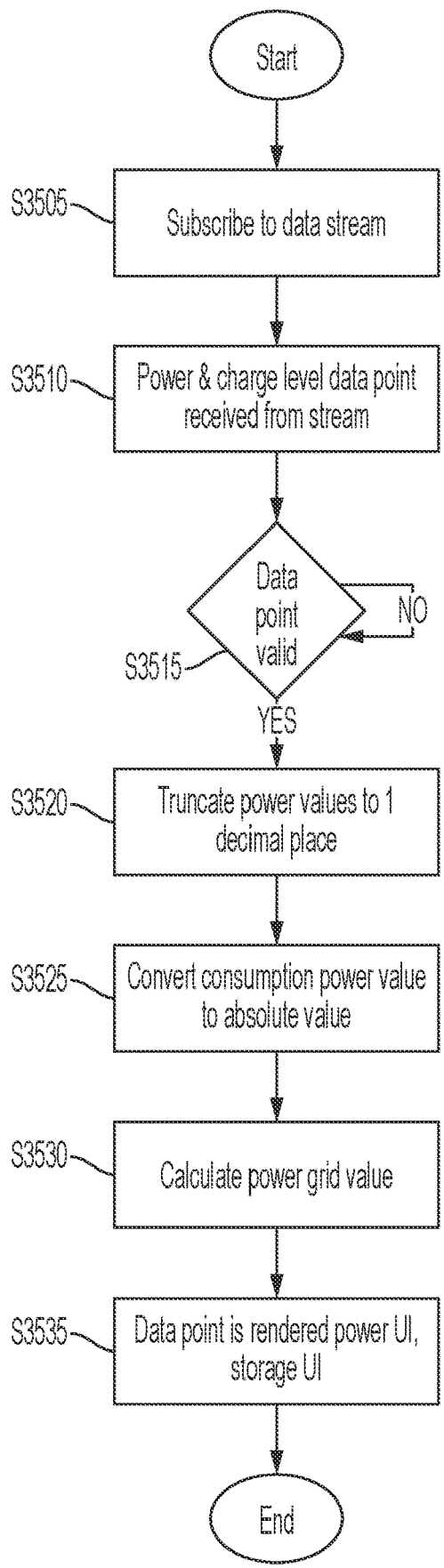
FIG. 35 is an algorithmic flow chart of a method for calculating live data power flow according to one or more aspects of the disclosed subject matter.

FIG. 35 is an algorithmic flow chart of a method for calculating live data power flow according to one or more aspects of the disclosed subject matter. Generally, when the PVS is reporting through a wi-fi connection or when a storage user (i.e., a user that has an energy storage system with their PV system) is experiencing a power outage, the software application can automatically acquire the power data live from the PVS as described in S3050-S3525.

In S3505, the server 115 can subscribe to a data stream. The data stream can be live (e.g., real time) power data from the PVS.

In S3510, the server 115 can automatically receive a power data point and a charge level data point from the data stream.

In S3515, the server 115 can determine whether the data point is valid. In one aspect, a data point is valid if for some timestamp, all meters of the site have reported a power value that has less than 100 missing points in the time interval for which the data is reported. In response to a determination that the data point is not valid, the process can repeat S3515 to continue attempting to determine if the data point is valid. However, in response to a determination that the data point is valid, power values can be truncated in S3520.

In S3520, the server 115 can truncate power values to one decimal place. For example, the power values can correspond to the values for the power data point and the charge level data point.

In S3525, the server 115 can convert a consumption power value to an absolute value. For example, the consumption power value can correspond to the consumption of the structure to which the PV system is connected (e.g., a home).

In S3530, the server 115 can calculate a power grid value.

In S3535, the server 115 can render the power user interface and the storage user interface based on the data point. After rendering the power user interface and the storage user interface based on the data point, the process can end.

Figure 36:
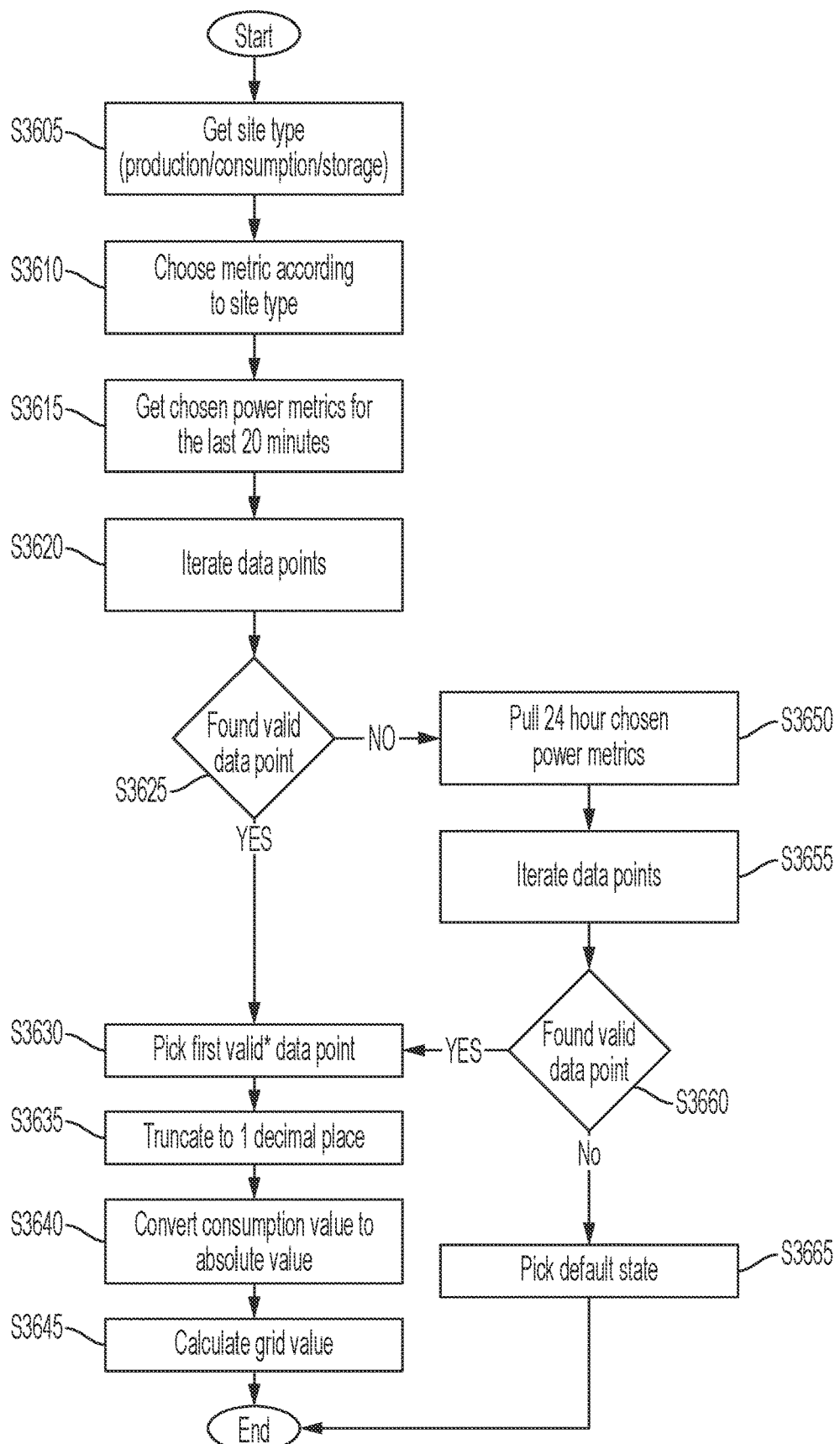
FIG. 36 is an algorithmic flow chart of a method for loading a current power flow in the software application displayed via the remote device according to one or more aspects of the disclosed subject matter.

FIG. 36 is an algorithmic flow chart of a method for loading a current power flow in the software application displayed via the remote device 110 according to one or more aspects of the disclosed subject matter.

In S3605, the server 115 can acquire a site type. For example, the server 115 can request a site type, receive a site type (e.g., via the remote device 110), and/or access the site type from known information. In one aspect, the site type can include one or more of production, consumption, and storage capability. Generally, when the software application is launched, the site type the customer has needs to be determined (e.g., PV only, PV and consumption, storage). For example, the site type can be determined based on what meters are returned in the device tree of the site. For example, if the site has a storage meter that is installed and active, then the site is a storage site (i.e., the site includes an energy storage system).

In S3610, the server 115 can select metrics based on the site type determined in S3605. For example, when the site type is PV only, data regarding the power of the battery does not need to be obtained.

In S3615, the server 115 can acquire selected metrics (e.g., power metrics) for a predetermined amount of time (e.g., for the last 20 minutes).

In S3620, the server 115 can iterate through data points acquired from the predetermined amount of time in S3615. For example, the server 115 can go through the data from the most recent twenty minutes to find a valid data point (e.g., some times the data will be missing a specific metric like the power from the battery so those data points can be ignored). When a valid data point within the most recent twenty minutes can not be found, the server 115 can look for a valid data point in a longer amount of time (e.g., 24 hours) as described in S3650.

In S3625, the server 115 can determined whether a valid data point is found after iterating through the data points in S3620. In one aspect, a data point is valid if for some timestamp, all meters of the site have reported a power value that has less than 100 missing points in the time interval for which the data is reported. In response to a determination that a valid data point is found, a first valid data point can be selected in S3630.

In S3630, the server 115 can select the first valid data point (e.g., the first valid data point being the earliest in time).

In S3635, the server 115 can truncate a value of the selected first data point to one decimal place.

In S3640, the server 115 can convert a consumption value to an absolute value.

In S3645, the server 115 can calculate a grid value. After calculating the grid value in S3645, the process can end.

Referring again to S3625, in response to a determination that no valid data point is found, the chosen power metrics can be pulled for the previous 24 hours in S3650.

In S3650, the server 115 can pull the chosen power metrics for the previous 24 hours.

In S3655, the server 115 can iterate through the data points pulled in S3650.

In S3660, the server 115 can determine whether a valid data point is found. In response to a determination that a valid data point is found, the first valid data point can be selected in S3630. However, in response to a determination that a valid data point is not found in S3660, the server 115 can select a default power flow state in S3665. In other words, if a valid data point cannot be found in the last 24 hours and there is not alert triggered for the site, the server 115 can display the power flow based on the last data point even if it was invalid (e.g., if the last invalid data point was missing a power production value, that can be defaulted to 0 in this scenario and the power flow can be rendered based on those values). After selecting the default state in S3665, the process can end.

Figure 37:
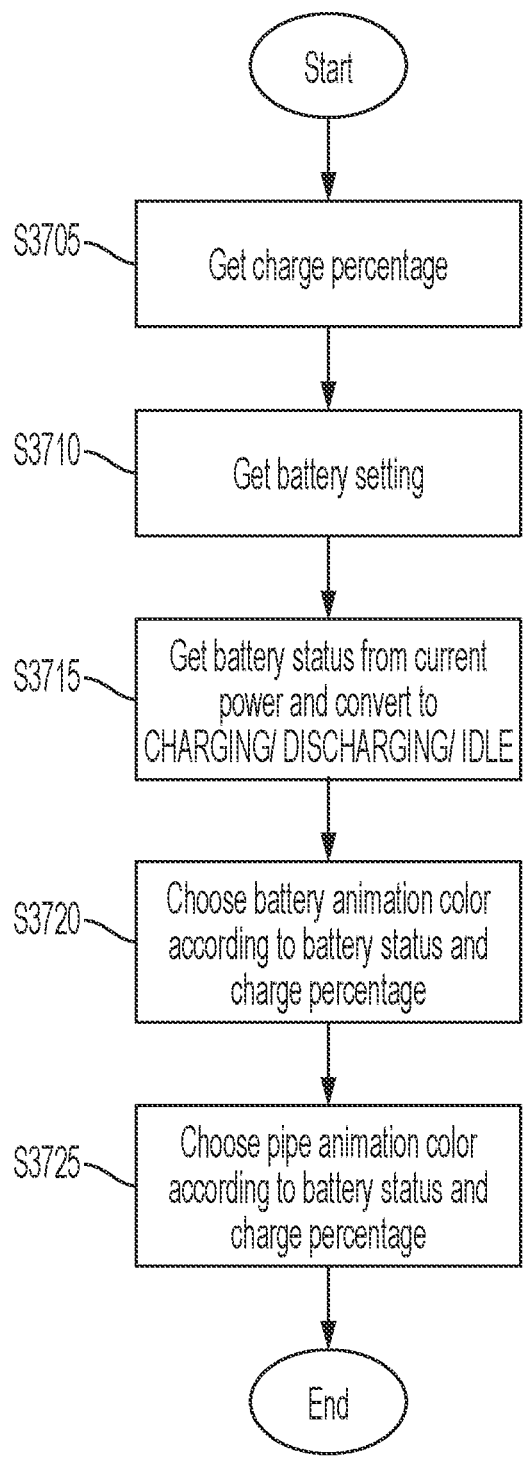
FIG. 37 is an algorithmic flow chart of a method for loading a storage state page in the software application displayed via the remote device according to one or more aspects of the disclosed subject matter.

FIG. 37 is an algorithmic flow chart of a method for loading a storage state page in the software application displayed via the remote device 110 according to one or more aspects of the disclosed subject matter.

In S3705, the server 115 can acquire a charge percent of a storage system (e.g., battery). For example, the battery charge percent is acquired to determine how much of the battery will appear to be "filled," where the amount the battery graphic appears to be filled corresponds to the amount the battery is charged. For example, if the battery graphic shows that the battery is full, the battery is 100% charged.

In S3710, the server 115 can acquire a battery setting of the battery. For example, the battery setting can be an operational mode including outage mode, a cost savings mode, and a self-supply mode (e.g., see FIG. 19A).

In S3715, the server 115 can get a battery status from a current power and convert the battery status to one or more of charging, discharging, and idle. For example, based on the sign on the most recently reported battery power value, it can be determined if the battery is powering the home, charging, or idle.

In S3720, the server 115 can choose a battery animation color according to the battery status from S3715 and the charge percentage from S3705. For example, the battery animation can correspond to the battery displayed in a system state page (e.g., system state page 1300) or a storage state page (e.g., the storage stage page 1600) showing the amount of charge in the battery.

In S3725, the server 115 can choose a pipe animation color according to the battery status from S3715 and the charge percentage from S3705. For example, the pipe animation can correspond to an arrow in the system state page (e.g., system state page 1300) or a storage state page (e.g., the storage stage page 1600) showing a direction of the energy stored in the battery. In one aspect, the pipe animation color can match the battery animation color and the direction of the arrow can correspond to whether the charge level of the battery is increasing or decreasing. After choosing the pipe animation color, the process can end.

Figure 38:
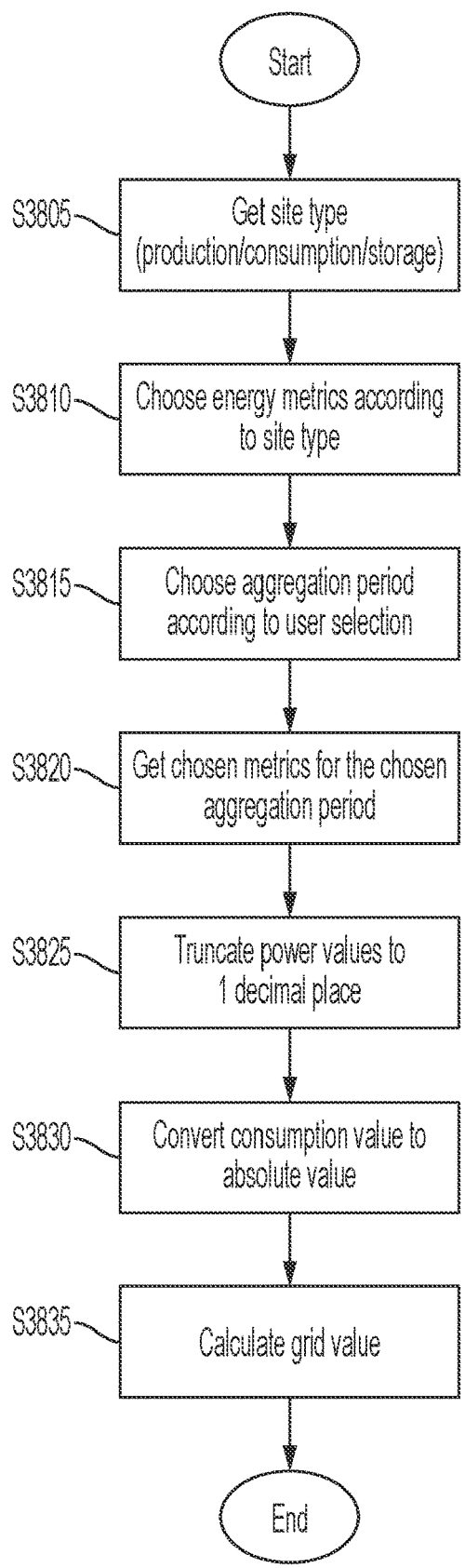
FIG. 38 is an algorithmic flow chart of a method for loading any aggregation state with power flow in the software application displayed via the remote device according to one or more aspects of the disclosed subject matter.

FIG. 38 is an algorithmic flow chart of a method for loading any aggregation state with power flow in the software application displayed via the remote device 110 according to one or more aspects of the disclosed subject matter.

In S3805, the server 115 can acquire a site type. For example, the server 115 can request a site type, receive a site type (e.g., via the remote device 110), and/or access the site type from known information. In one aspect, the site type can include one or more of production, consumption, and storage.

In S3810, the server 115 can select an energy metric based on the site type determined in S3805.

In S3815, the server 115 can select an aggregation period based on a user selection. For example, the user can select whether they want to see today, this week, this month, this year, etc. (e.g., see FIG. 44).

In S3820, the server 115 can acquire the energy metrics selected in S3810 for the aggregation period selected in S3815.

In S3825, the server 115 can truncate power values to one decimal place. For example, the power values can correspond to the power (e.g., kWh) generated by the PV panels, the power grid, and/or the battery.

In S3830, the server 115 can convert a consumption value to an absolute value. In other words, the consumption value can be displayed as a positive number.

In S3835, the server 115 can calculate a grid value. For example, the grid value corresponds to the power received from the power grid. After calculating the grid value, the process can end.

Figure 39:
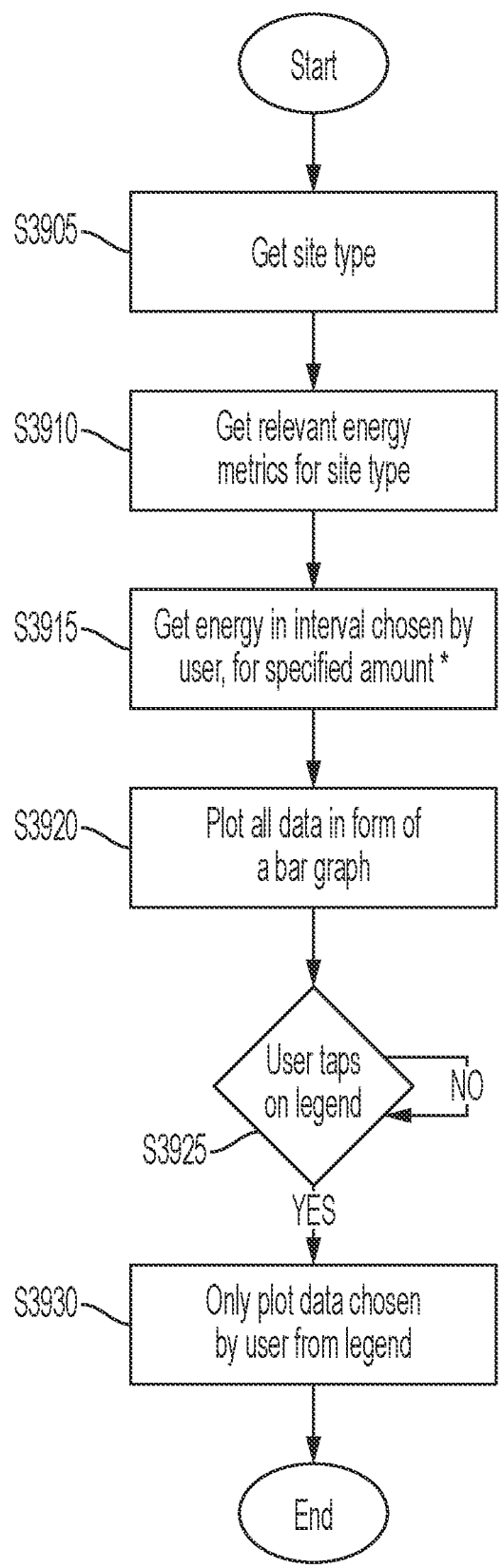
FIG. 39 is an algorithmic flow chart of a method for loading an analyze tab configured to display an analysis page in the software application displayed via the remote device according to one or more aspects of the disclosed subject matter.

FIG. 39 is an algorithmic flow chart of a method for loading an analyze tab configured to display an analysis page (e.g., analysis page 2000 in FIG. 20A and/or one or more pages from 59A-61) in the software application displayed via the remote device 110 according to one or more aspects of the disclosed subject matter.

In S3905, the server 115 can acquire a site type. For example, the server 115 can request a site type, receive a site type (e.g., via the remote device 110), and/or access the site type from known information. In one aspect, the site type can include one or more of production, consumption, and storage capability.

In S3910, the server 115 can get relevant energy metrics for the site type acquired in S3905.

In S3915, the server 115 can acquire energy in an interval chosen by a user. For example, the intervals include day, week, month, and year. The day interval can correspond to 1-hour intervals since the start of the day. The week interval can correspond to 1-day intervals since the start of the week. The month interval can correspond to 1-week intervals since the start of the month. The year interval can correspond to 1-month intervals since the start of the year.

In S3920, the server 115 can plot the data in a graph. In one aspect, the graph can be a bar graph.

In S3925, the server 115 can determine whether the user makes a selection. For example, the server 115 can determine whether the user selects a specific time frame by interacting with the display of the remote device 110. In response to a determination that the user does not make any further selections, the process can continue to check for further user selection in S3925. However, in response to a determination that the user does make a further selection, the data plotted in the graph can correspond to only the data selected by the user (e.g., corresponding to the specific time interval selected).

In S3930, the server 115 can plot the graph to include only the data selected by the user in S3925. After plotting only the data selected by the user, the process can end.

In the above description of FIGS. 31-39, any processes, descriptions or blocks in flowcharts can be understood as representing modules, segments or portions of code which include one or more executable instructions for implementing specific logical functions or steps in the process, and alternate implementations are included within the scope of the exemplary embodiments of the present advancements in which functions can be executed out of order from that shown or discussed, including substantially concurrently or in reverse order, depending upon the functionality involved, as would be understood by those skilled in the art. The various elements, features, and processes described herein may be used independently of one another or may be combined in various ways. All possible combinations and sub-combinations are intended to fall within the scope of this disclosure.

In one aspect, one embodiment of the software application user interface can correspond to FIGS. 40-65B. However, any of the processes already described herein related to the system for monitoring a solar installation can also apply to FIGS. 40-65B unless otherwise specified. Additionally, the user interface described in the embodiment relating to FIGS. 40-65B can also include additional features as further described herein. In other words, one or more of the user interfaces described in FIGS. 40-65B can replace one or more of the user interfaces described in FIGS. 2A-30. However, it should be appreciated that any of the additional features described in FIGS. 40-65B could also be configured to be implemented in the user interface described in FIGS. 2A-30.

Figure 40:
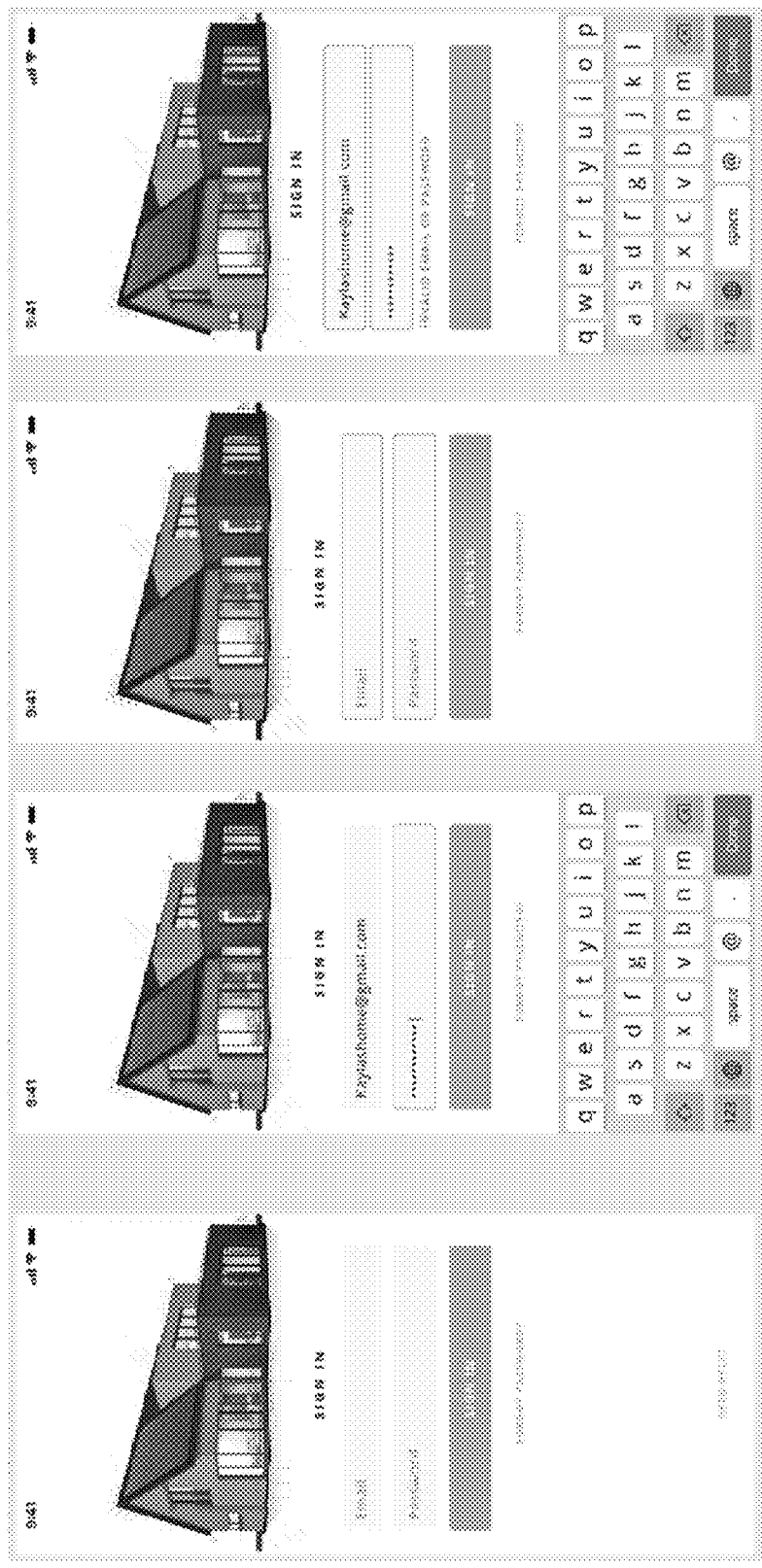
FIG. 40 illustrates an exemplary series of login screens implemented in the software application displayed on the remote device according to one or more aspects of the disclosed subject matter.

FIG. 40 illustrates an exemplary series of login screens implemented in the software application displayed on the remote device 110 according to one or more aspects of the disclosed subject matter. For example, the user can be prompted to login. If the login attempt is unsuccessful, a login error can be displayed.

Figure 41:
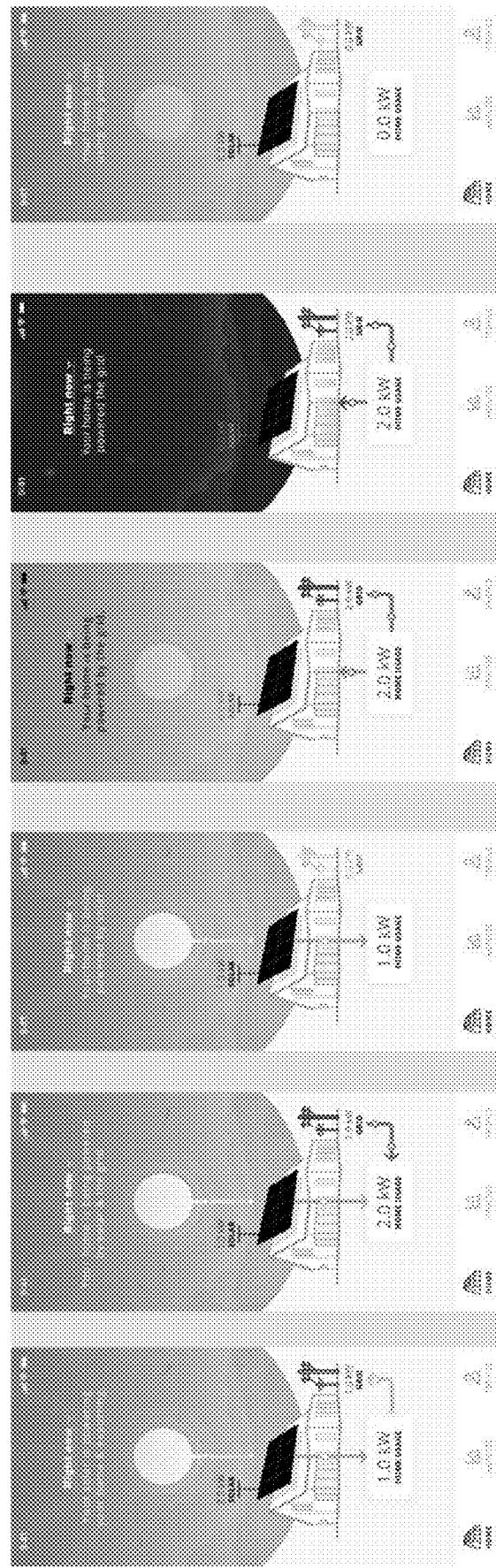
FIG. 41 illustrates various exemplary power flow state pages implemented in the software application displayed on the remote device according to one or more aspects of the disclosed subject matter.

FIG. 41 illustrates various exemplary power flow state pages implemented in the software application displayed on the remote device 110 according to one or more aspects of the disclosed subject matter. For example, the various exemplary power flow state pages correspond to a system for monitoring a solar installation that does not include a storage component.

Figure 42:
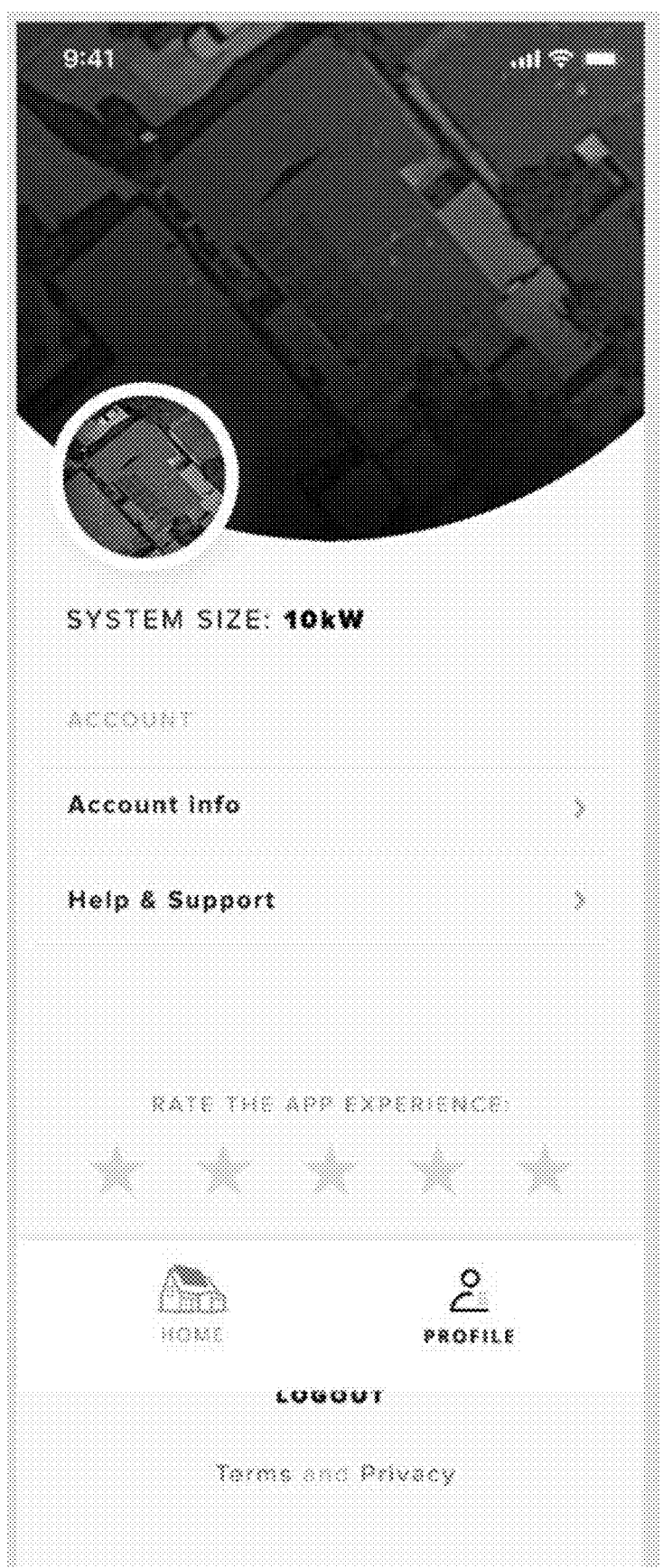
FIG. 42 illustrates an exemplary profile page implemented in the software application displayed on the remote device according to one or more aspects of the disclosed subject matter.

FIG. 42 illustrates an exemplary profile page implemented in the software application displayed on the remote device 110 according to one or more aspects of the disclosed subject matter. For example, the profile page can provide access to an account information page and a help and support page.

Figure 43:
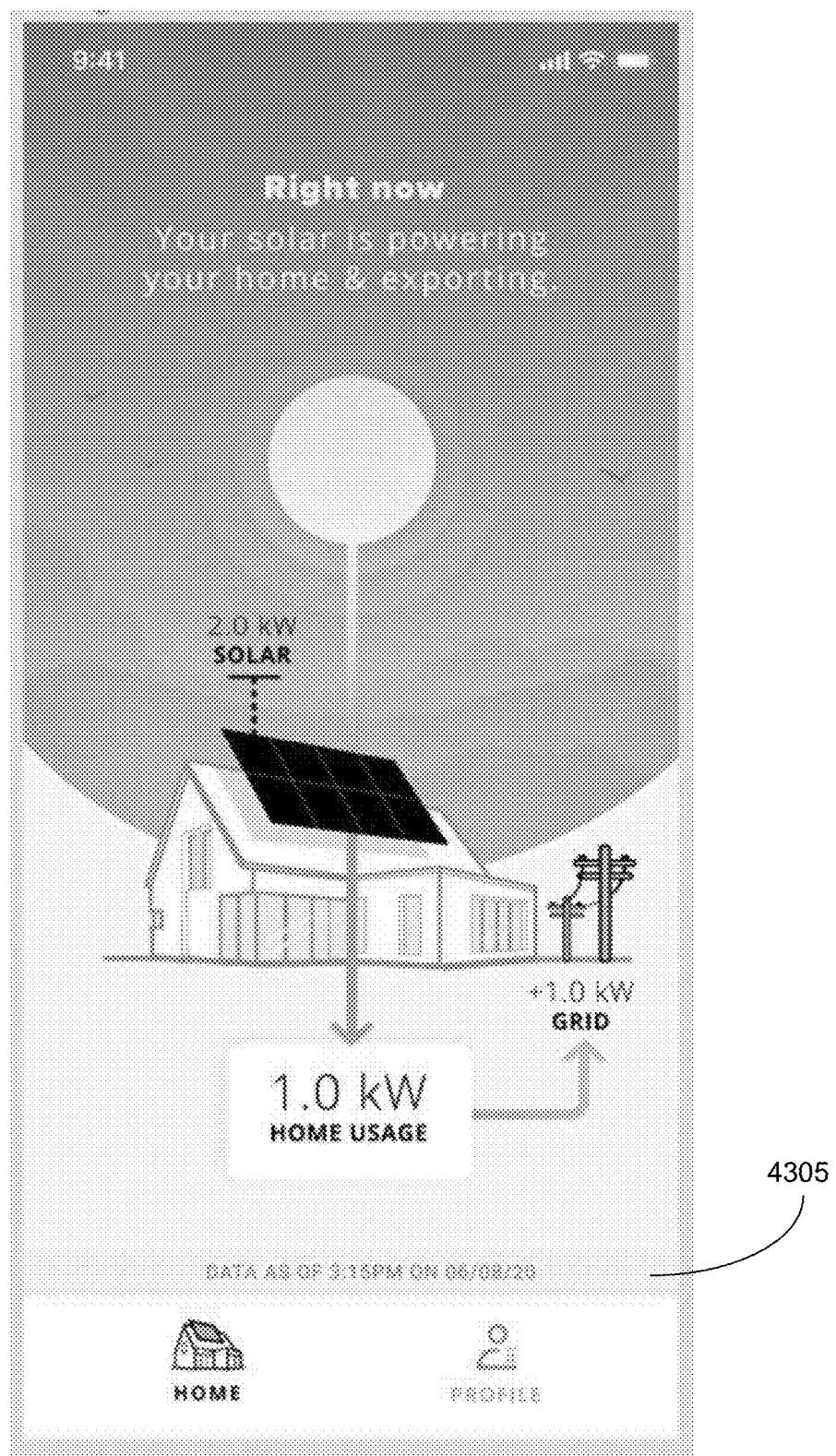
FIG. 43 illustrates an exemplary power flow state page with a time stamp implemented in the software application displayed on the remote device according to one or more aspects of the disclosed subject matter.

FIG. 43 illustrates an exemplary power flow state page with a time stamp 4305 implemented in the software application displayed on the remote device 110 according to one or more aspects of the disclosed subject matter. The timestamp 4305 can correspond to when the data displayed is not being displayed in real time. This occurs when the server 115 has not received data from the PV system 105 within a predetermined amount of time (e.g., within the last 20 minutes). In other words, the timestamp 4305 displays that the data being viewed in the power flow state page is only as current as the time displayed in the timestamp 4305.

Figure 44:
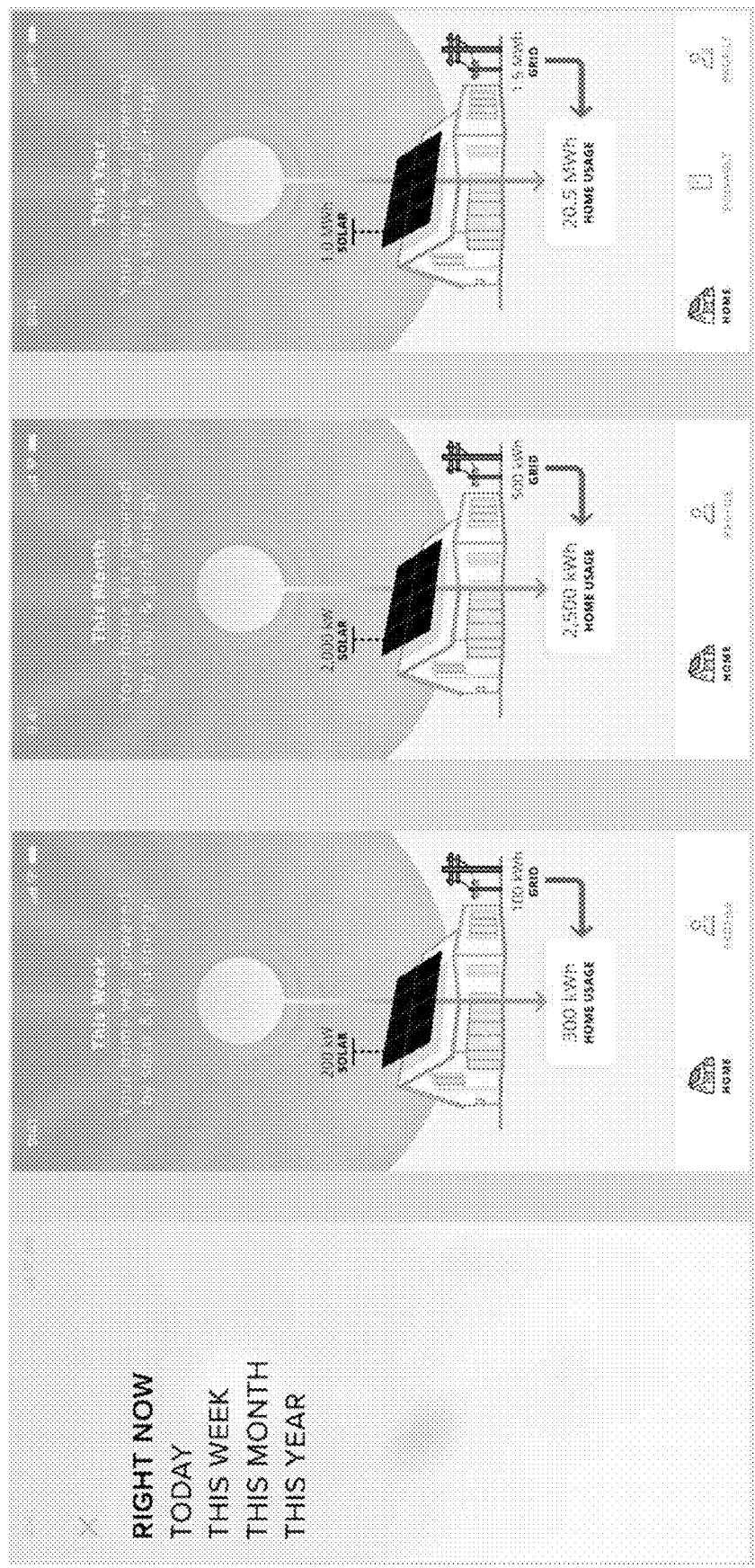
FIG. 44 illustrates exemplary historical state pages for different time periods implemented in the software application displayed on the remote device according to one or more aspects of the disclosed subject matter.
Figure 45C:
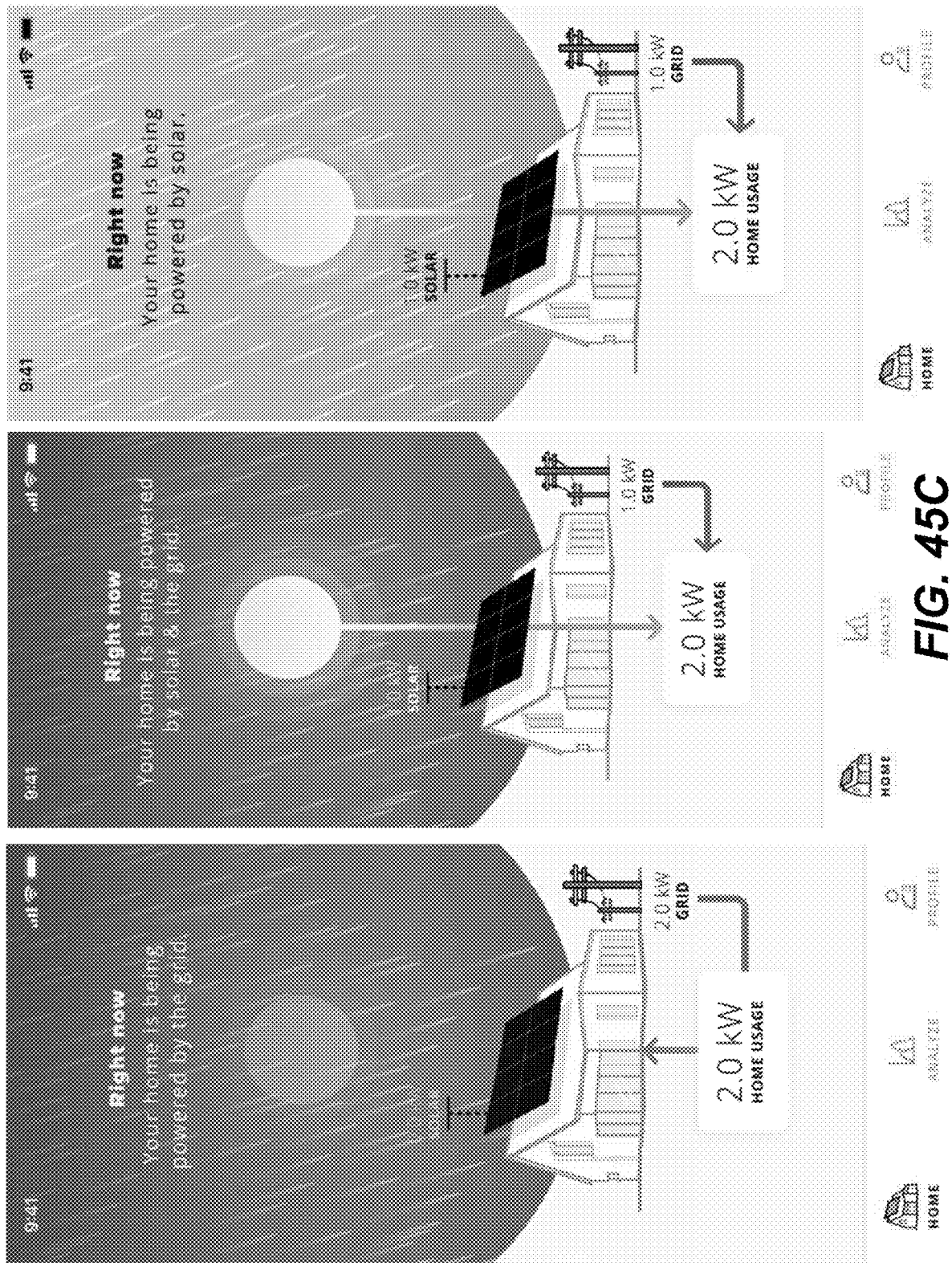
Figure 45D:
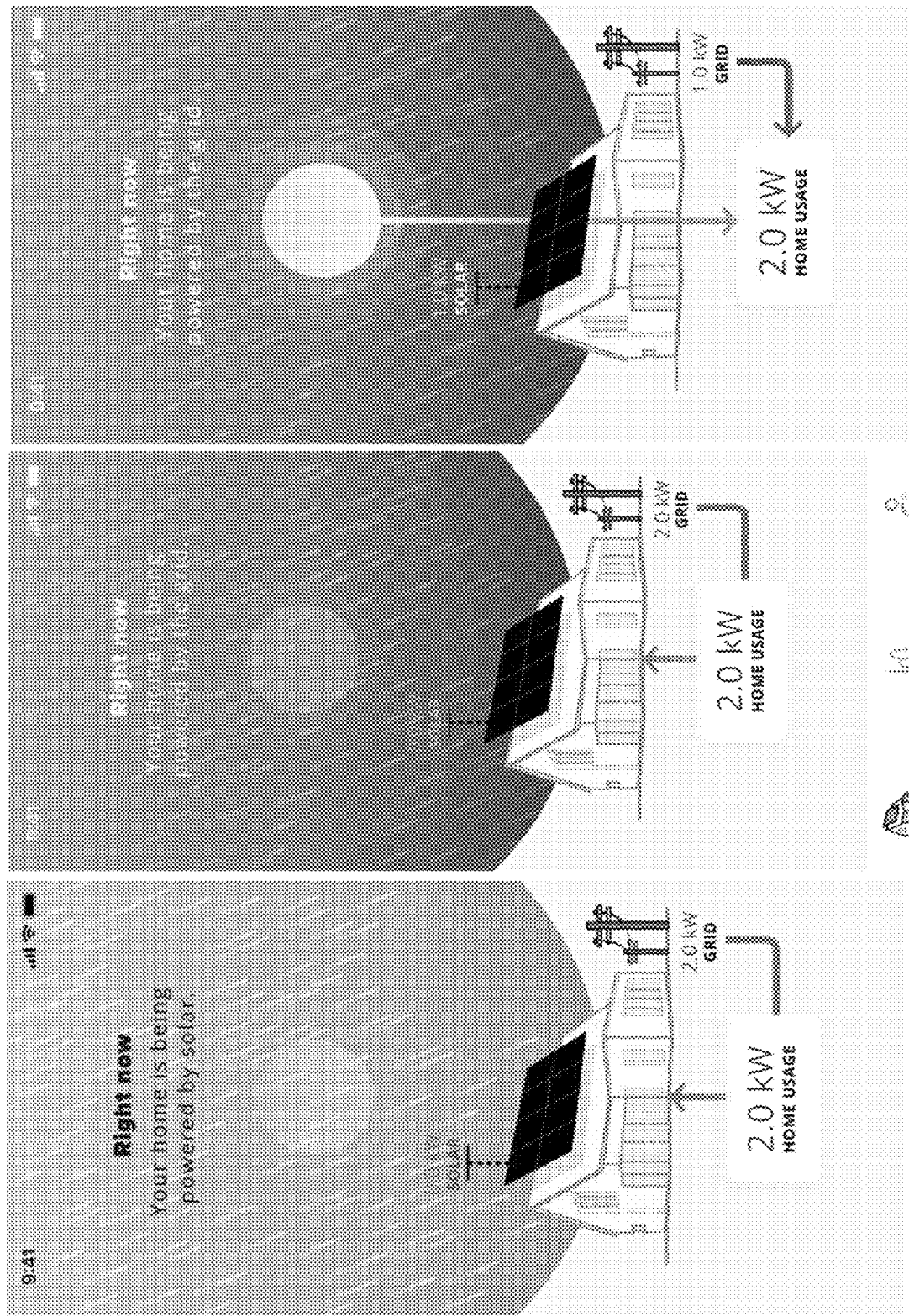
Figure 45E:
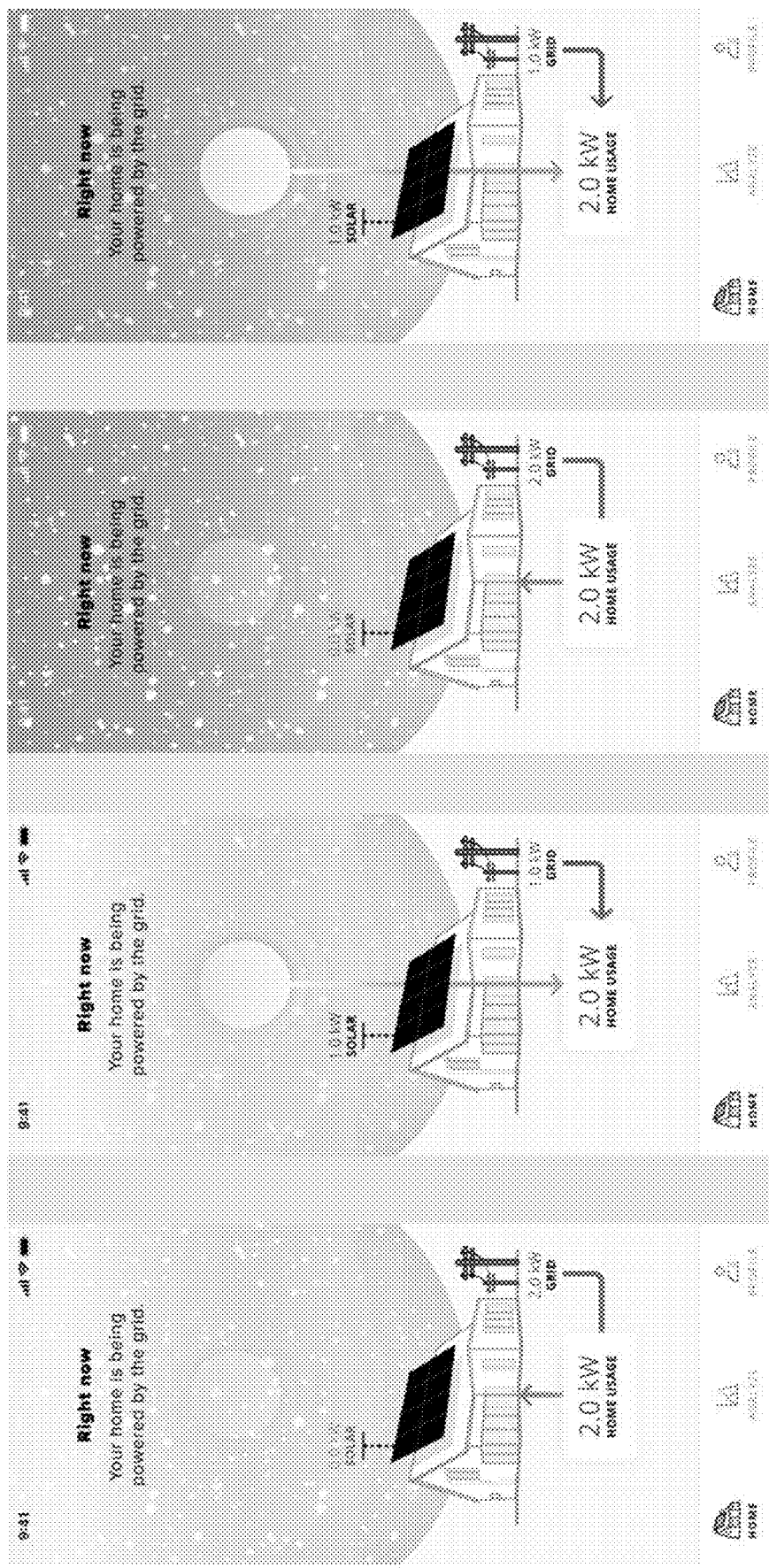

FIG. 44 illustrates exemplary historical state pages for different time periods implemented in the software application displayed on the remote device 110 according to one or more aspects of the disclosed subject matter. For example, a historical state page can display the power flow of the current day, the current week, the current month, or the current year. The day historical state page can correspond to the total power flow since the start of the day. The week historical state page can correspond to the total power flow since the start of the week. The month historical state page can correspond to the total power flow since the start of the month. The year historical state page can correspond to the total power flow since the start of the year. In one aspect, the historical state pages can also include an energy storage system which can be calculated into the rendering to display how much of the home usage was provided by the battery.

FIGS. 45A-E illustrate exemplary PV system state pages with no storage system implemented in the software application displayed on the remote device 110 according to one or more aspects of the disclosed subject matter. For example, the PV system can include solar production, and the PV system state pages can indicate a power flow for one or more of solar and grid powering a user's home for various weather conditions.

Figure 46:
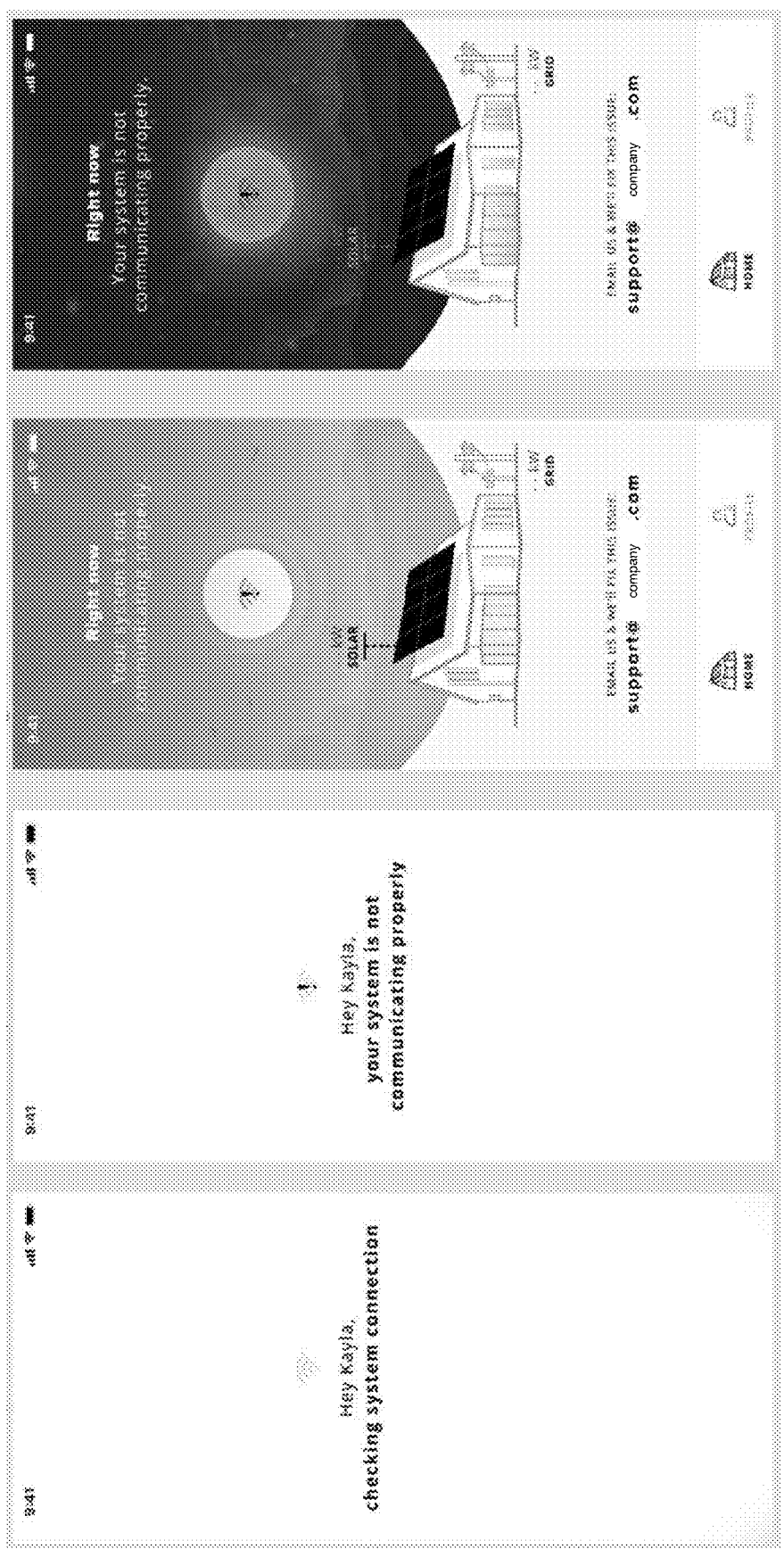
FIG. 46 illustrates a series of exemplary pages corresponding to an internet communication down (ICD) error implemented in the software application displayed on the remote device according to one or more aspects of the disclosed subject matter.

FIG. 46 illustrates a series of exemplary pages corresponding to an internet communication down (ICD) error implemented in the software application displayed on the remote device 110 according to one or more aspects of the disclosed subject matter. For example, the ICD error can be triggered when the PVS has not communicated with the server 115 for twenty-four consecutive hours.

Figure 47:
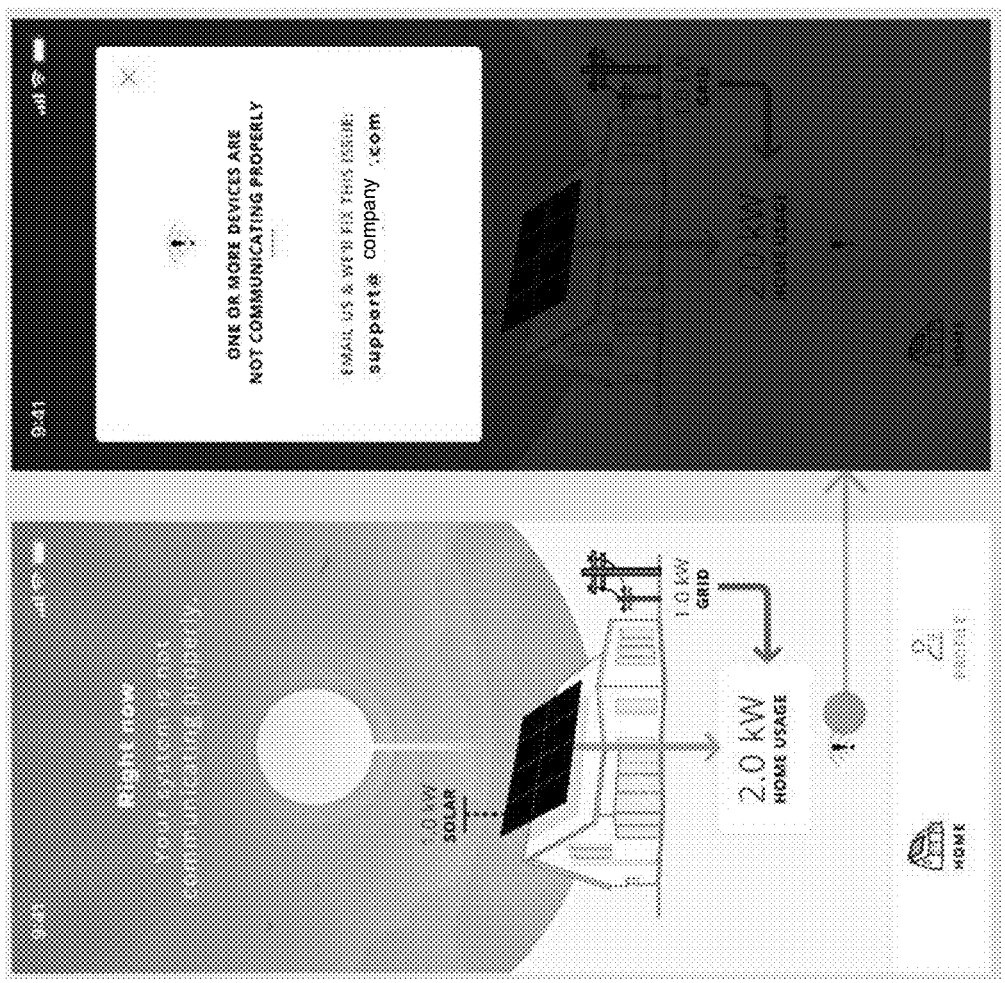
FIG. 47 illustrates a series of exemplary pages corresponding to an inverter communication error (ICE) error implemented in the software application displayed on the remote device according to one or more aspects of the disclosed subject matter.

FIG. 47 illustrates a series of exemplary pages corresponding to an inverter communication error (ICE) error implemented in the software application displayed on the remote device 110 according to one or more aspects of the disclosed subject matter. For example, the ICE error can be triggered when one or more of the devices connected to the PVS (e.g., inverter or meter) has not communicated with the PVS for twenty-four consecutive hours.

Figure 48:
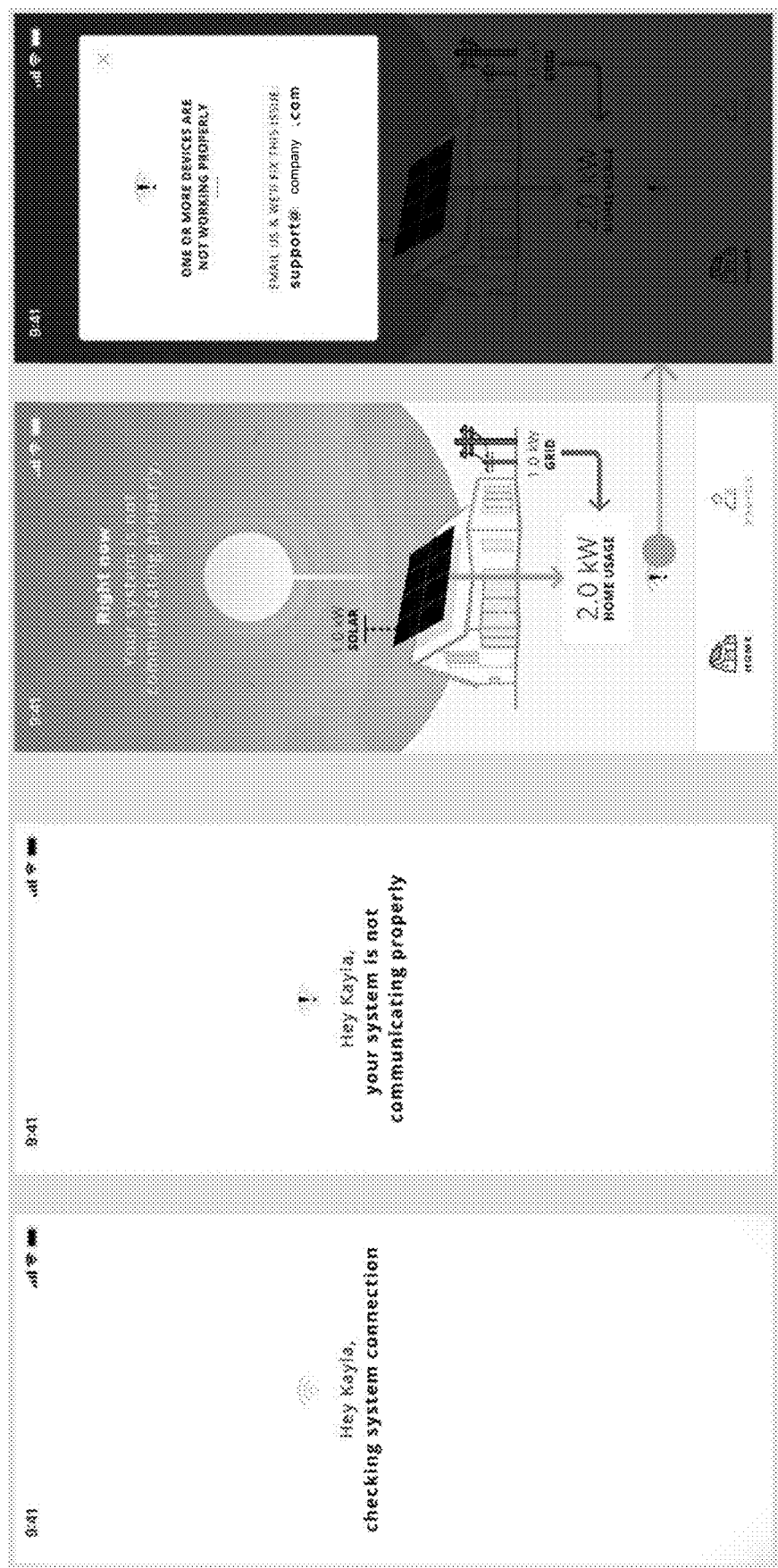
FIG. 48 illustrates a series of exemplary pages corresponding to an inverter or meter being down implemented in the software application displayed on the remote device according to one or more aspects of the disclosed subject matter.

FIG. 48 illustrates a series of exemplary pages corresponding to an inverter or meter being down implemented in the software application displayed on the remote device 110 according to one or more aspects of the disclosed subject matter. For example, the error can be triggered when the meter or inverter has been reporting 0 kW for 24 consecutive hours.

Figure 49:
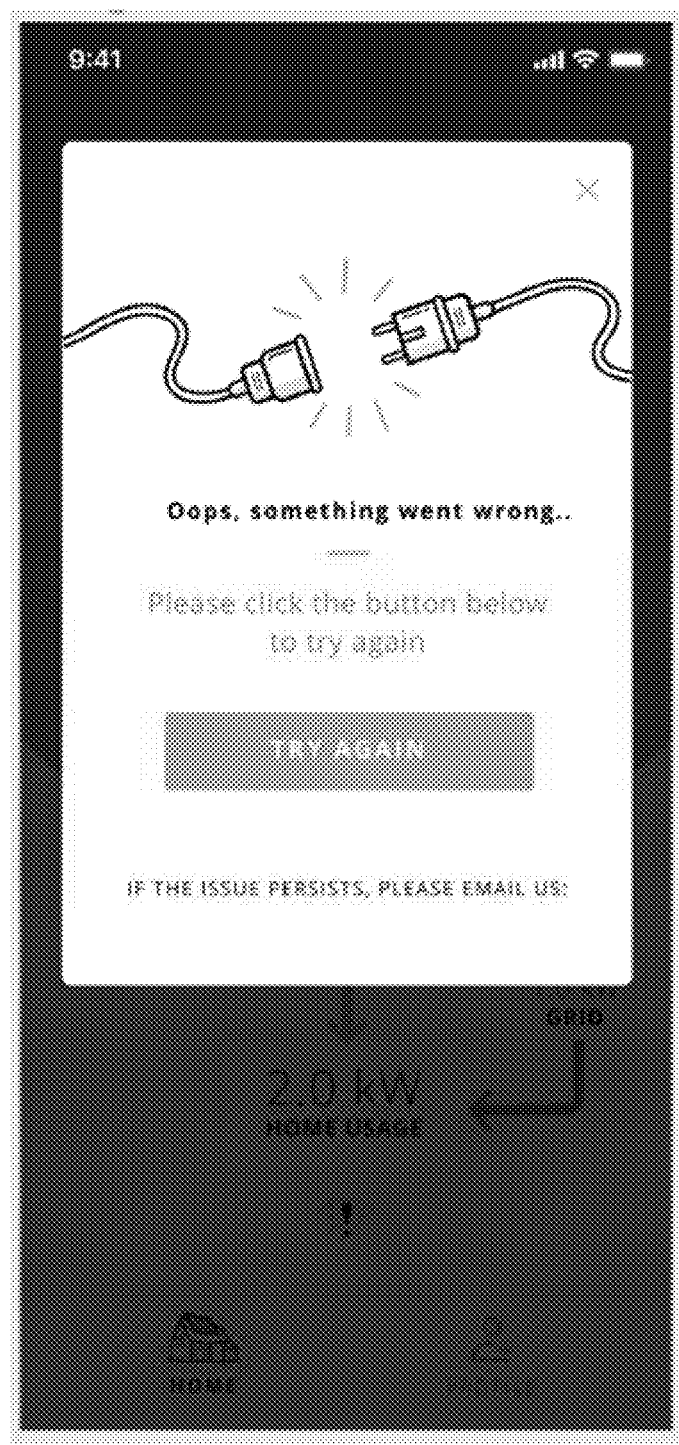
FIG. 49 illustrates an exemplary error page corresponding to an API call failing implemented in the software application displayed on the remote device according to one or more aspects of the disclosed subject matter.

FIG. 49 illustrates an exemplary error page corresponding to an API call failing implemented in the software application displayed on the remote device 110 according to one or more aspects of the disclosed subject matter. For example, the error can be triggered when the software application fails to load any data.

Figure 50:
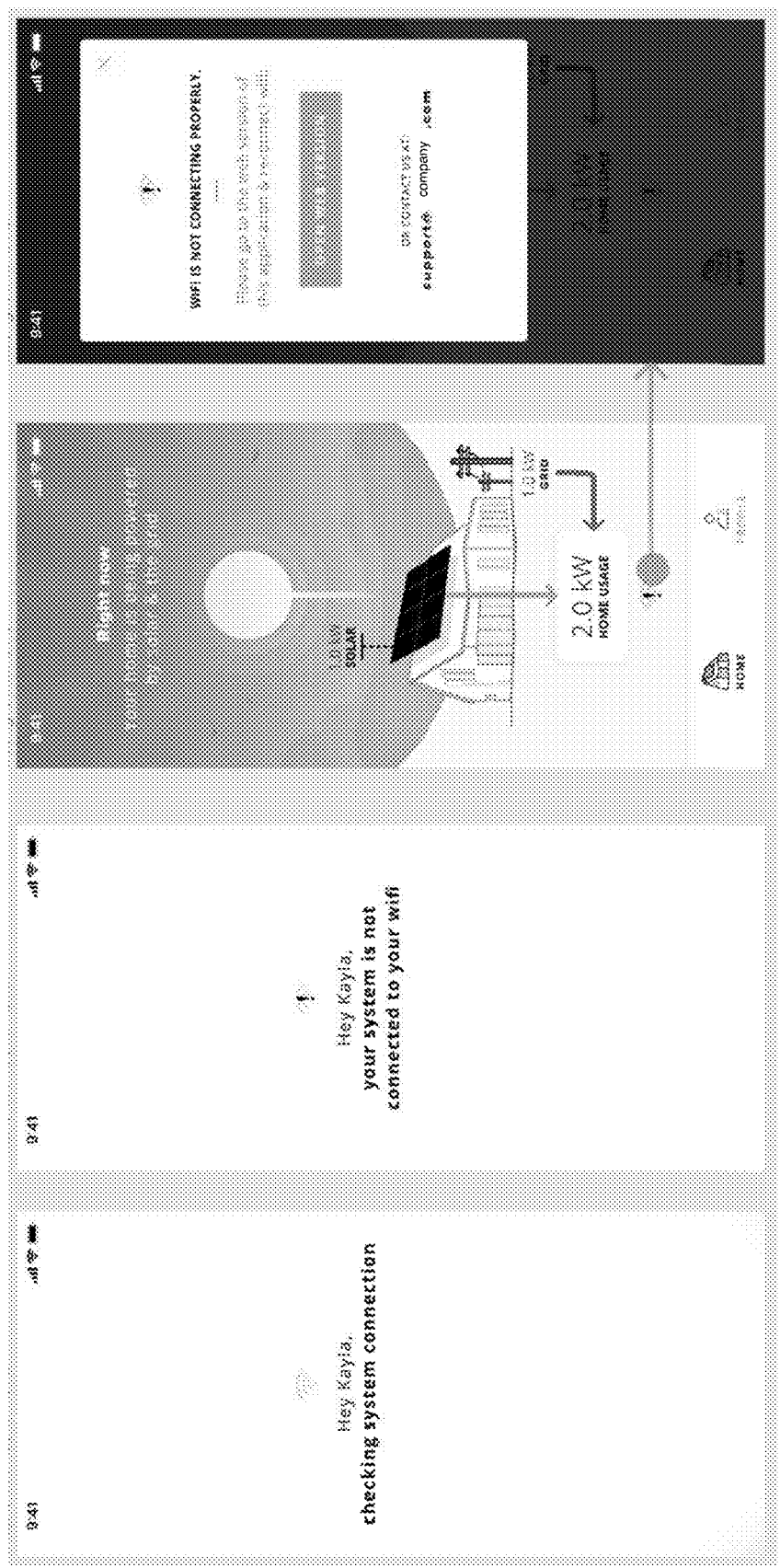
FIG. 50 illustrates a series of exemplary pages corresponding to Wi-Fi network error implemented in the software application displayed on the remote device according to one or more aspects of the disclosed subject matter.

FIG. 50 illustrates a series of exemplary pages corresponding to Wi-Fi network error implemented in the software application displayed on the remote device 110 according to one or more aspects of the disclosed subject matter. For example, the error can be triggered when the PVS is not communicating through the Wi-Fi network (e.g., network 130).

FIG. 51 illustrates a series of exemplary admin troubleshooting pages implemented in the software application displayed on the remote device 110 according to one or more aspects of the disclosed subject matter. For example, an administrator can login as a user through a user ID or a site ID (e.g., site of the solar installation) to troubleshoot any issues (e.g., one or more of the errors in FIGS. 46-50).

Figure 52:
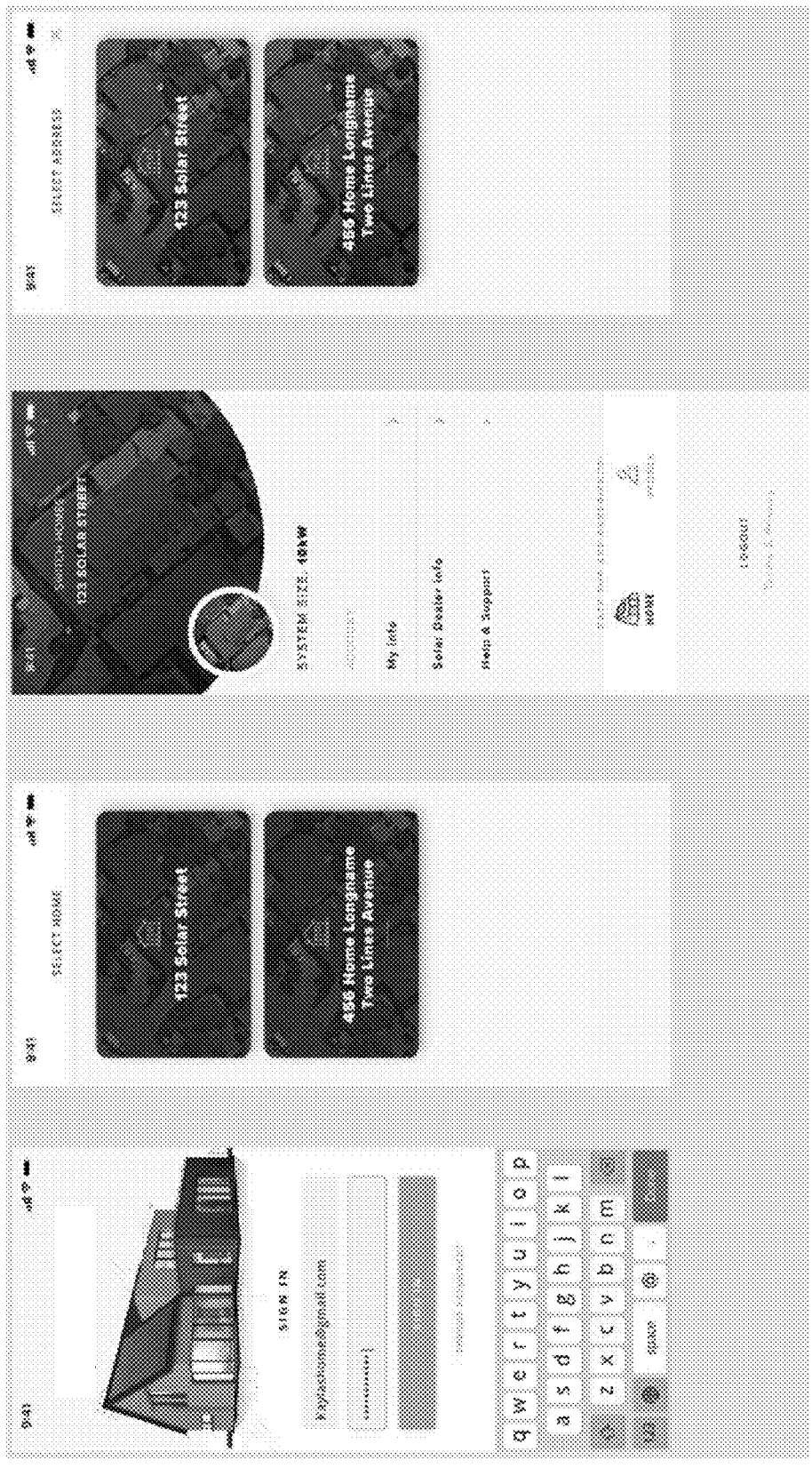
FIG. 52 illustrates a series of exemplary login pages for a user with multiple structures having a PV system implemented in the software application displayed on the remote device according to one or more aspects of the disclosed subject matter.

FIG. 52 illustrates a series of exemplary login pages for a user with multiple structures (e.g., homes) having a PV system (e.g., PV system 105) implemented in the software application displayed on the remote device 110 according to one or more aspects of the disclosed subject matter. For example, a user having multiple homes that have a PV system can manage the systems separately through the software application.

Figure 53:
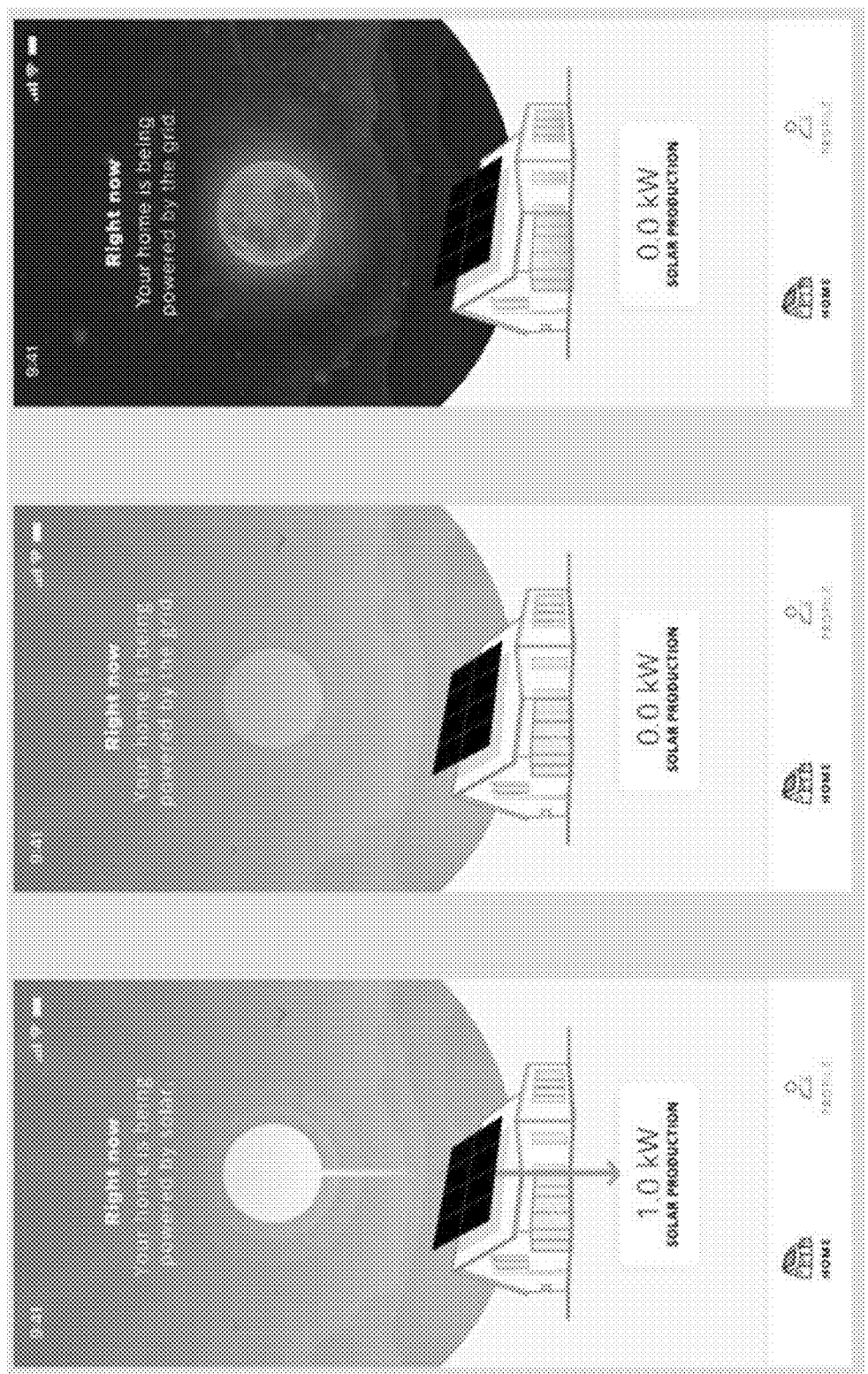
FIG. 53 illustrates a series of exemplary PV system state pages with only solar production implemented in the software application displayed on the remote device according to one or more aspects of the disclosed subject matter.
Figure 54A:
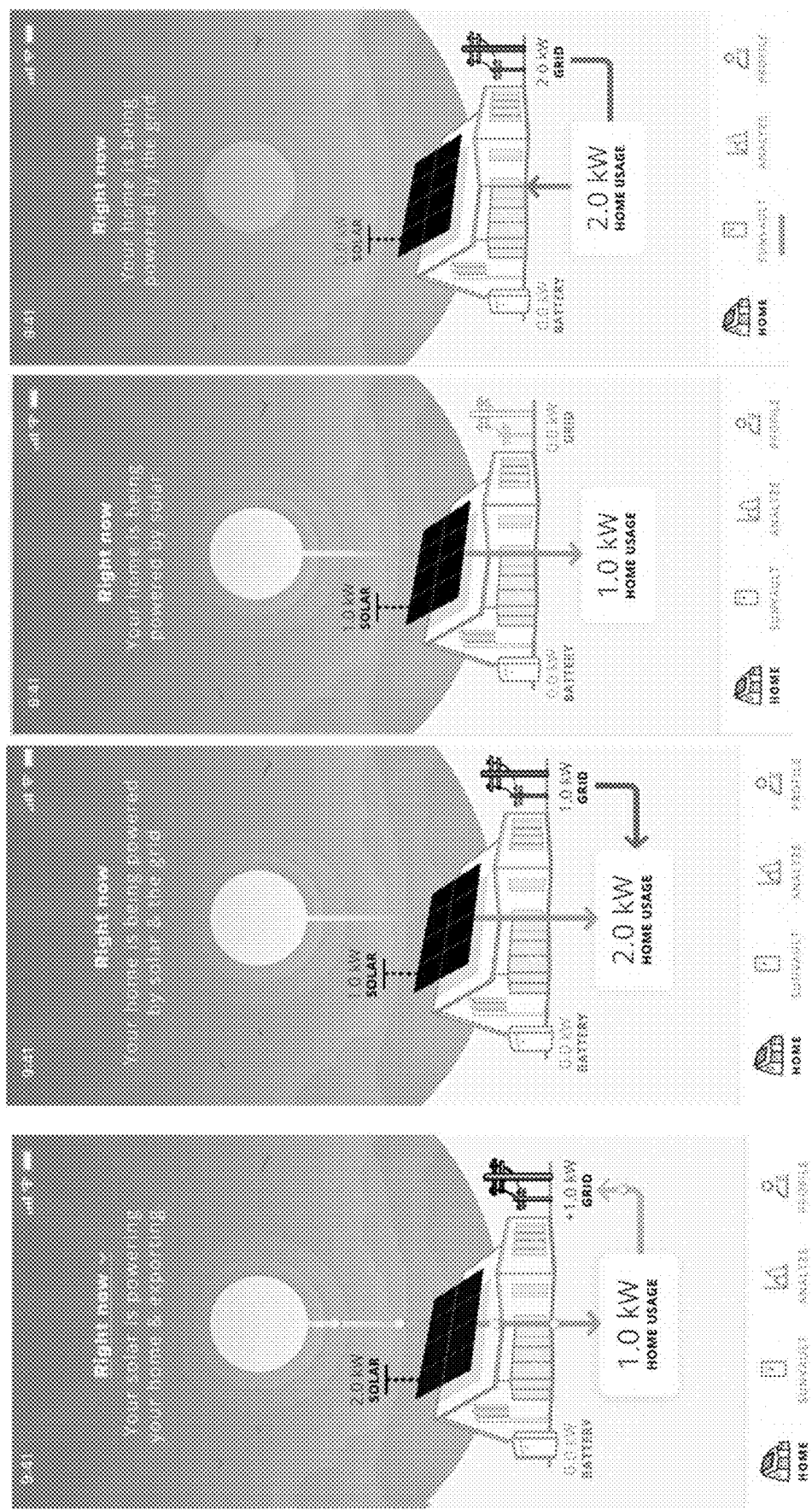
Figure 54B:
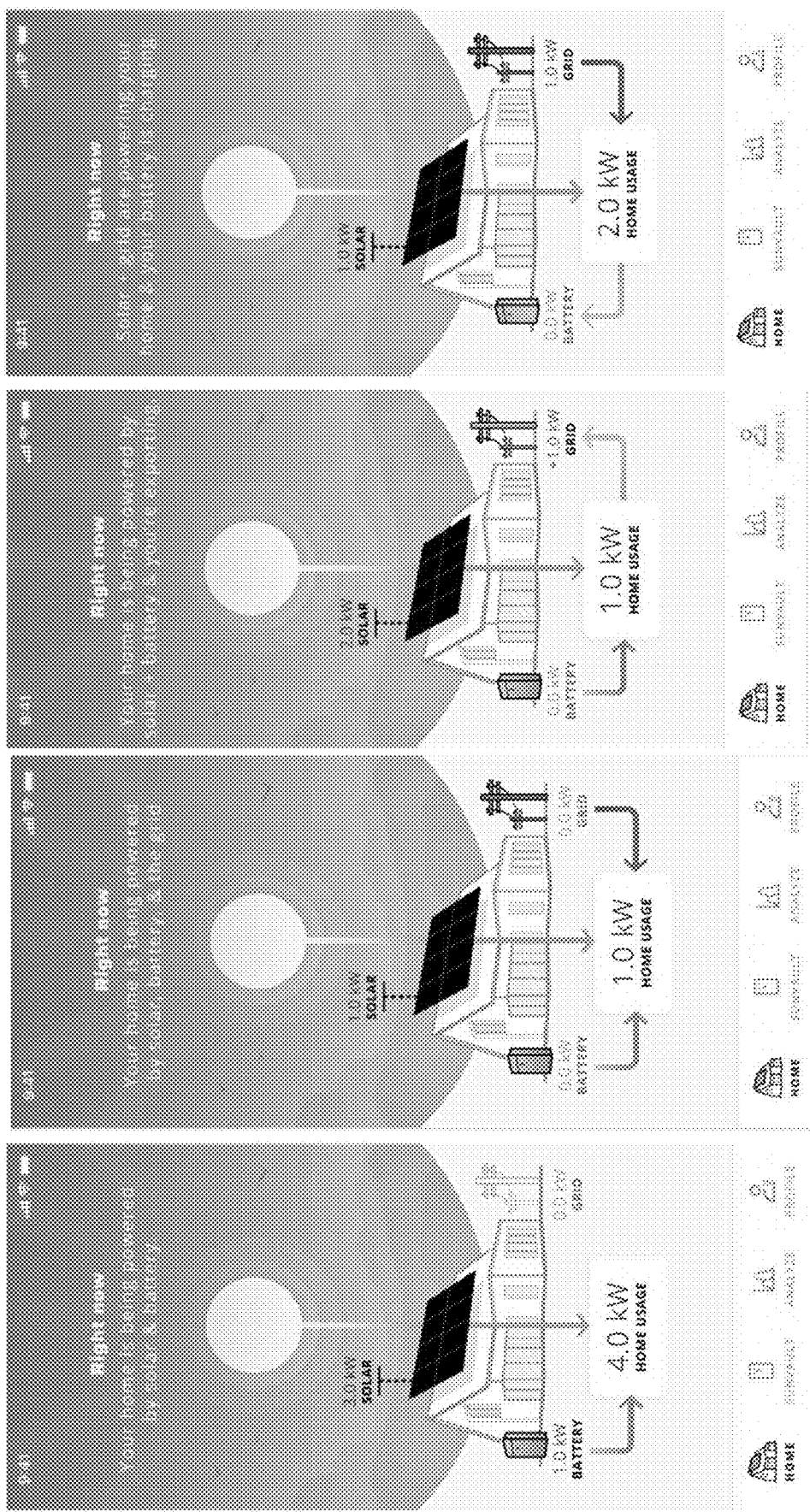
Figure 54C:
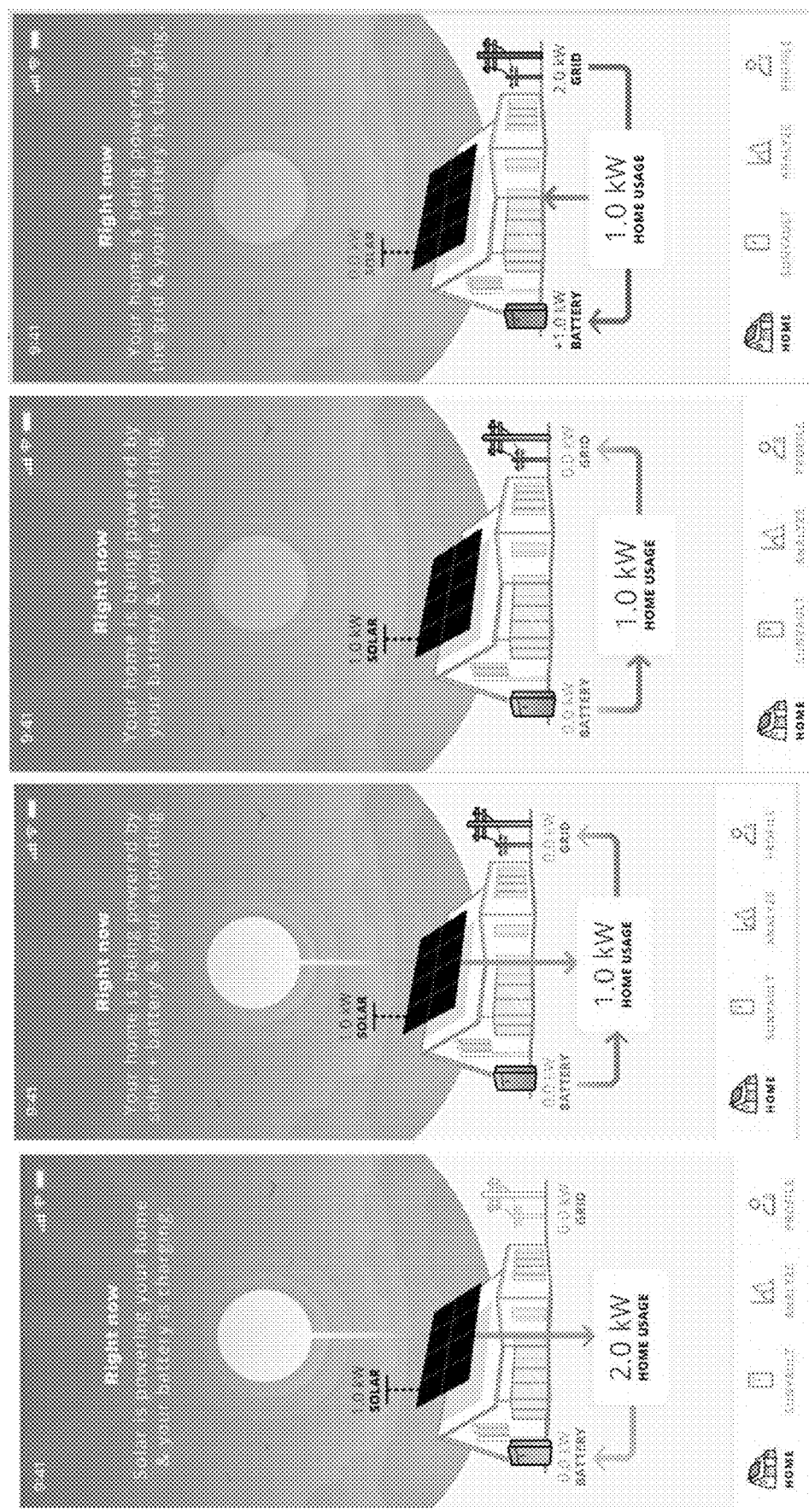
Figure 54E:
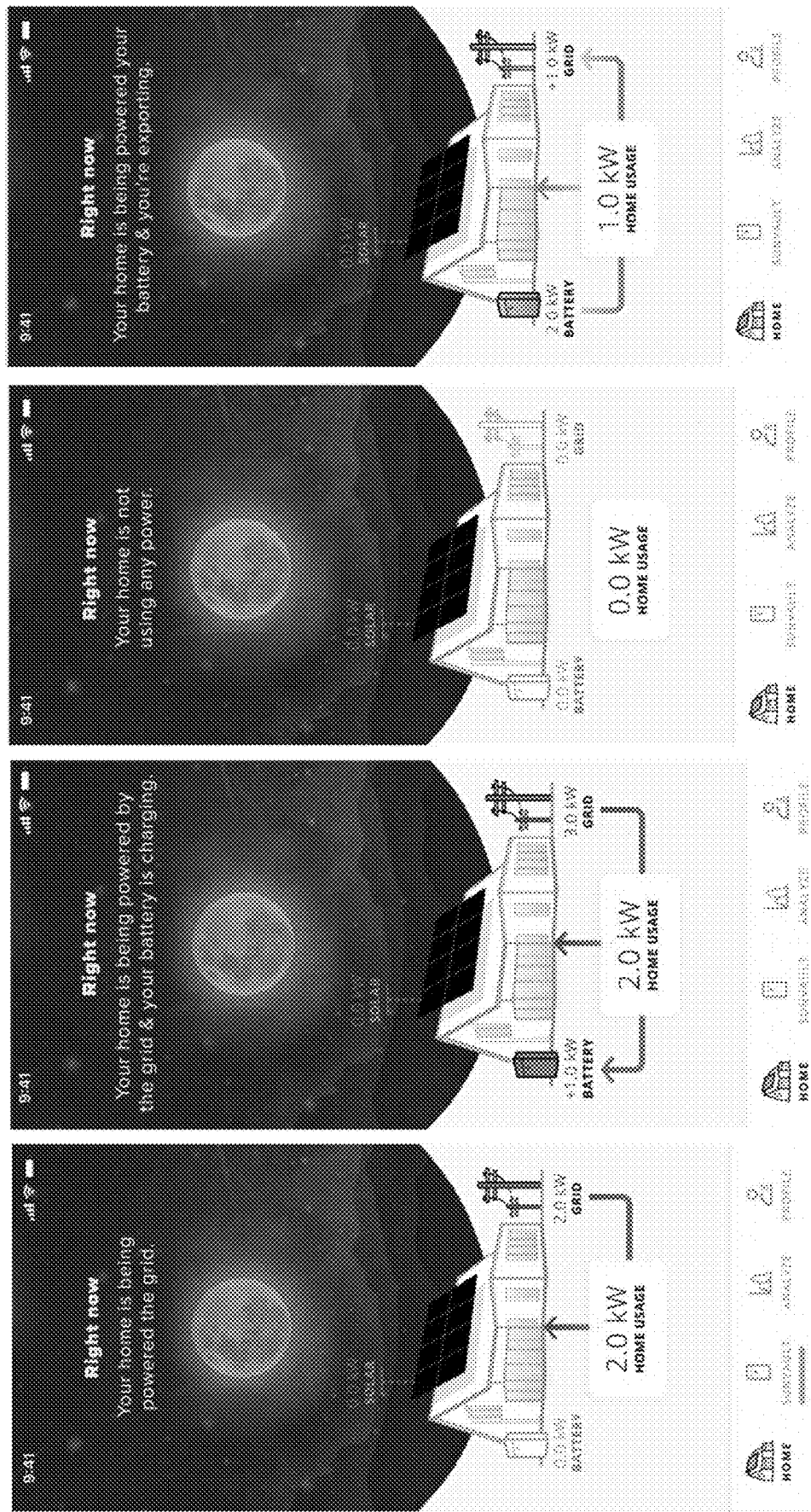

FIG. 53 illustrates a series of exemplary PV system state pages with only solar production (i.e., no storage system and no consumption meter) implemented in the software application displayed on the remote device 110 according to one or more aspects of the disclosed subject matter.

FIGS. 54A-E illustrate a series of exemplary PV system state pages implemented in the software application displayed on the remote device 110 according to one or more aspects of the disclosed subject matter. For example, the PV system can be the PV system 105, and the PV system state pages can indicate a power flow for one or more of solar, storage, and grid interaction for powering the home, storing energy, and/or sending excess energy back to the grid for various weather conditions. Additionally, it should be appreciated that any of the weather conditions illustrated in FIGS. 45A-E can also be applied to a PV system including storage (e.g., FIGS. 54A-E).

Figure 55:
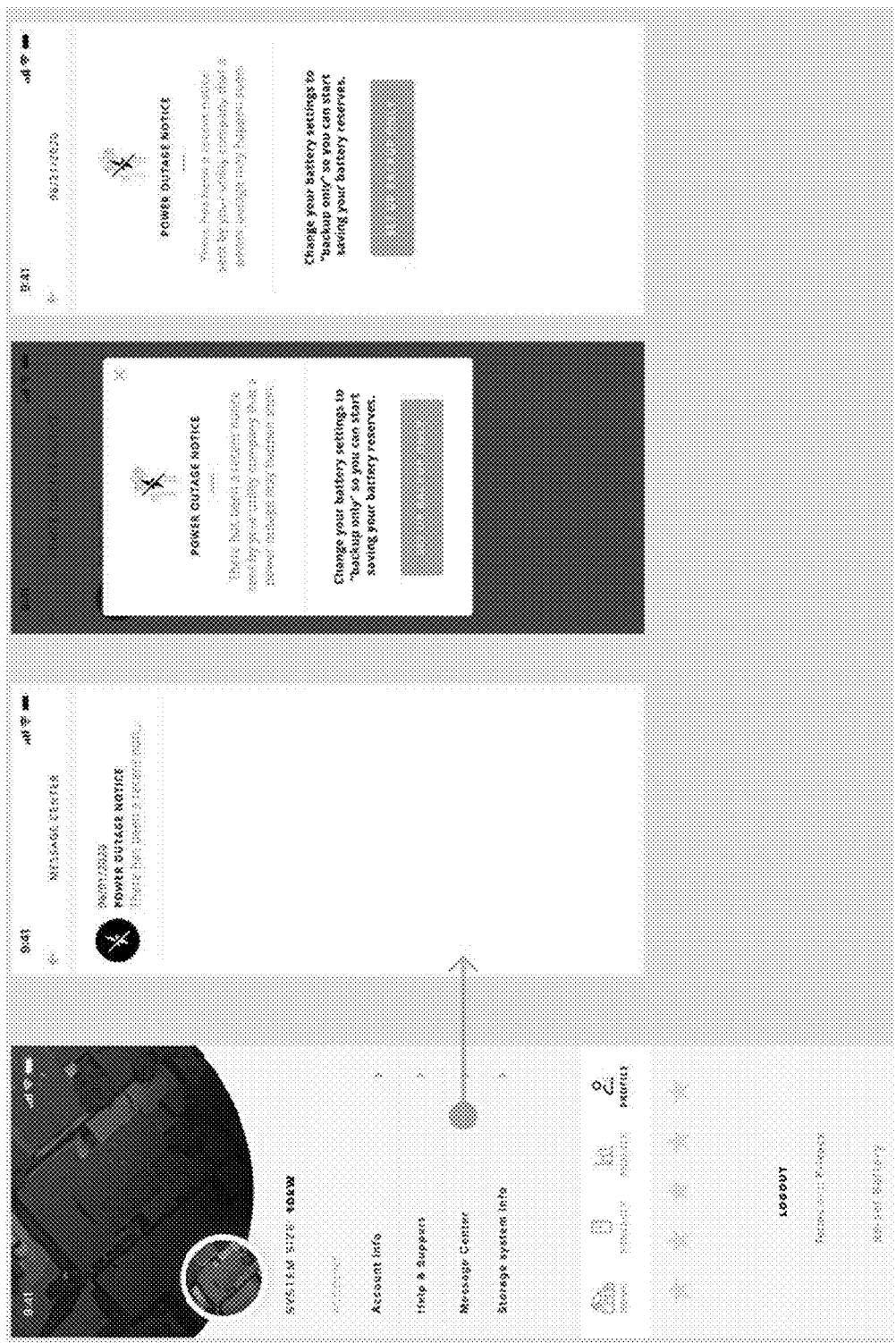
FIG. 55 illustrates a series of exemplary message center pages implemented in the software application displayed on the remote device according to one or more aspects of the disclosed subject matter.

FIG. 55 illustrates a series of exemplary message center pages implemented in the software application displayed on the remote device 110 according to one or more aspects of the disclosed subject matter. For example, the message center pages can include a power outage notice. Additionally, in one aspect, the message center pages can be accessed from the profile page.

Figure 56:
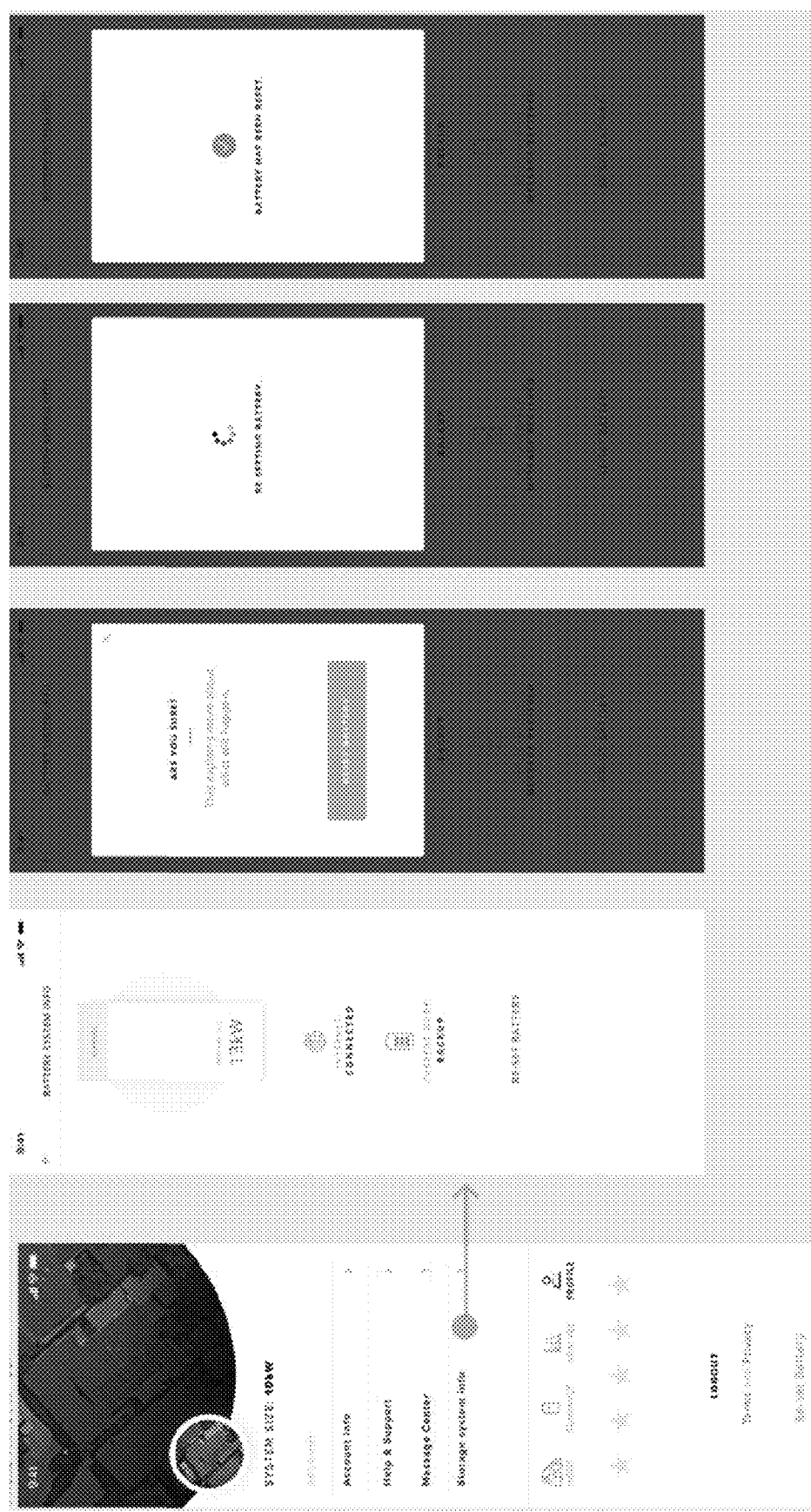
FIG. 56 illustrates a series of exemplary storage system information pages implemented in the software application displayed on the remote device according to one or more aspects of the disclosed subject matter.

FIG. 56 illustrates a series of exemplary storage system information pages implemented in the software application displayed on the remote device 110 according to one or more aspects of the disclosed subject matter. For example, the battery can be reset from the storage system information pages. Additionally, in one aspect, the storage system information pages can be accessed from the profile page.

Figure 57:
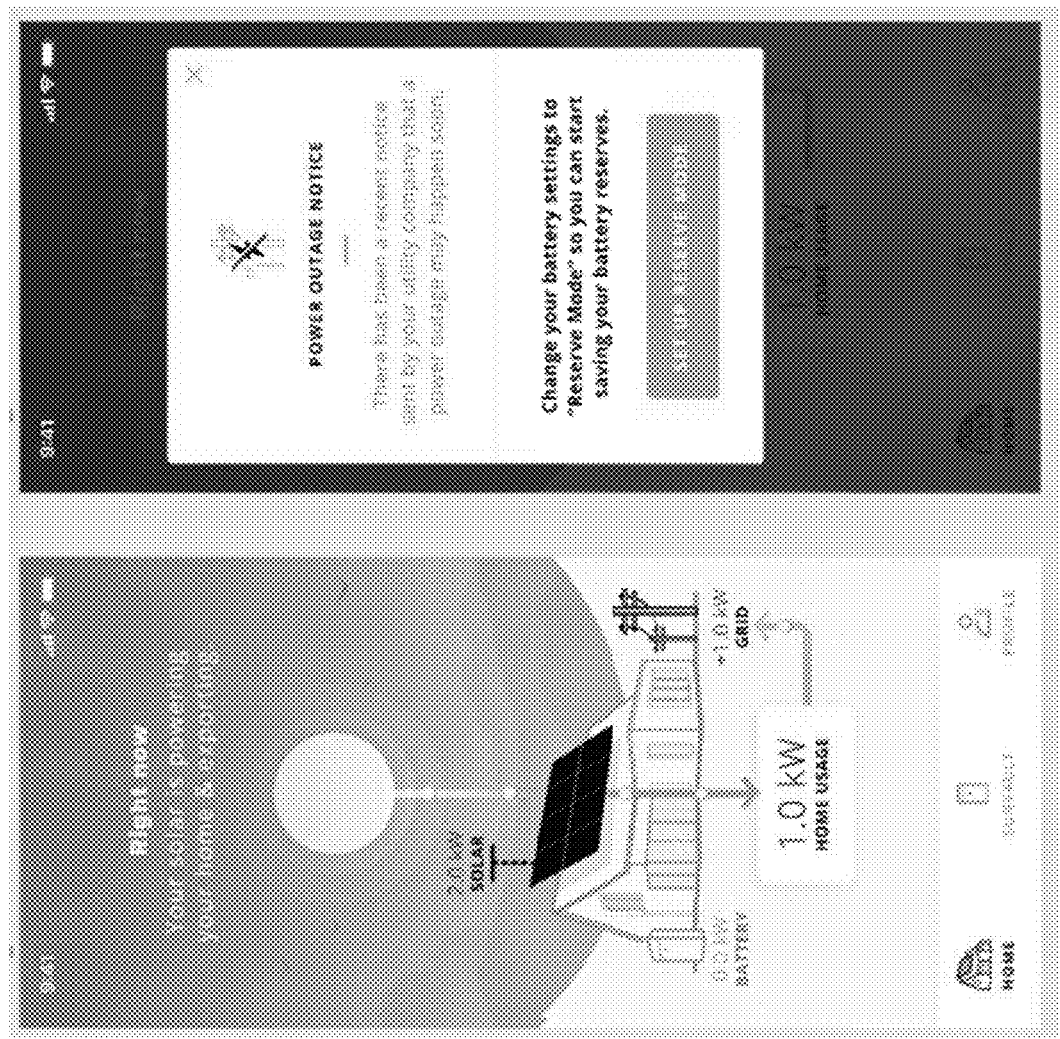
FIG. 57 illustrates an exemplary power outage notice page implemented in the software application displayed on the remote device according to one or more aspects of the disclosed subject matter.

FIG. 57 illustrates an exemplary power outage notice page implemented in the software application displayed on the remote device 110 according to one or more aspects of the disclosed subject matter. For example, the power outage notice page can be used to notify users that there is an upcoming power outage and prompt the user to change their battery settings to reserve mode.

Figure 58:
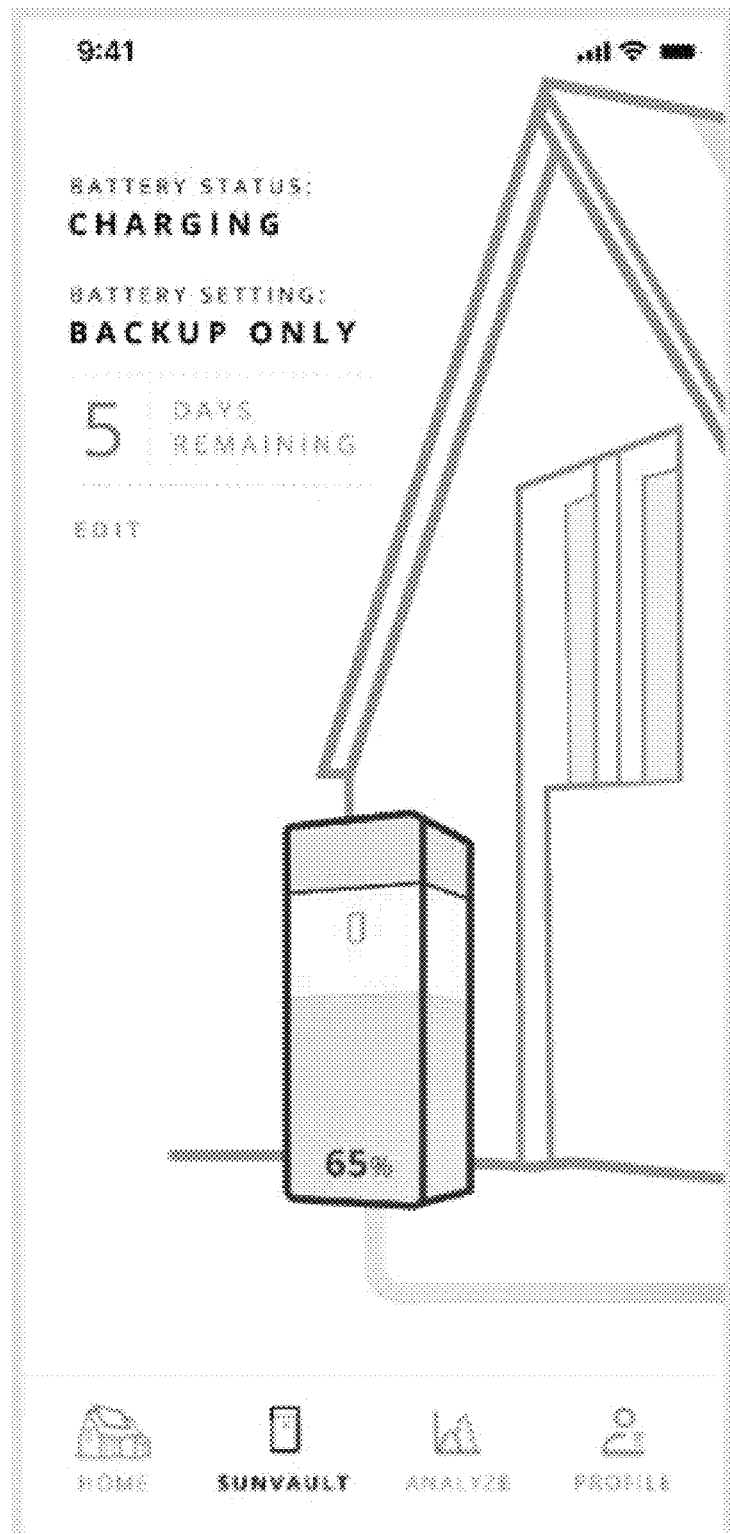
FIG. 58 illustrates an exemplary storage system stage page implemented in the software application displayed on the remote device according to one or more aspects of the disclosed subject matter.

FIG. 58 illustrates an exemplary storage system stage page implemented in the software application displayed on the remote device 110 according to one or more aspects of the disclosed subject matter. For example, the storage system state page can show a percentage of charge of the battery, a battery status (e.g., charging), a battery setting (e.g., backup only), and the like. In one aspect, the battery charge status can be animated to show a direction of energy (e.g., charging the battery compared to powering the home with the battery) and show the battery filling or draining, respectively.

Figure 59A:
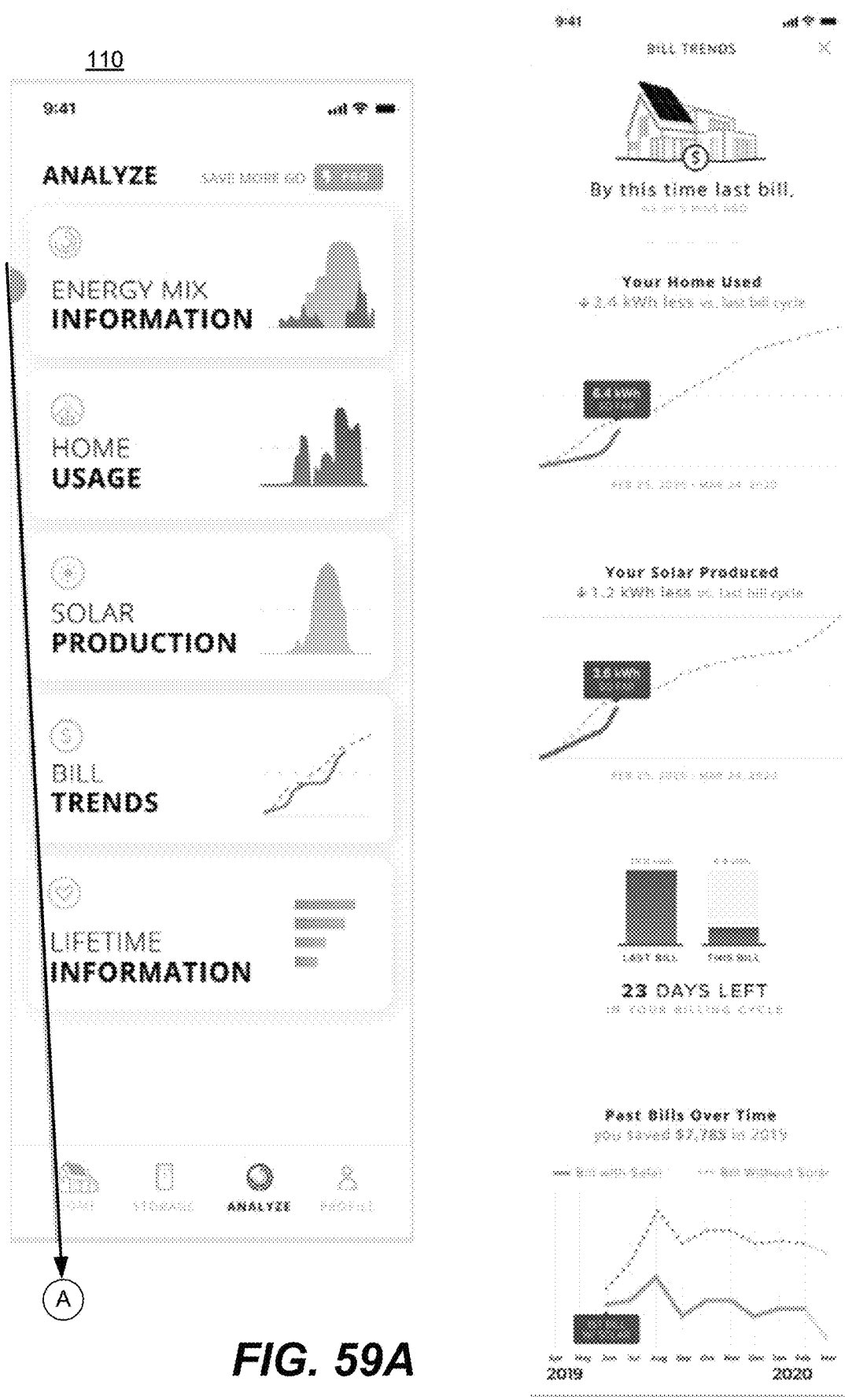

FIGS. 59A-59C illustrate a series of exemplary analysis pages accessed via an analysis tab on a menu bar implemented in the software application displayed on the remote device 110 according to one or more aspects of the disclosed subject matter. For example, the analysis pages can include a home page listing buttons linking to corresponding analysis pages including energy mix, home usage, solar production, bill trends, and lifetime information. The energy mix button causes energy mix information to be displayed, which is illustrated from FIGS. 60A-60E. The home usage button causes more specific home usage information to be displayed, the solar production button causes more specific solar production information to be displayed, the bill trends button causes more specific bill trends information to be displayed, and the lifetime information button causes information regarding the total lifetime of the PV system.

Figure 60A:
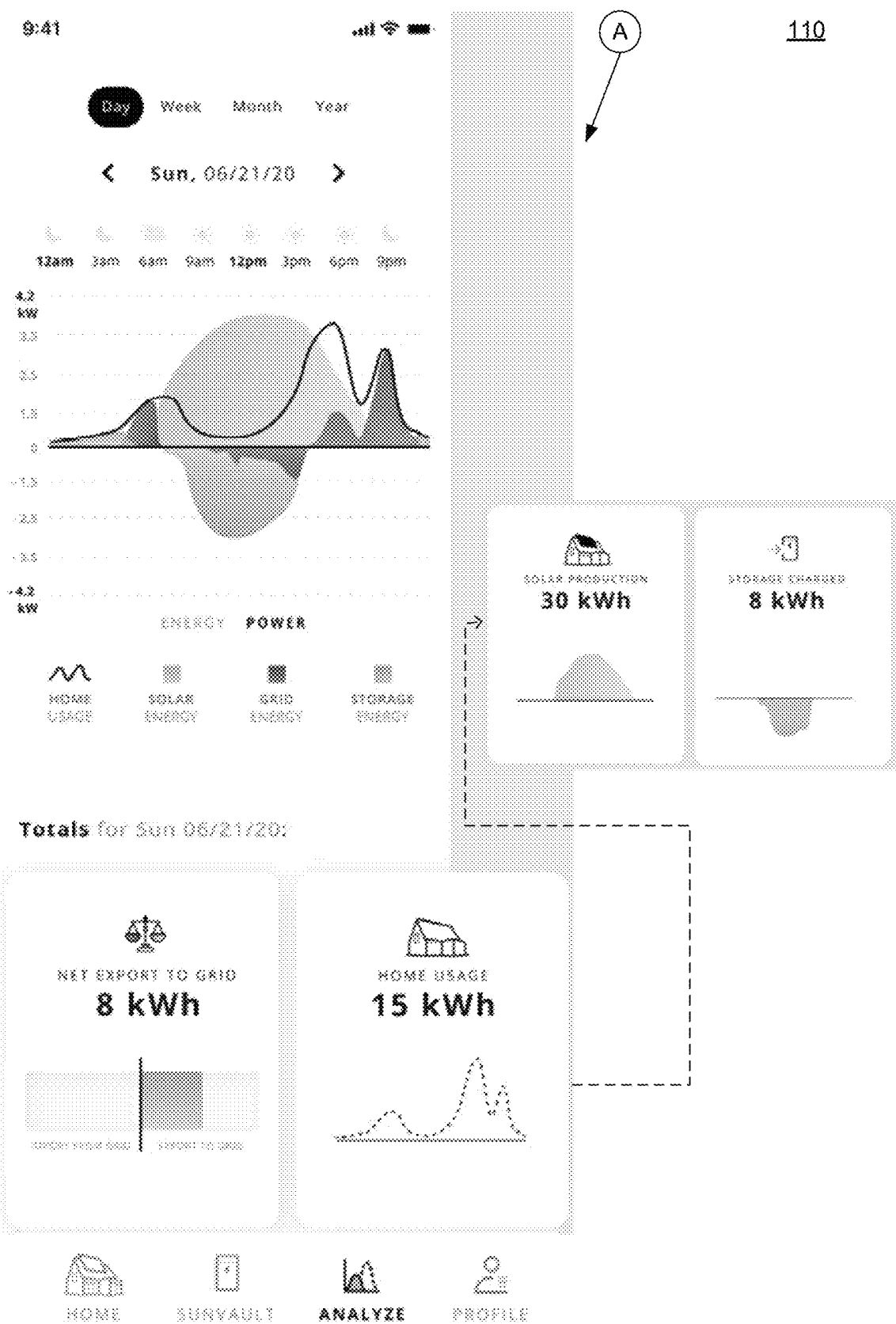
FIGS. 60A-60E illustrate a series of exemplary energy mix pages implemented in the software application displayed on the remote device according to one or more aspects of the disclosed subject matter.
Figure 60B:
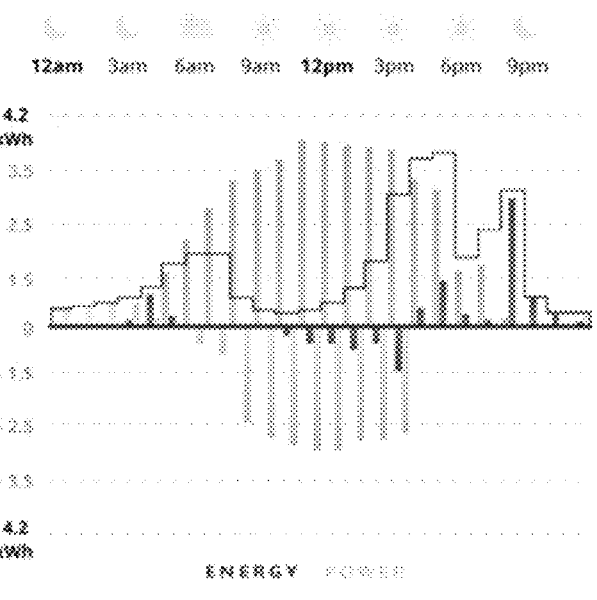
Figure 60C:
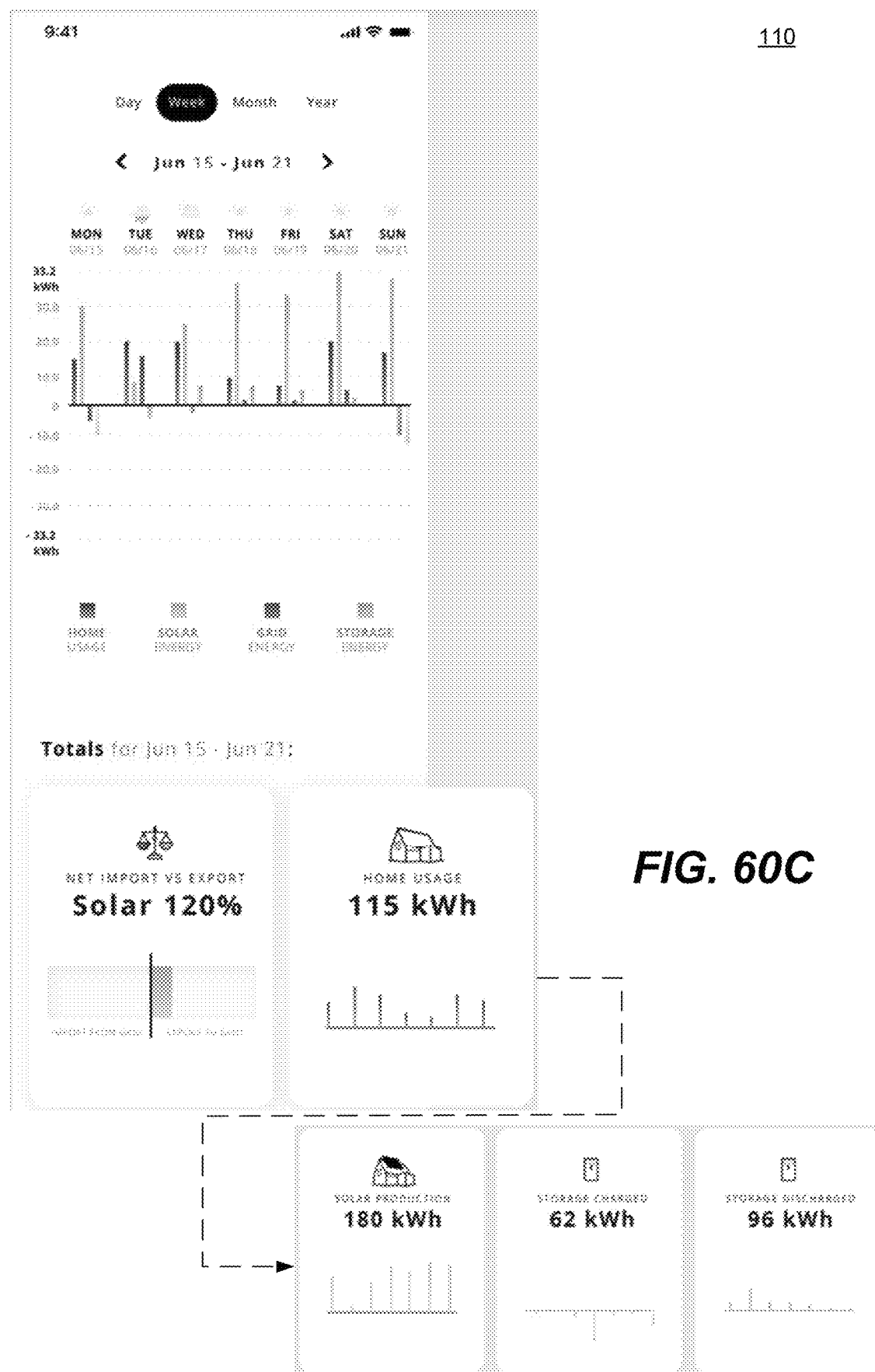
Figure 60D:
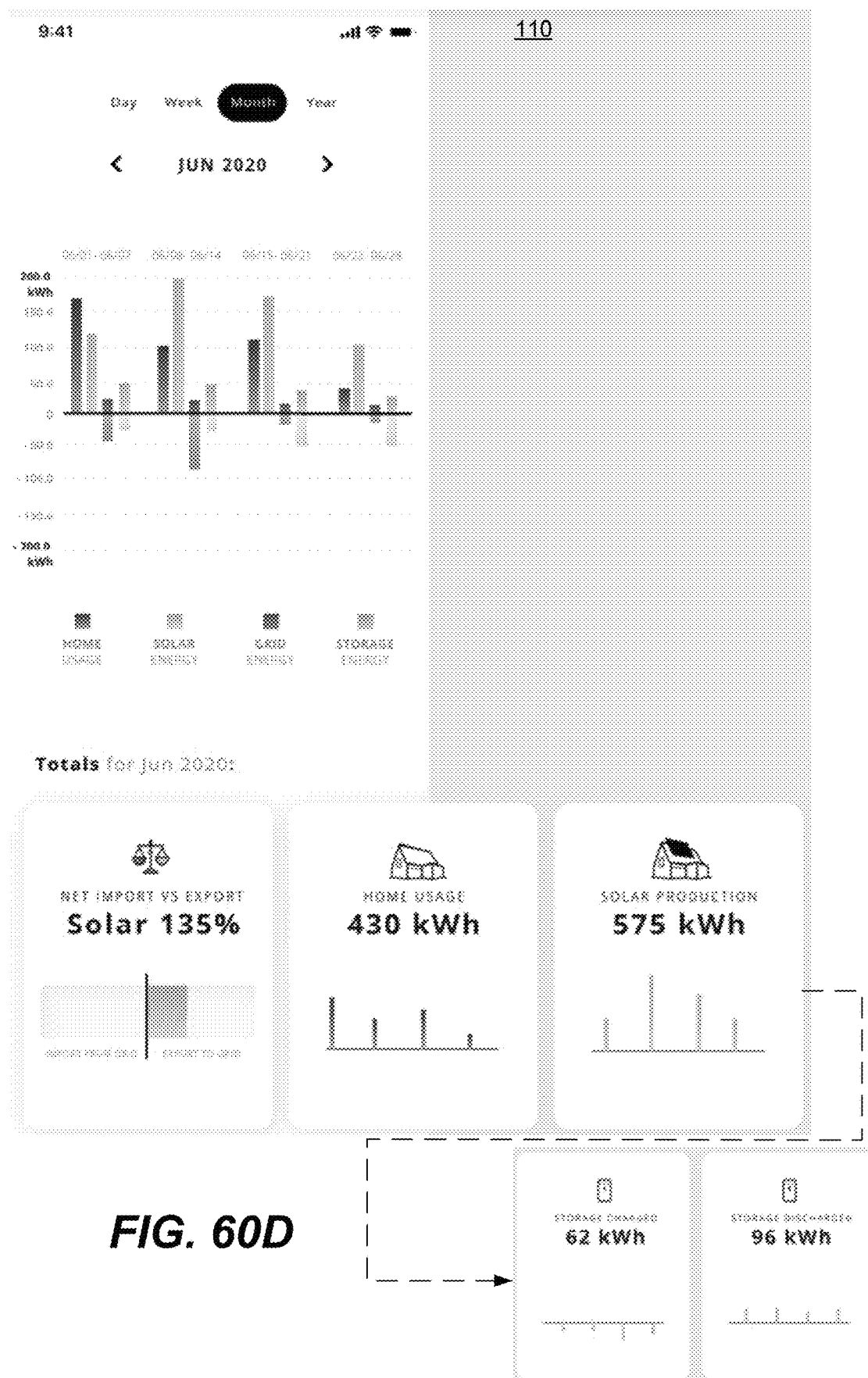
Figure 60E:
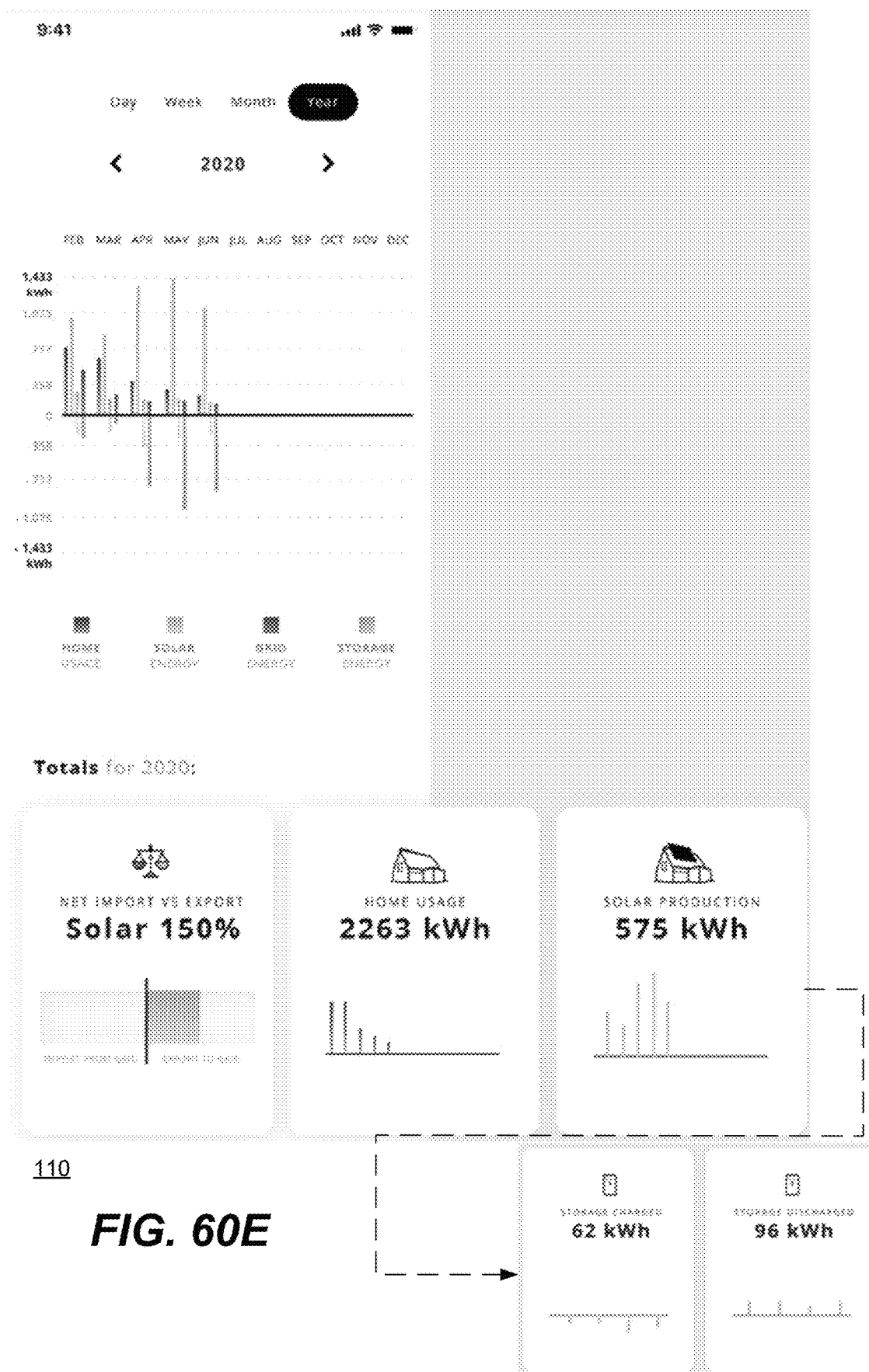

FIGS. 60A-60E illustrate a series of exemplary energy mix pages implemented in the software application displayed on the remote device 110 according to one or more aspects of the disclosed subject matter. For example, one or more of the series of energy mix pages can be displayed in response to a user selecting the energy mix button in FIG. 59A. FIG. 60A illustrates an energy mix graph displaying the home usage, solar energy, grid energy, and/or storage energy as a curve. It should be appreciated that the information displayed can be dependent on the set up of the PV system. For example, if the PV system does not include a storage system, then the storage energy curve may not be displayed. FIG. 60B illustrates an alternative example where the information is displayed using a bar graph rather than a curve as illustrated in FIG. 60A. Additionally, FIGS. 60A and 60B illustrate a day view corresponding to information for the selected day. FIG. 60C illustrates a week view corresponding to information for the selected week, FIG. 60D illustrates a month view corresponding to information for the selected month, and FIG. 60E illustrates a year view corresponding to information for the selected year.

Figure 61A:
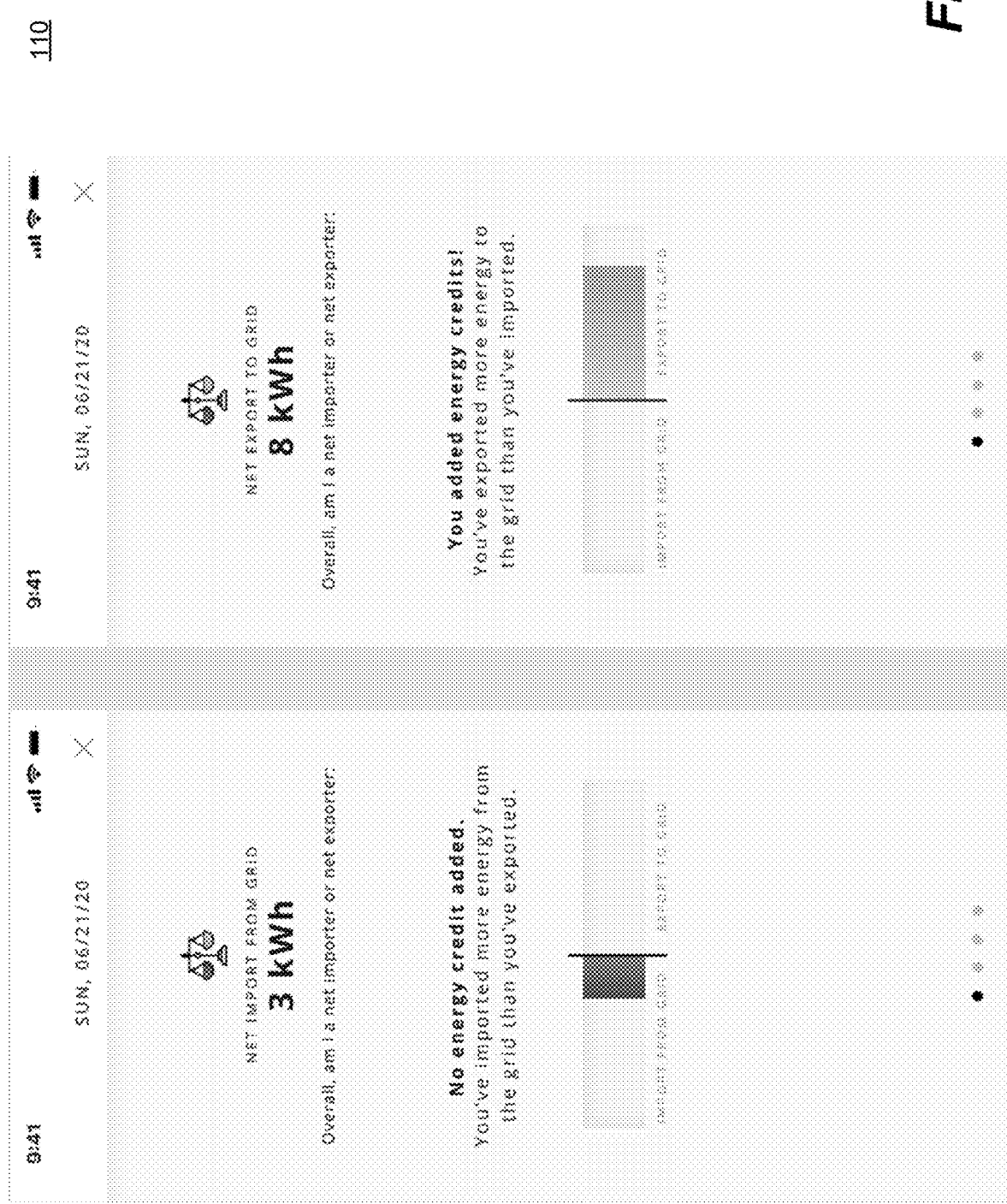

FIGS. 61A-61B illustrate a series of exemplary totals pages implemented in the software application displayed on the remote device 110 according to one or more aspects of the disclosed subject matter. For example, the totals pages can answer specific user questions including: "Overall, am I a net importer or a net exporter", "Where did the energy I used come from:", "Where did the energy I produced go:", "Where did my battery charge come from:", and the like. It should be appreciated that the specific language of the questions are exemplary and simply intended to illustrate the information displayed via the totals pages.

Figure 62A:
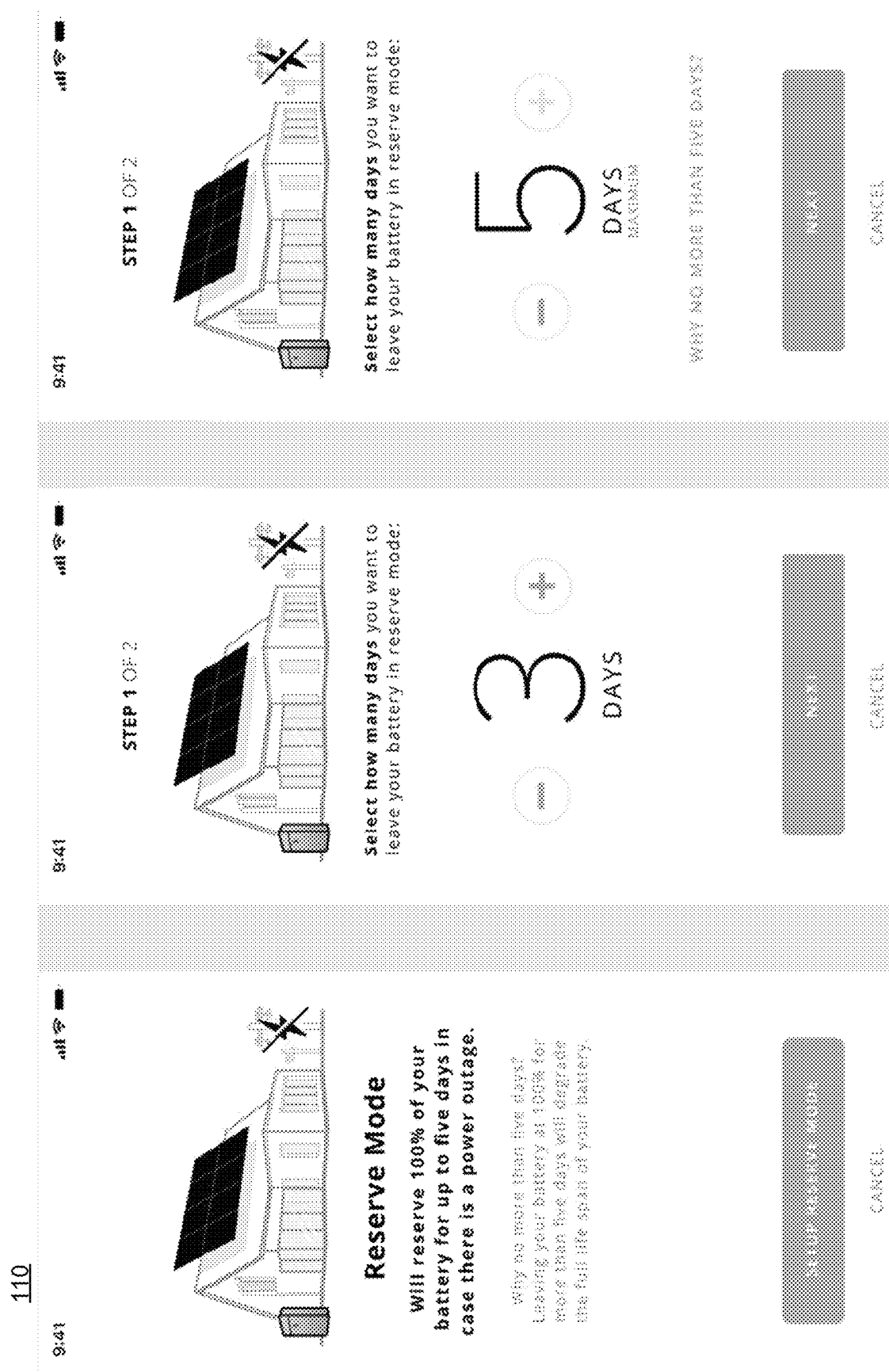
FIGS. 62A-62B illustrates a series of exemplary outage mode pages for the battery implemented in the software application displayed on the remote device according to one or more aspects of the disclosed subject matter.
Figure 62B:
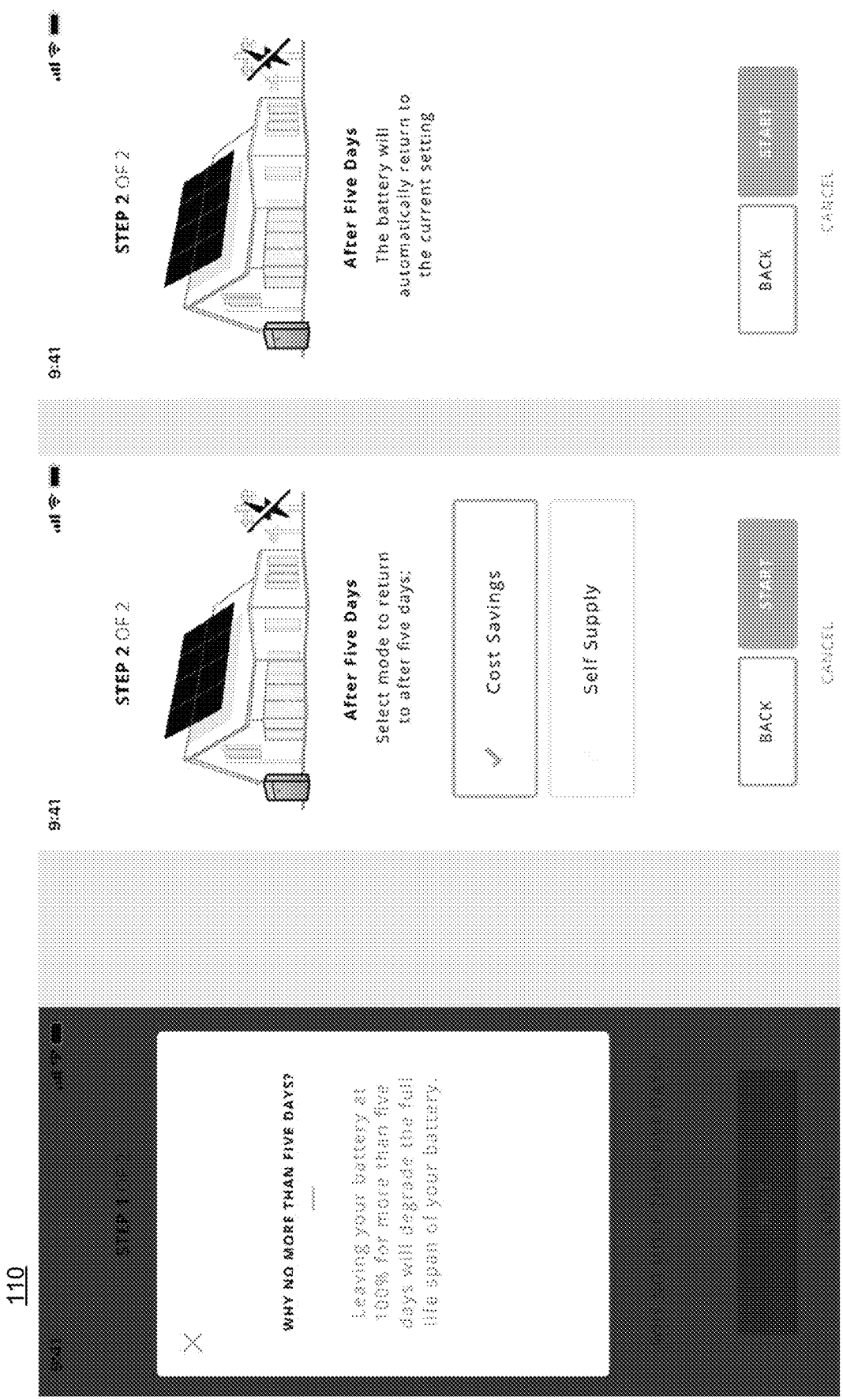

FIGS. 62A-62B illustrates a series of exemplary outage mode pages for the battery implemented in the software application displayed on the remote device 110 according to one or more aspects of the disclosed subject matter. The outage mode can correspond to a reserve mode that will reserve 100% of the battery for up to five days in case there is a power outage. In a first step, the user can select how many days to leave their battery in backup mode. In a second step, the user can select which mode battery mode (e.g., cost savings (e.g., FIGS. 63A-63B) or self-supply (e.g., FIGS. 64A-64B) to transition to after the number of days selected in the first step ends.

Figure 63A:
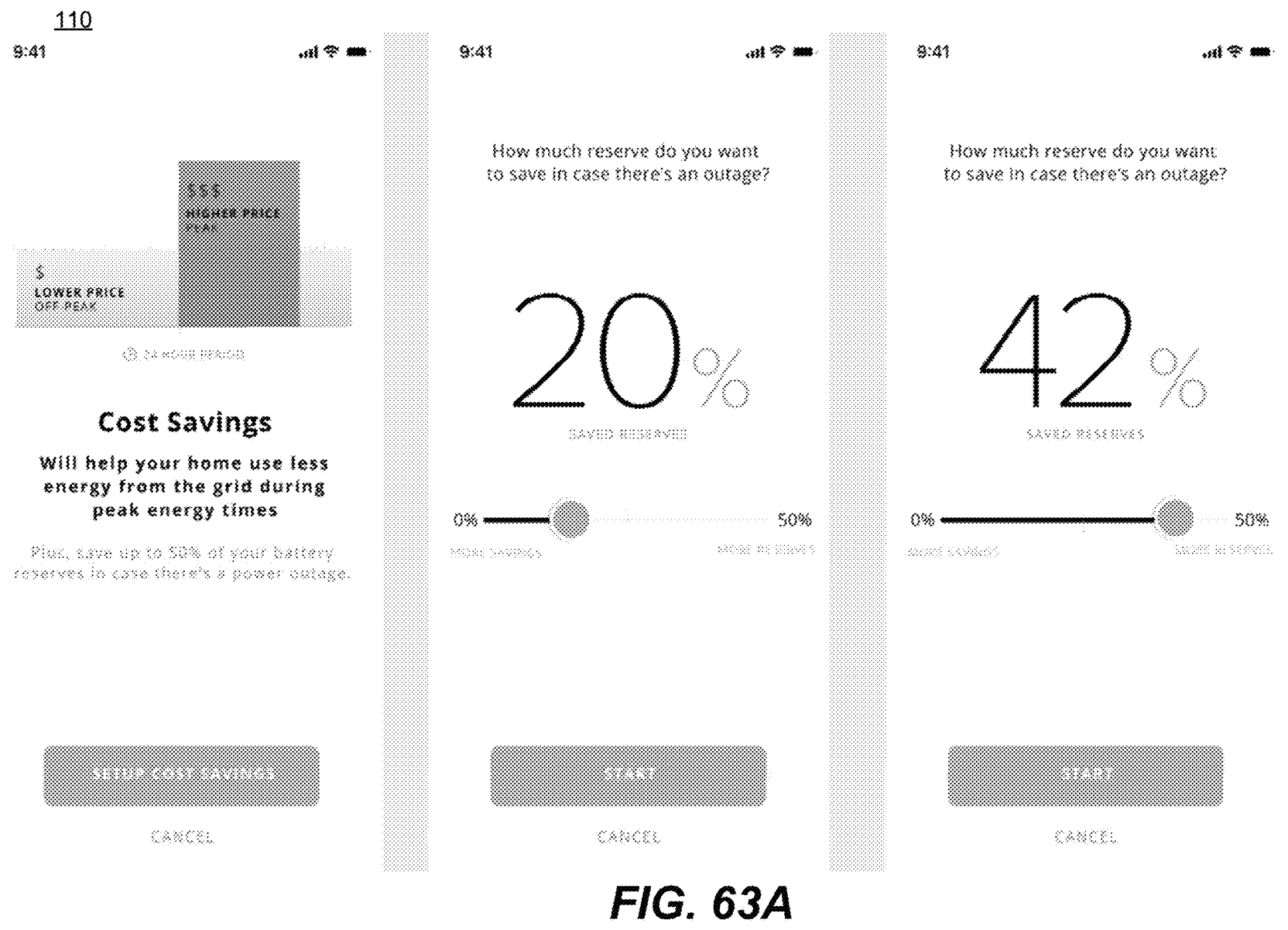
Figure 63B:
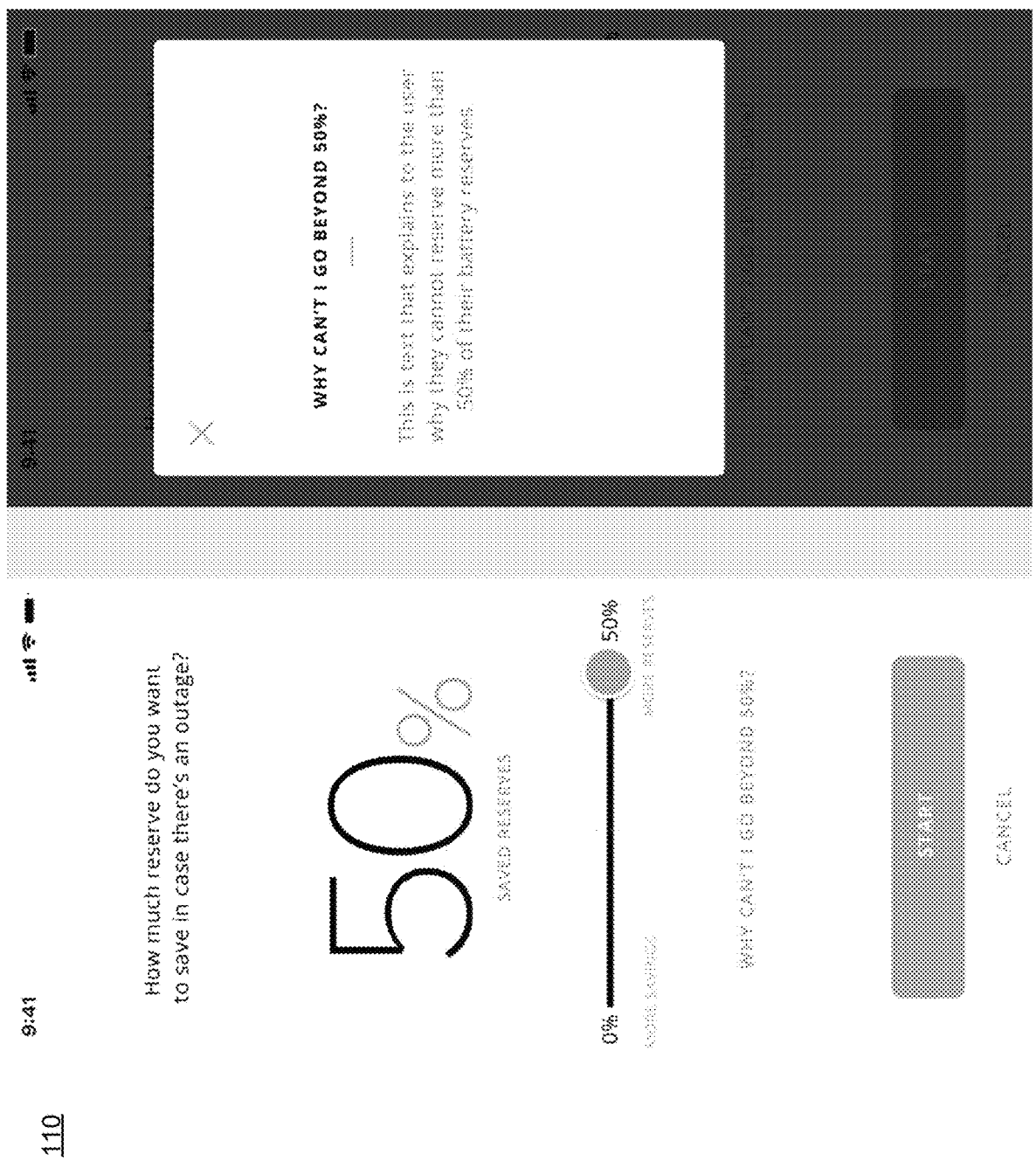

FIGS. 63A-63B illustrates a series of exemplary cost savings mode pages for the battery implemented in the software application displayed on the remote device 110 according to one or more aspects of the disclosed subject matter. For example, the cost savings mode helps a user use less energy from the grid during peak energy times. Additionally, the user can select how much reserve to save in case there is an outage.

Figure 64A:
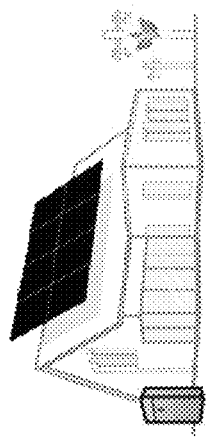
FIGS. 64A-64B illustrate a series of exemplary self-supply mode pages for the battery implemented in the software application displayed on the remote device according to one or more aspects of the disclosed subject matter.
Figure 64B:
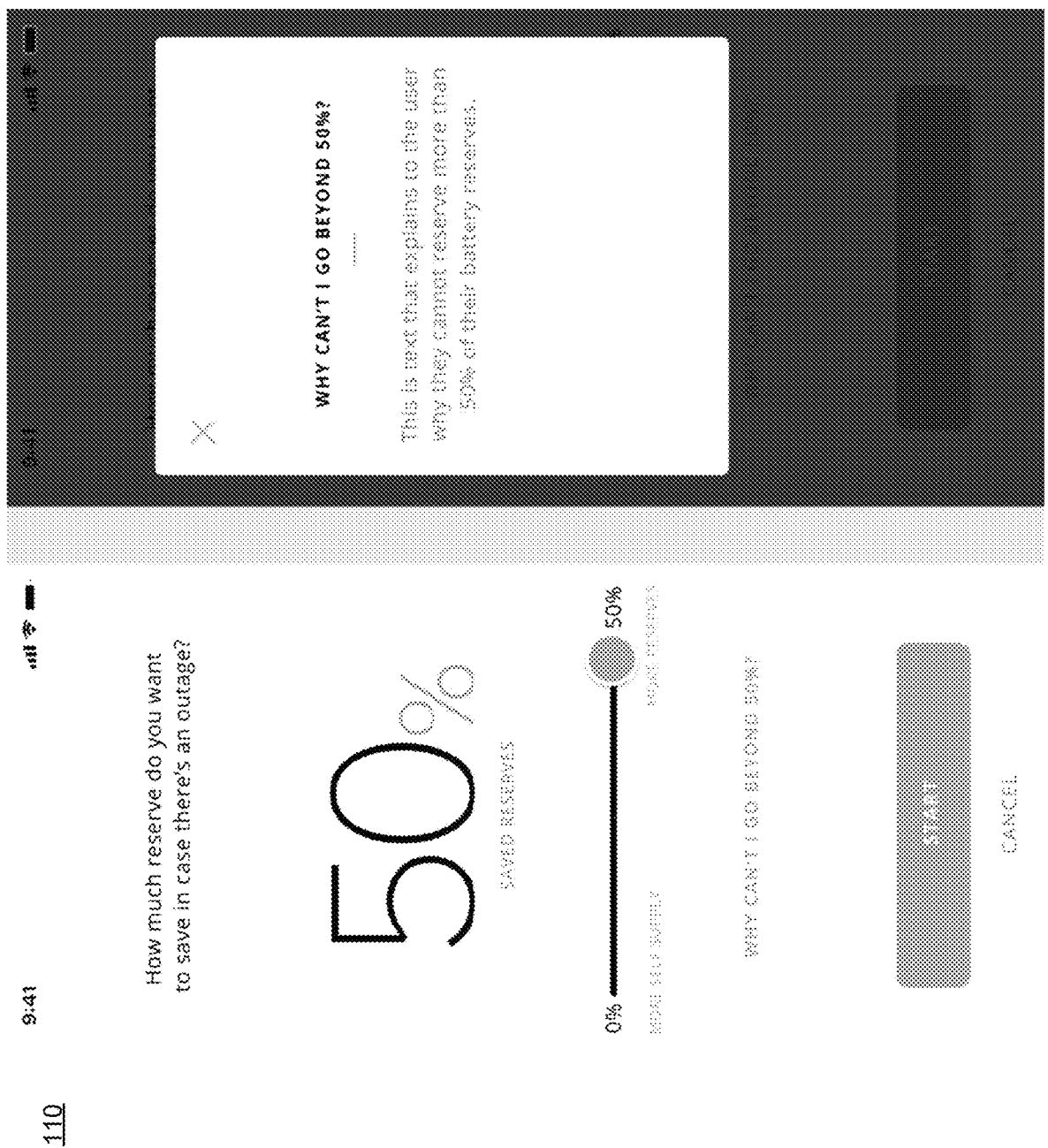
Figure 65A:
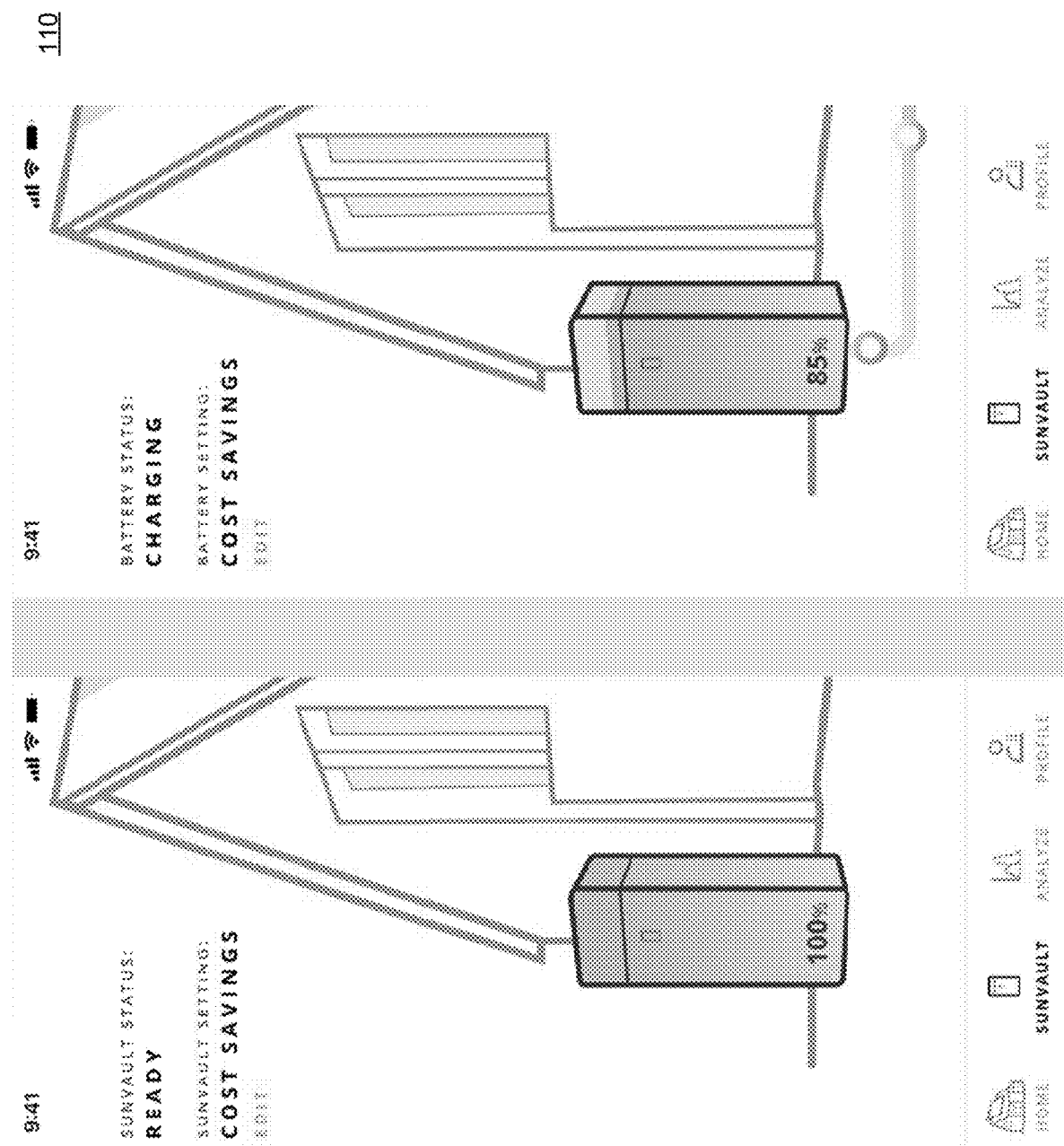
FIGS. 65A-65D illustrate a plurality of exemplary battery settings and charge levels implemented in the software application displayed on the remote device according to one or more aspects of the disclosed subject matter.
Figure 65B:
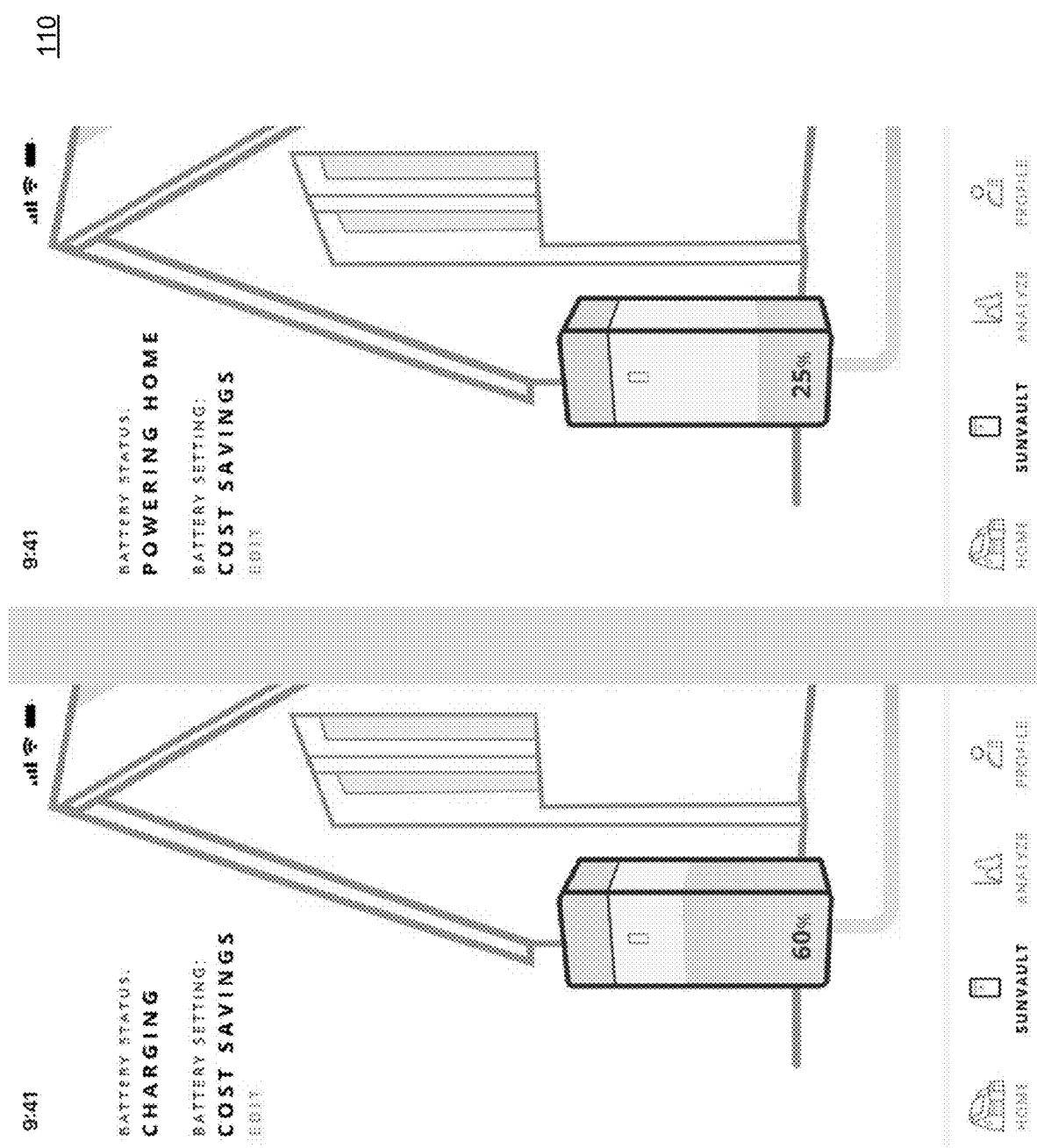
Figure 65C:
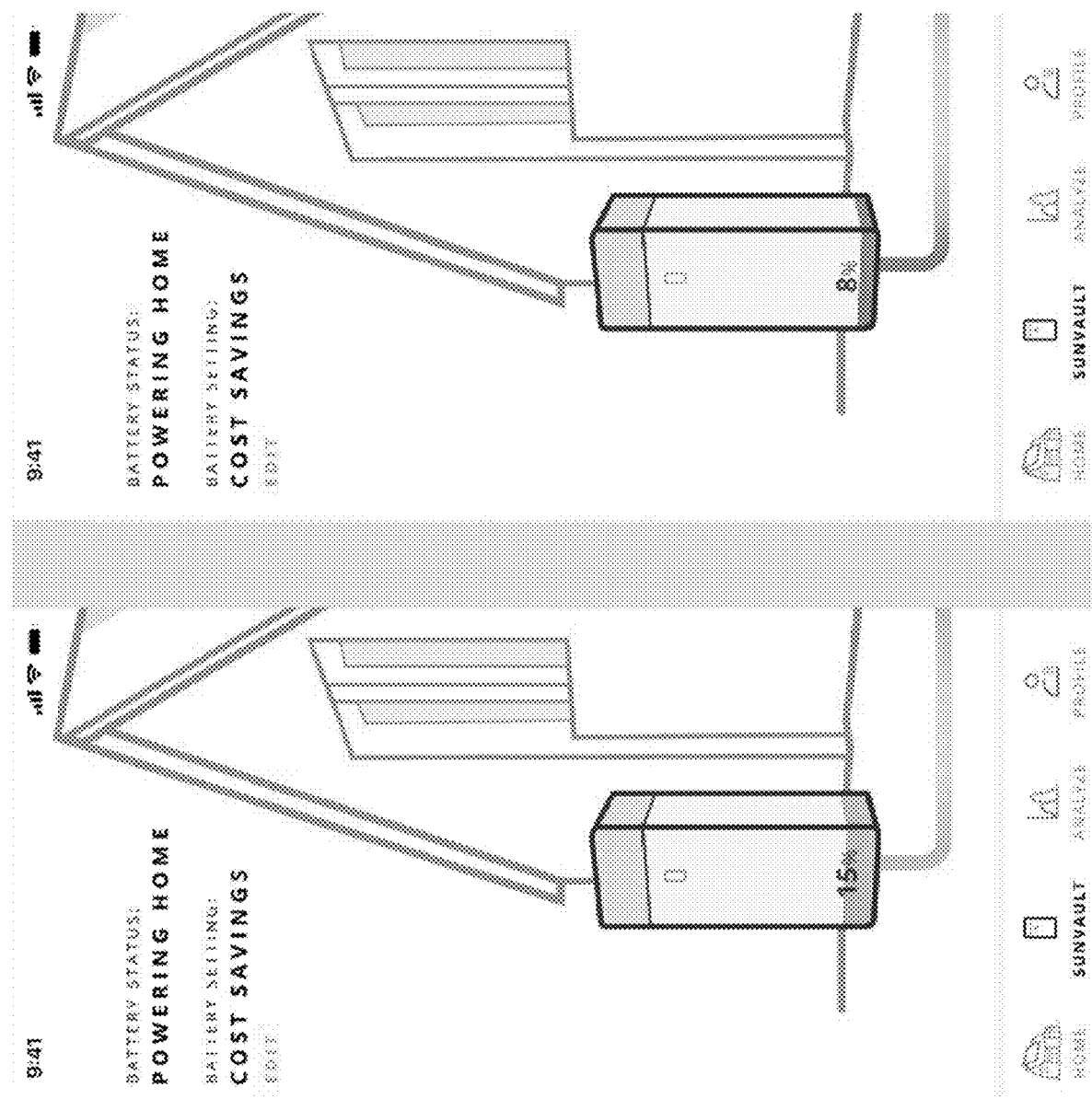
Figure 65D:
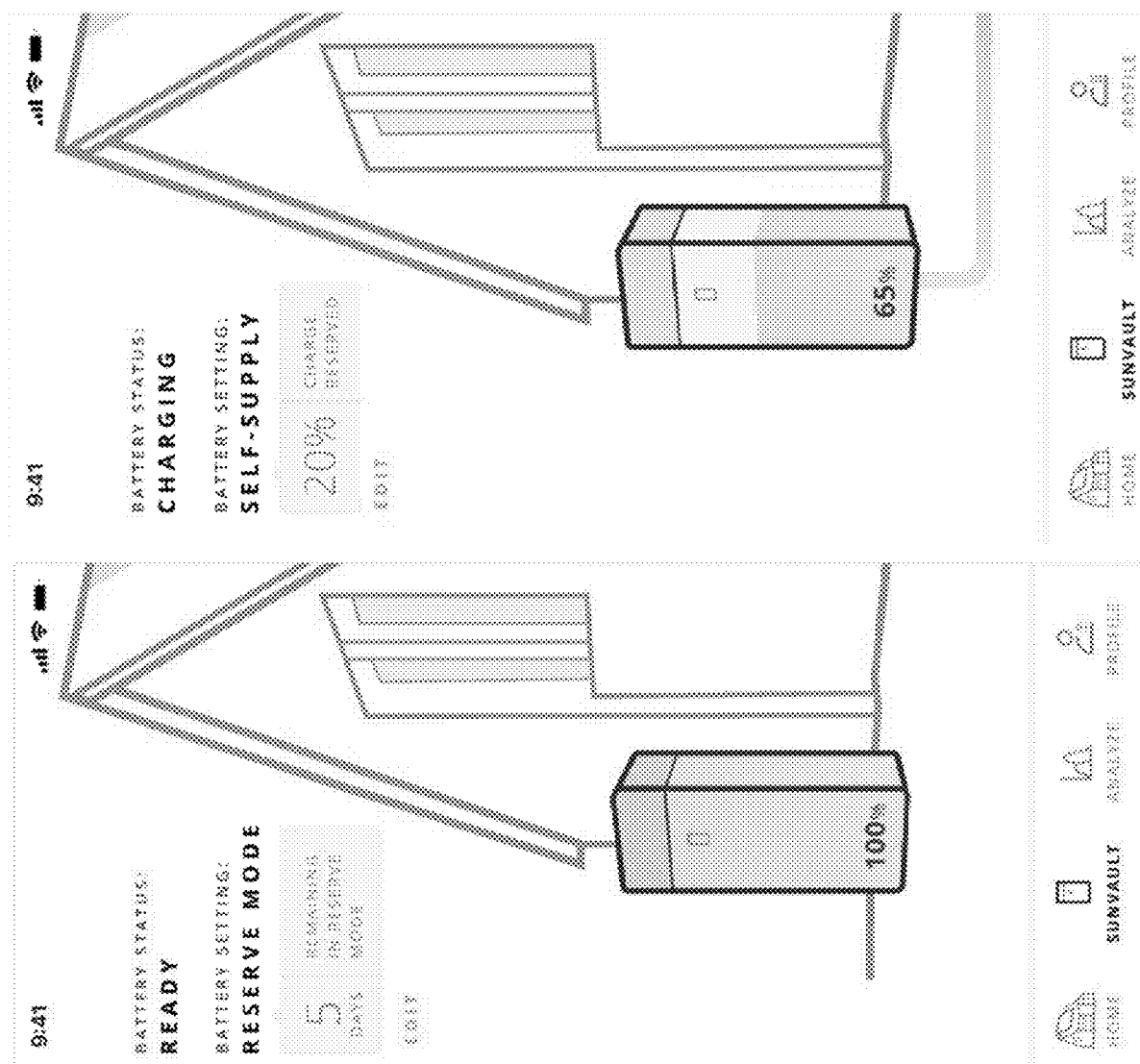

FIGS. 64A-64B illustrates a series of exemplary self-supply mode pages for the battery implemented in the software application displayed on the remote device 110 according to one or more aspects of the disclosed subject matter. For example, the self-supply mode can maximize the use of the solar system energy during the day, which can correspond to being the most environmentally friendly. Additionally, like the cost savings mode, the user can select how much reserve to save in case there is an outage.

FIGS. 65A-65D illustrate a plurality of exemplary battery settings and charge levels implemented in the software application displayed on the remote device 110 according to one or more aspects of the disclosed subject matter. For example, the battery can be in a cost savings mode, a self-supply mode, or an outage mode. Additionally, a percentage of charge can be illustrated. In one aspect, different ranges of percent of charge can correspond to different colors.

In one aspect, a user can navigate through and interact with the software application using voice commands through the remote device 110 itself and/or through a third-party smart assistant enabled devices, smart home devices, and the like.

Figure 66:
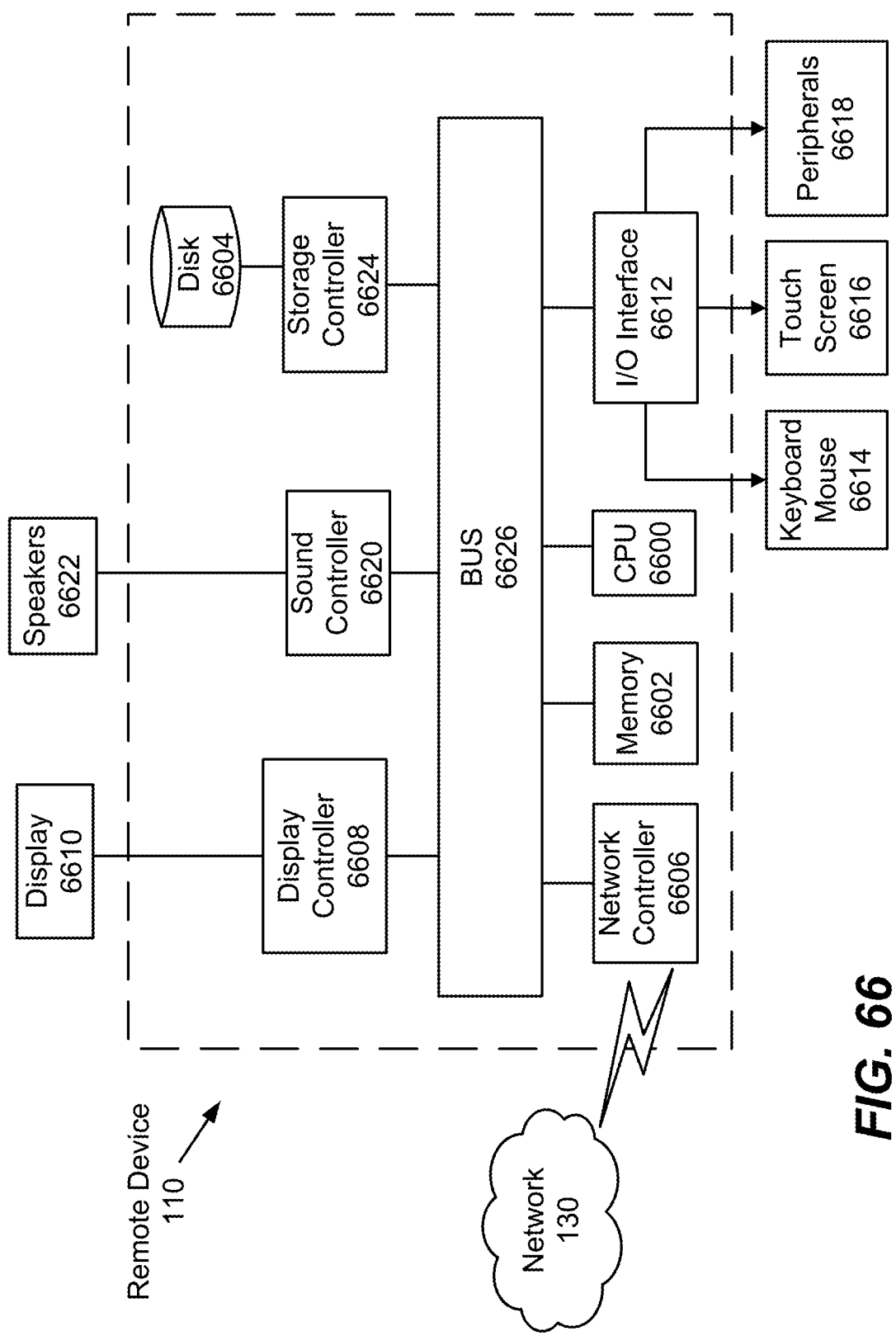
FIG. 66 is an exemplary hardware block diagram of a remote device according to one or more exemplary aspects of the disclosed subject matter.

Next, a hardware description of a computer/device (such as the remote device 110 and/or the server 115) according to exemplary embodiments is described with reference to FIG. 66. The hardware description described herein can also be a hardware description of the processing circuitry and/or the server 115. In FIG. 66, the remote device 110 includes a CPU 6600 which performs one or more of the processes described above/below. The process data and instructions may be stored in memory 6602. These processes and instructions may also be stored on a storage medium disk 6604 such as a hard drive (HDD) or portable storage medium or may be stored remotely. Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the remote device 110 communicates, such as a server or computer.

Further, the claimed advancements may be provided as a utility application, background daemon, or component of an operating system, or combination thereof, executing in conjunction with CPU 6600 and an operating system such as Microsoft Windows, UNIX, Solaris, LINUX, Apple MAC-OS and other systems known to those skilled in the art.

The hardware elements in order to achieve the remote device 110 may be realized by various circuitry elements. Further, each of the functions of the above described embodiments may be implemented by circuitry, which includes one or more processing circuits. A processing circuit includes a particularly programmed processor, for example, processor (CPU) 6600, as shown in FIG. 66. A processing circuit also includes devices such as an application specific integrated circuit (ASIC) and conventional circuit components arranged to perform the recited functions.

In FIG. 66, the remote device 110 includes a CPU 6600 which performs the processes described above. The remote device 110 may be a general-purpose computer or a particular, special-purpose machine. In one embodiment, the remote device 110 becomes a particular, special-purpose machine when the processor 6600 is programmed to implement PV system monitoring and interaction via a software application displayed on the remote device 110 (and in particular, any of the processes discussed with reference to FIGS. 31-34).

Alternatively, or additionally, the CPU 6600 may be implemented on an FPGA, ASIC, PLD or using discrete logic circuits, as one of ordinary skill in the art would recognize. Further, CPU 6600 may be implemented as multiple processors cooperatively working in parallel to perform the instructions of the inventive processes described above.

The remote device 110 in FIG. 66 also includes a network controller 6606, such as an Intel Ethernet PRO network interface card from Intel Corporation of America, for interfacing with network 120. As can be appreciated, the network 120 can be a public network, such as the Internet, or a private network such as an LAN or WAN network, or any combination thereof and can also include PSTN or ISDN subnetworks. The network 120 can also be wired, such as an Ethernet network, or can be wireless such as a cellular network including EDGE, 3G and 4G wireless cellular systems. The wireless network can also be Wi-Fi, Bluetooth, or any other wireless form of communication that is known.

The remote device 110 further includes a display controller 6608, such as a graphics card or graphics adaptor for interfacing with display 6610, such as a monitor. A general purpose I/O interface 6612 interfaces with a keyboard and/or mouse 6614 as well as a touch screen panel 6616 on or separate from display 6610. General purpose I/O interface also connects to a variety of peripherals 6618 including printers and scanners.

A sound controller 6620 is also provided in the remote device 110 to interface with speakers/microphone 6622 thereby providing sounds and/or music.

The general-purpose storage controller 6624 connects the storage medium disk 6604 with communication bus 6626, which may be an ISA, EISA, VESA, PCI, or similar, for interconnecting all of the components of the remote device 110. A description of the general features and functionality of the display 6610, keyboard and/or mouse 6614, as well as the display controller 6608, storage controller 6624, network controller 6606, sound controller 6620, and general purpose I/O interface 6612 is omitted herein for brevity as these features are known.

The exemplary circuit elements described in the context of the present disclosure may be replaced with other elements and structured differently than the examples provided herein. Moreover, circuitry configured to perform features described herein may be implemented in multiple circuit units (e.g., chips), or the features may be combined in circuitry on a single chipset.

The functions and features described herein may also be executed by various distributed components of a system. For example, one or more processors may execute these system functions, wherein the processors are distributed across multiple components communicating in a network. The distributed components may include one or more client and server machines, which may share processing, in addition to various human interface and communication devices (e.g., display monitors, smart phones, tablets, personal digital assistants (PDAs)). The network may be a private network, such as a LAN or WAN, or may be a public network, such as the Internet. Input to the system may be received via direct user input and received remotely either in real-time or as a batch process. Additionally, some implementations may be performed on modules or hardware not identical to those described. Accordingly, other implementations are within the scope that may be claimed.

Having now described embodiments of the disclosed subject matter, it should be apparent to those skilled in the art that the foregoing is merely illustrative and not limiting, having been presented by way of example only. Thus, although particular configurations have been discussed herein, other configurations can also be employed. Numerous modifications and other embodiments (e.g., combinations, rearrangements, etc.) are enabled by the present disclosure and are within the scope of one of ordinary skill in the art and are contemplated as falling within the scope of the disclosed subject matter and any equivalents thereto. Features of the disclosed embodiments can be combined, rearranged, omitted, etc., within the scope of the invention to produce additional embodiments. Furthermore, certain features may sometimes be used to advantage without a corresponding use of other features. Accordingly, Applicant(s) intend(s) to embrace all such alternatives, modifications, equivalents, and variations that are within the spirit and scope of the disclosed subject matter.

The invention claimed is:

1. A method for monitoring a photovoltaic (PV) system, comprising:
   receiving PV system information for a predetermined timeframe, wherein the PV system includes one or more of an energy storage system and PV panels;
   displaying a power flow based on the received PV system information corresponding to the predetermined timeframe, wherein displaying the power flow includes
      acquiring a site type, wherein the site type corresponds to a site having one or more of production, consumption, and storage capability;
      selecting a power metric based on the site type;
      acquiring the selected power metric for a specific time frame;
      iterating through data points corresponding to the selected power metric for the specific time frame and determining whether a valid data point is found;
      in response to a determination that the valid data point is found, selecting a first valid data point;
      truncating a value of the selected data point to one decimal place;
      converting a consumption value to an absolute value; and
   calculating a grid value; and
   displaying an energy mix analysis based on the received PV system information corresponding to the predetermined timeframe.

2. The method of claim 1, further comprising:
   displaying energy storage system information based on the received PV system information corresponding to the predetermined timeframe.

3. The method of claim 2, wherein the energy storage system is a battery and displaying the energy storage system information includes
   acquiring a battery state of charge and a battery mode;
   rendering a storage page including the acquired battery state of charge and the battery mode;
   determining if the battery mode is changed; and
   in response to a determination that the battery mode is changed, setting the battery mode to the changed battery mode.

4. The method of claim 3, wherein the battery mode corresponds to an outage mode, a self-supply mode, and a cost-savings mode, wherein the outage mode corresponds to reserving 100% of the battery for up to five days in anticipation of a power outage, wherein the self-supply mode corresponds to maximizing energy use from the PV panels during a daytime, wherein the cost-savings mode corresponds to reducing energy usage from a power grid during peak energy times.

5. The method of claim 3, wherein displaying the energy storage system information further includes
   acquiring a charge percentage of the battery;
   acquiring a battery status based on a current power flow and converting the battery status to one of charging, discharging, or idle based on the battery status;
   selecting a battery animation color based on the battery status and the charge percentage; and
   select a pipe animation color based on the battery status and the charge percentage.

6. The method of claim 1, wherein the power flow includes one or more of the PV panels, the energy storage system, and a power grid powering a structure that the PV system is connected to.

7. The method of claim 1, wherein the power flow includes one or more of the PV panels and the energy storage system exporting energy to a power grid.

8. The method of claim 1, wherein the power flow includes one or more of the PV panels and a power grid charging the energy storage system.

9. The method of claim 1, wherein in response to a determination that a valid data point is not found,
   acquiring the selected power metric for the previous twenty-four hours;
   iterating through data points corresponding to the selected power metric for the previous twenty-four hours and determining whether a valid data point is found; and
   in response to a determination that no valid data point is found, selecting a default power flow state.

10. The method of claim 9, wherein selecting the default power flow state includes
    selecting a most recent invalid data point;
    default any missing values from the most recent invalid data point to zero; and
    render the power flow based on the most recent invalid data point.

11. The method of claim 1, further comprising:
    displaying aggregated energy consumption for a selected aggregation period.

12. The method of claim 11, wherein displaying aggregated energy consumption includes
    acquiring the site type, wherein the site type corresponds to the site having one or more of production, consumption, and storage capability;
    selecting one or more energy metrics based on the site type;
    selecting an aggregation period;
    acquiring, for the selected aggregation period, one or more of the selected one or more energy metrics;
    truncating power values to one decimal place;
    converting a consumption value to an absolute value; and
    calculating a grid value.

13. The method of claim 1, wherein displaying the energy mix analysis includes plotting a graph including home usage, solar energy usage, power grid usage, and battery storage over a predetermined amount of time.

14. The method of claim 13, wherein the predetermined amount of time includes a day time interval, a week time interval, a month time interval, and a year time interval.

15. The method of claim 14, wherein the day time interval corresponds to displaying 1-hour intervals since a start of a day, the week time interval can correspond to displaying 1-day intervals in a start of a week, the month time interval can correspond to displaying 1-week intervals since a start of a month, and the year interval can correspond to displaying 1-month intervals since a start of a year.

16. One or more non-transitory computer readable medium including computer program instructions, which when executed by an information processing system, cause the system to:
    receive PV system information for a predetermined timeframe, wherein a PV system includes one or more of an energy storage system and PV panels;

display a power flow based on the received PV system information corresponding to the predetermined timeframe, wherein the computer program instructions for displaying the power flow further cause the system to
acquire a site type, wherein the site type corresponds to a site having one or more of production, consumption, and storage capability;
select a power metric based on the site type;
acquire the selected power metric for a specific time frame;
iterate through data points corresponding to the selected power metric for the specific time frame and determining whether a valid data point is found;
in response to a determination that the valid data point is found, select a first valid data point;
truncate a value of the selected data point to one decimal place;
convert a consumption value to an absolute value; and
calculate a grid value; and
display an energy mix analysis based on the received PV system information corresponding to the predetermined timeframe.

17. The one or more non-transitory computer readable medium of claim 16, wherein the information processing system is a server.

18. The one or more non-transitory computer readable medium of claim 16, wherein the information processing system is a cloud-based architecture.

19. A server, comprising:
processing circuitry configured to
receive PV system information for a predetermined timeframe, wherein a PV system includes one or more of an energy storage system and PV panels,
display a power flow based on the received PV system information corresponding to the predetermined timeframe, wherein the processing circuitry for displaying the power flow is further configured to
acquire a site type, wherein the site type corresponds to a site having one or more of production, consumption, and storage capability,
select a power metric based on the site type,
acquire the selected power metric for a specific time frame,
iterate through data points corresponding to the selected power metric for the specific time frame and determining whether a valid data point is found,
in response to a determination that the valid data point is found, select a first valid data point,
truncate a value of the selected data point to one decimal place,
convert a consumption value to an absolute value, and
calculate a grid value, and
display an energy mix analysis based on the received PV system information corresponding to the predetermined timeframe.

* * * * *